United States Patent
Ohmori et al.

(10) Patent No.: US 11,189,470 B2
(45) Date of Patent: Nov. 30, 2021

(54) SEARCH DEVICE, SEARCH METHOD AND PLASMA PROCESSING APPARATUS

(71) Applicant: HITACHI HIGH-TECH CORPORATION, Tokyo (JP)

(72) Inventors: Takeshi Ohmori, Tokyo (JP); Hyakka Nakada, Tokyo (JP); Naoyuki Kofuji, Tokyo (JP); Masayoshi Ishikawa, Tokyo (JP); Masaru Kurihara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/287,679

(22) Filed: Feb. 27, 2019

(65) Prior Publication Data
US 2019/0295827 A1    Sep. 26, 2019

(30) Foreign Application Priority Data

Mar. 20, 2018 (JP) .............................. JP2018-052162

(51) Int. Cl.
G05B 19/4155 (2006.01)
H01J 37/32 (2006.01)
(Continued)

(52) U.S. Cl.
CPC .... *H01J 37/32926* (2013.01); *G05B 19/4155* (2013.01); *G06N 5/02* (2013.01);
(Continued)

(58) Field of Classification Search
CPC ...... G05B 19/4155; G05B 2219/45031; G06N 20/10; G06N 3/08; G06N 5/02;
(Continued)

(56) References Cited

U.S. PATENT DOCUMENTS 5,473,532 A   12/1995  Unno et al.
5,993,050 A   11/1999  Miura
(Continued)

FOREIGN PATENT DOCUMENTS

CN    1098502 C    1/2003
CN    1720490 A    1/2006
(Continued)

OTHER PUBLICATIONS

Numata et al. "Experiments of a New Meta-Heuristics to Reduce the Search Space by Partially Fixing of the Solution Values—Application to Traveling Salesman Problem" Transactions of the Institute of Systems, Control and Information Engineers, vol. 17, No. 3, Mar. 2004, pp. 103-112.
(Continued)

*Primary Examiner* — Yuhui R Pan
(74) *Attorney, Agent, or Firm* — Miles & Stockbridge, P.C.

(57) ABSTRACT

The efficiency of operation in a semiconductor processing apparatus is improved. In order to search an input parameter value to be set in a semiconductor processing apparatus for processing into a target processed shape, a predictive model indicating a relationship between an input parameter value and an output parameter value is generated based on the input parameter value and the output parameter value which is a measured value of a processing result processed by setting the input parameter value in the semiconductor processing apparatus. In this case, when the measured value of the processing result processed by the semiconductor processing apparatus is the defective data, the predictive model is generated based on the input parameter value causing defective data and defective substitute data obtained by substituting the measured value which is the defective data.

14 Claims, 32 Drawing Sheets

(51) Int. Cl.
*G06N 5/02* (2006.01)
*H01L 21/67* (2006.01)

(52) U.S. Cl.
CPC . *G05B 2219/45031* (2013.01); *H01J 37/3211* (2013.01); *H01J 37/32449* (2013.01); *H01J 37/32963* (2013.01); *H01J 2237/24578* (2013.01); *H01J 2237/334* (2013.01); *H01L 21/67069* (2013.01)

(58) Field of Classification Search
CPC ....... H01J 2237/24578; H01J 2237/334; H01J 37/3211; H01J 37/32449; H01J 37/32926; H01J 37/32963; H01L 21/67069
See application file for complete search history.

(56) References Cited

U.S. PATENT DOCUMENTS

| | | | |
|---|---|---|---|
| 2003/0010914 A1* | 1/2003 | Takane | H01J 37/28 250/310 |
| 2003/0140039 A1* | 7/2003 | Ferguson | G06K 9/00503 |
| 2008/0021571 A1 | 1/2008 | Kokotov et al. | |
| 2008/0279434 A1* | 11/2008 | Cassill | G06Q 10/06 382/131 |
| 2009/0120580 A1 | 5/2009 | Kagoshima et al. | |
| 2009/0240336 A1 | 9/2009 | Meulen et al. | |
| 2011/0131162 A1 | 6/2011 | Kaushal et al. | |
| 2014/0222376 A1 | 8/2014 | Kao et al. | |
| 2015/0161520 A1* | 6/2015 | Kaushal | G05B 19/41885 700/121 |
| 2017/0018403 A1 | 1/2017 | Koronel | |
| 2017/0055177 A1 | 2/2017 | Son et al. | |
| 2017/0153611 A1 | 6/2017 | Fujii et al. | |
| 2018/0052907 A1 | 2/2018 | Greifeneder et al. | |
| 2019/0028663 A1 | 1/2019 | Itano et al. | |
| 2019/0064751 A1 | 2/2019 | Ohmori et al. | |
| 2019/0073588 A1 | 3/2019 | Kawaguchi | |
| 2019/0122078 A1 | 4/2019 | Ura et al. | |

FOREIGN PATENT DOCUMENTS

| | | |
|---|---|---|
| JP | H1086039 A | 4/1998 |
| JP | 2012074007 A | 4/2012 |
| JP | 2013518449 A | 5/2013 |
| JP | 2015162113 A | 9/2015 |
| JP | 2017102619 A | 6/2017 |
| JP | 2017157112 A | 9/2017 |
| JP | 2019040984 A | 3/2019 |
| JP | 2019046380 A | 3/2019 |
| JP | 2019079214 A | 5/2019 |
| JP | 2019159864 A | 9/2019 |
| KR | 100463256 | 1/2005 |
| TW | 201104452 A | 2/2011 |
| TW | 201202876 A | 1/2012 |
| TW | 201432479 A | 8/2014 |
| WO | 2017149267 A1 | 9/2017 |

OTHER PUBLICATIONS

Office Action dated Apr. 6, 2020 in Taiwanese Application No. 108103411.

Office Action dated Jun. 26, 2020 in Korean Application No. 10-2019-0005491.

Office Action dated Jul. 28, 2020 in Taiwanese Application No. 108103034.

* cited by examiner

FIG. 28

MEASUREMENT 1

| LER11 | CDtv11 | LER12 | CDtv12 | ... |
|---|---|---|---|---|
| 1.0 | 0.5 | N/A | N/A | ... |

MEASUREMENT 2

| CD21 | Depth21 | CD22 | Depth21 | ... |
|---|---|---|---|---|
| N/A | N/A | N/A | N/A | ... |

FIG. 33
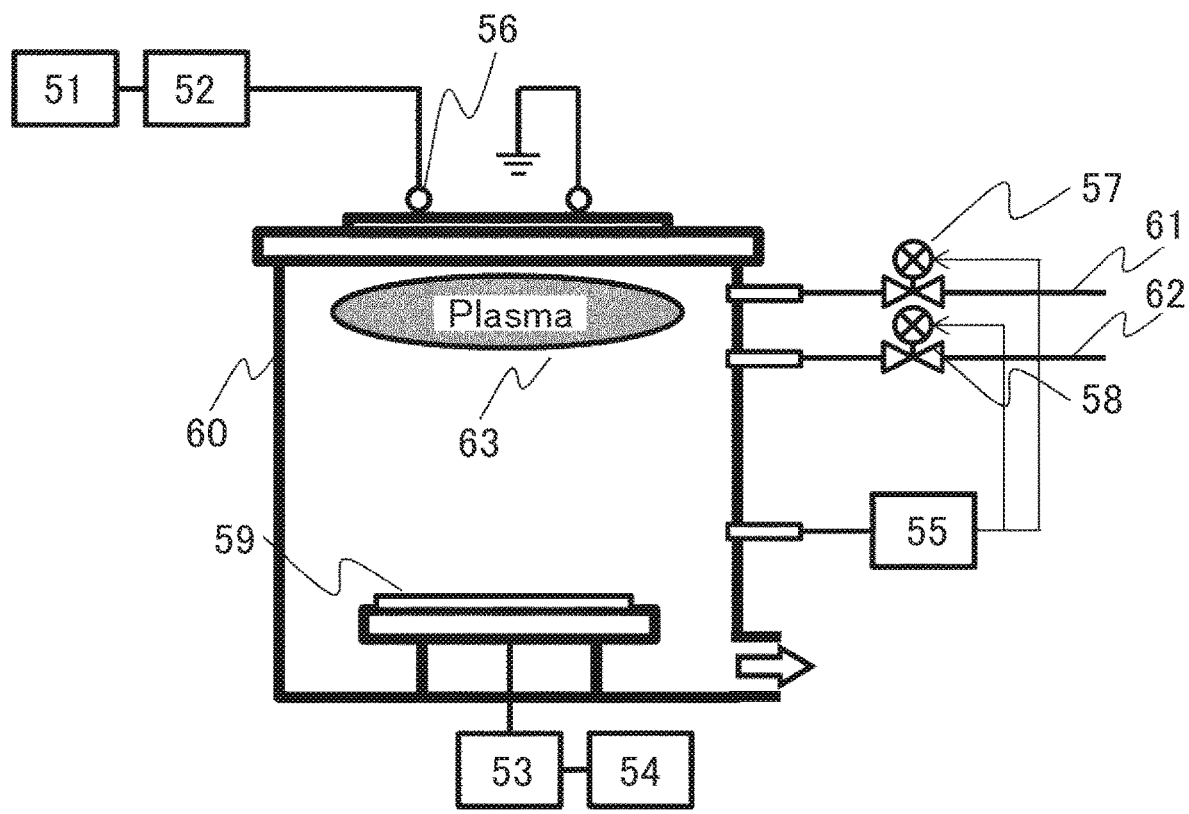
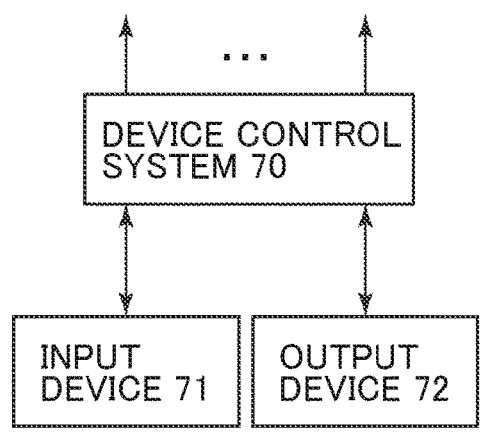

SEARCH DEVICE, SEARCH METHOD AND PLASMA PROCESSING APPARATUS

CROSS-REFERENCE TO RELATED APPLICATION

This application claims priority to Japanese Patent Application No. 2018-052162 filed on Mar. 20, 2018, the entire contents of which are incorporated by reference herein.

BACKGROUND

The present invention relates to a search device, a search method, and a plasma processing apparatus for searching for a solution.

In order to improve the performance of a semiconductor device, a new material configuring the semiconductor device is introduced, and at the same time, a structure of the semiconductor device becomes complicated. Also, in the processing of the semiconductor device, a nanometer level accuracy has been required. Further, in order to improve the productivity of the semiconductor device, there has been required to continue a mass production processing while maintaining the accuracy as much as possible. In order to satisfy those requirements, there is a need to be able to process the semiconductor devices made of various materials and having various structures with an extremely high precision. Therefore, a control range of the semiconductor processing apparatus for processing the semiconductor device is expanded, and a large number of control parameters are added. With the use of the semiconductor processing apparatus, a high-performance semiconductor device is produced while maintaining high productivity.

On the other hand, in order to sufficiently derive the performance of the semiconductor processing apparatus, there is a need to determine several to tens of input parameters for each semiconductor processing apparatus. Furthermore, there are many Steps in one process, and there is a need to change input parameters for each Step. This makes it extremely difficult to ascertain the combination of the input parameters from which a target machining result can be obtained. For that reason, the prolonged processing condition development increases the development cost. In addition, the number of processes with a high degree of difficulty is increasing, and top engineers with advanced knowledge and skills that can deal with this situation are lacking.

In order to maintain and improve the productivity, there is a need to acquire data on a state of the semiconductor processing apparatus during mass-production of the semiconductor devices and processing result data. Multiple sensors and multiple monitors intended for acquiring those pieces of data are mounted on the semiconductor processing apparatus. In order to execute a control for correcting the data fluctuation of the state of the semiconductor processing apparatus under mass production of the semiconductor device and the processing result, there is a need to analyze a relationship between the sensor data, the monitor data, and the processing result, and find out the control parameter. Since the processing control at a nanometer level is performed, the number of sensors mounted on the semiconductor processing apparatus and the number of monitoring a manufacturing situation are increased, and a frequency of data acquisition is also increased. This increases the amount of data acquired. This makes it extremely difficult to develop the control method of the semiconductor processing apparatus which is required with high precision because analysis of enormous data and verification of control performance are necessary.

Manufacture of advanced devices such as semiconductor devices requires development of method for aging semiconductor processing apparatus in order to ensure productivity. The method for aging the semiconductor processing apparatus is directed to a method for reducing a difference in performance between the semiconductor processing apparatuses, correcting a change over time in processing characteristics during mass production, and reducing a difference in performance between the semiconductor processing apparatuses which cannot be corrected by maintenance of the semiconductor processing apparatus. The development of the method for aging the semiconductor processing apparatus is carried out by a top engineer with advanced knowledge and skill. However, the number of wafers to be processed and the number of processes with high difficulty in the manufacture of the semiconductor devices continue to increase, and the insufficient number of top engineers has become serious. For that reason, only the data is obtained, and the number of processes whose analysis is not handled increases.

In view of the above, the semiconductor processing apparatus is required to have a function of automatically drawing out the performance of the semiconductor processing apparatus itself and a function of supporting an engineer that derives the performance of the semiconductor processing apparatus.

Japanese Unexamined Patent Application Publication (Translation of PCT Application) No. 2013-518449 discloses a technique of using an autonomous learning system based on biology to learn data when a recipe of a manufacturing tool is incrementally or randomly changed and to generate an adjusted recipe by using the learned result.

SUMMARY

For example, the input parameter of the semiconductor processing apparatus is directed to a parameter that determines the operation of the semiconductor processing apparatus, and includes input parameters such as a gas type, a gas flow rate, a pressure, an input power, a voltage, a current, a processing time, a heating temperature, a cooling temperature, a dose amount, and a light quantity. Output parameters of the semiconductor processing apparatus are parameters obtained by monitoring or measuring an object to be processed (processing result) that is being processed or has been processed in the semiconductor processing apparatus, and include a CD (Critical Dimension), a deposited film thickness, an ER (Etch Rate), a processed shape, a mask selectivity, and processing results such as a wafer plane distribution and uniformity of those parameters. Also, as sensor data and monitor data involved in those processing results, there are a light reflection spectrum, a plasma light spectrum, a wafer incident current, a wafer voltage, a wafer temperature, a device part temperature, and spatial distribution and uniformity of those pieces of data. The sensor data and the monitor data are also output parameters.

In order to analyze an input and output relationship of the semiconductor processing apparatus, there is a need to be able to analyze input/output data from 1 input to 1 output to multiple inputs and multiple outputs. Then, in order to obtain a combination of input parameters satisfying an intended output result, there is a need to search a large device parameter space including the input parameters and the output parameters.

For example, let us consider a case of selecting five basic input parameters such as flow rates of two used gas, a gas pressure, a discharge power, a wafer applied bias power as input parameters to be searched. A control range of each input parameter will be described below. As typical ranges, a control range of both the gas flow rates is 100 to 200 [sccm], a control range of the gas pressure is 1 to 10 [Pa], a control range of the discharge power is 500 to 1500 [W], a control range of the bias power is 0 to 100 [W]. Typical values of the minimum ranges when changing those parameters will be described below. A typical value of both the gas flow rates is 1 [sccm], a typical value of the gas pressure is 0.1 [Pa], a discharge power of the discharge pressure is 1 [W], and a typical value of the bias power is 1 [W].

In that case, when all the combinations of the control ranges of the input parameters in an entire space of the device parameters, that is, the number of search conditions are roughly estimated, $100 \times 100 \times 100 \times 1000 \times 100 = 10^{11}$. In the case where a time taken for one search is about one minute, it takes over 100,000 years for the search for the total number of search conditions, and the execution of all the searches is impossible.

In addition, if the set number of values for each input parameter in one search set is set to ten, the combination of the input parameters in the search is $10^5$. If a time required for one set of searches is about one minute, it takes more than two months to one set of searches. In order to arrive at a target solution by repeating the search and the analysis of the search result, there is a need to set the time required for one set of searches to several days or less at the longest, desirably one hour or less. Therefore, in order to arrive at the target solution, setting of the input parameters in the search, that is, the determination of a search area is extremely important.

When 2000 conditions are searched per day by repeating the above search with the number of search conditions in one search set as 100 conditions and the search time as one hour, an area of 0.000002% is searched per day in the condition numbers $10^{11}$ in the device parameter space. When the above search is continued for one month, that is, when the search of 60,000 sets is executed, an area of 0.00006% is searched in the device parameter space. Therefore, in the case where the search area in the one set of searches is narrow, when the search area is randomly changed, the possibility of arriving at an optimum solution is extremely low. Also, if there are duplicated search areas, the time required to arrive at the optimum solution becomes longer.

Furthermore, the input and output relationship of the semiconductor processing apparatus is nonlinear in most cases, and there are a large number of local solutions in the device parameter space. For that reason, it is extremely rare for the values of the input parameters that satisfy the values of the output parameters to be found by one data analysis and estimation. Considering the case where there is about one local solution in 1% of the search area of the device parameter space, if the search area is set to be a narrow area and the search area is randomly selected, even if the search can arrive at the best solution within or in the vicinity of the search area, arrival at the local solution is conducted with 99% probability. Therefore, there is a need to determine the search area so as to efficiently avoid the local solution or so that the possibility of arriving at the solution after arriving at the local solution becomes high.

However, since the above-mentioned technique of Japanese Unexamined Patent Application Publication (Translation of PCT Application) No. 2013-518449 merely changes the recipe incrementally or randomly during data learning, there is a problem that the possibility of arriving at the best solution which is the input parameter to be solved is extremely low. In other words, there is a problem that the likelihood of arriving at the local solution which is inferior to the best solution becomes extremely high.

Further, as described above, the introduction of new materials into the semiconductor devices, the complicated device structure, and processing with accuracy of nanometer level are required, and there is a problem that in the development of fine pattern processing, the partial or entire deformation, collapse, and elimination of the pattern occur frequently. Furthermore, when those troubles occur, there is a problem that the measured values of the processing results cannot be acquired, and the analysis using the processing results cannot be performed.

The present invention aims at improving the efficiency of operation in a semiconductor processing apparatus.

According to an aspect of the present invention disclosed in the present application, there is provided a search device that searches an input parameter value to be set in a semiconductor processing apparatus which processes an object to be processed into a predetermined processed shape for processing the object to be processed into a target processed shape, the search device including: a processor; a storage device; and a program that is stored in the storage device and executed by the processor to search an input parameter value for processing the object to be processed into the target processed shape, wherein the program includes a generation unit, the generation unit generates a predictive model indicating a relationship between the input parameter value and an output parameter which is a measured value of a processing result processed by setting the input parameter value in the semiconductor processing apparatus based on the input parameter value and the output parameter value, and the generation unit generates the predictive model based on the input parameter value causing defective data and defective substitute data obtained by substituting the measured value which is the defective data when the measured value of the processing result processed by the semiconductor processing apparatus is the defective data.

According to a representative embodiment of the present invention, the operation efficiency can be improved and the processing can be optimized in the semiconductor processing apparatus. The problems, configurations and effects other than those mentioned above will be clarified by a description of the following embodiments.

BRIEF DESCRIPTION OF THE DRAWINGS

FIG. 28 is a diagram showing measurable data and defective specific data;

FIG. 33 is a schematic view showing a plasma processing apparatus having a function of searching an optimum processing condition according to the second embodiment.

DETAILED DESCRIPTION

Hereinafter, embodiments of the present invention will be described with reference to the accompanying drawings.

First Embodiment

<Search Example of Input Parameter>

Figure 1:
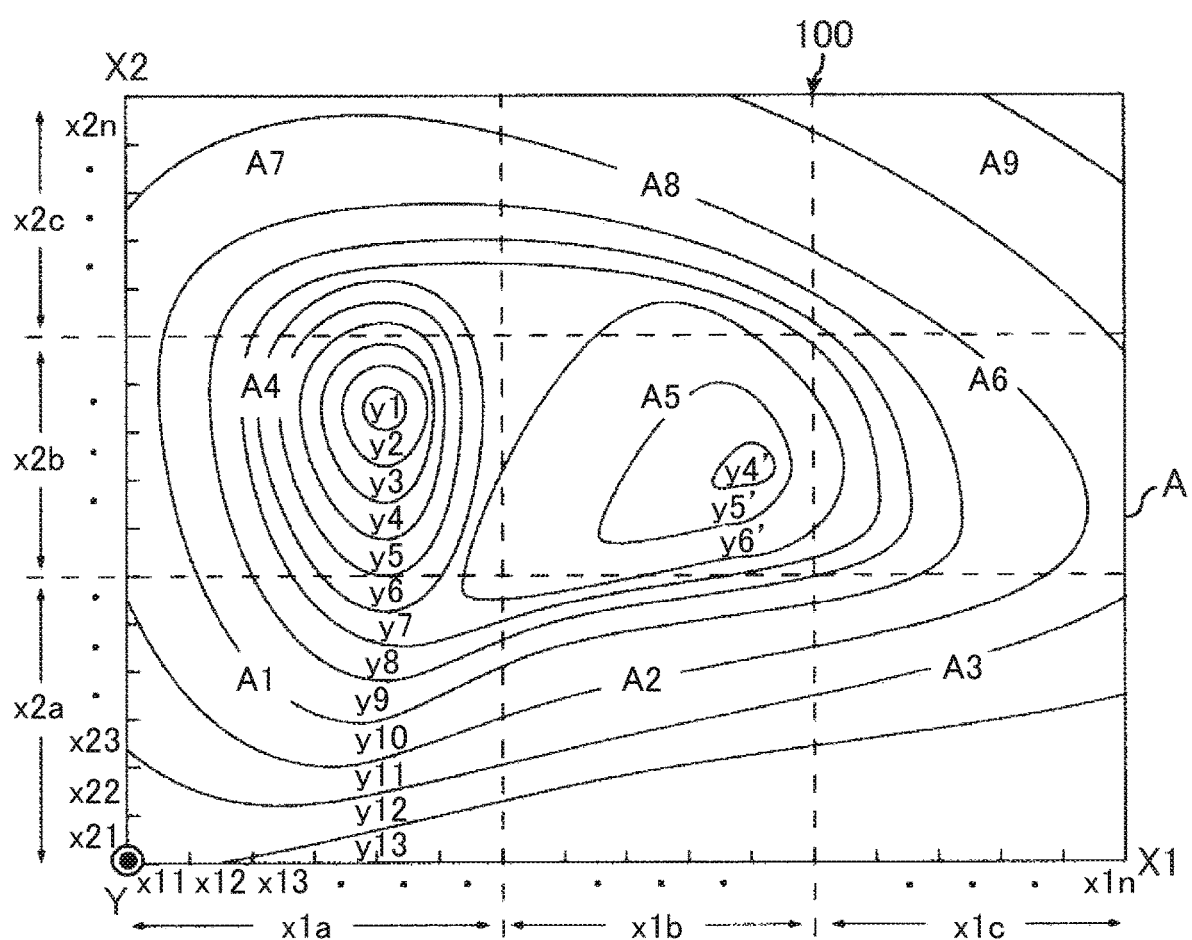
FIG. 1 is an illustrative diagram showing a search example of input parameters according to a first embodiment of the present invention.

FIG. 1 is an illustrative diagram showing a search example of input parameters. FIG. 1 shows an example of input/output data (the combination of input data and output data) to the semiconductor processing apparatus when searching for input data (values of the input parameters described above) from which output data (values of the output parameters described above) satisfying a target in the semiconductor processing apparatus.

In this example, the semiconductor processing apparatus is an apparatus that processes a semiconductor or a semiconductor device including the semiconductor. Specifically, the semiconductor processing apparatus includes, for example, a lithography apparatus, a film formation apparatus, a pattern processing apparatus, an ion injection apparatus, a heating apparatus, and a cleaning apparatus. The lithography apparatus includes an exposure apparatus, an electron beam drawing apparatus, and an X-ray drawing apparatus. The film formation apparatus includes, for example, CVD (chemical vapor deposition), PVD (physical vapor deposition), a vapor deposition apparatus, a sputtering apparatus, and a thermal oxidation apparatus. The turn processing apparatus includes, for example, a wet etching device, a dry etching device, an electron beam processing apparatus, and a laser processing apparatus. The ion implantation apparatus includes a plasma doping apparatus and an ion beam doping apparatus. The heating device includes, for example, a resistance heating device, a lamp heating device, a laser heating device. The cleaning apparatus includes a liquid cleaning apparatus and an ultrasonic cleaning apparatus.

FIG. 1 shows a graph 100 having a two-dimensional coordinate plane with two axes of an X1 axis and an X2 axis. An axis orthogonal to the coordinate plane is taken as a Y axis. The X1 axis is a coordinate axis of an input parameter X1 to be input to the semiconductor processing apparatus and the X2 axis is a coordinate axis of an input parameter X2 to be input to the semiconductor processing apparatus. Input data x1$n$ (n=1, 2, 3, . . . ), which is a value of the input parameter X1, is plotted on the X1 axis and input data x2$n$, which is a value of the input parameter X2, is plotted on the X2 axis. The graph 100 expresses the output data on the Y axis in each area determined by the input data x1$n$ and x2$n$ by contour lines. As an example, an area including output data y1 is set as a maximum value (that is, the best solution), and an area of y13 is set as the minimum value. Further, in the graph 100, the X1 axis is divided into three areas which are assumed to be areas x1$a$, x1$b$, and x1$c$. Similarly, in the graph 100, the X2 axis is divided into three areas which are assumed to be areas x2$a$, x2$b$, and x2$c$.

For example, when searching, as a target, for an area in which output data is highest, that is, a combination of input data x1$n$ and x2$n$ in which the output data y1 is obtained, an inclination of output data yn in the device parameter space is acquired as an analysis method, and the search may proceed in a direction in which the output data yn becomes larger.

However, if the output data at that time does not include the output data in an area determined according to x1$a$ and x2$b$, the search is directed to an output data y4' of a vertex which becomes a local solution. Also, if the input parameters to be searched are determined according to the result, the output data in the vicinity of y4' is intensively acquired, and input parameters for obtaining the output data y4' itself or very close to the output data y4' is found. In other words, even if the analysis using the value of the input parameters acquired by the above search and the acquisition of the value of the output parameters by further search are repeated, the input data of the best solution corresponding to the output data y1 cannot be found.

In the case where there are a large number of local solutions in the periphery of the output data y1 and other areas, if the value of the acquired input parameter is small relative to a size of the device parameter space, the search falls into a local solution, resulting in a high possibility that the output data y1 cannot be found. Also, it is assumed that areas of x13 and x23 are estimated as areas where the estimated solution exists. Thereafter, if the search area is limited to a minute area such as parts of x13 and x23 as in Japanese Unexamined Patent Application Publication (Translation of PCT Application) No. 2013-518449, since a slope of the output data yn is very small, the number of times of searching until arriving at the output data y1 is huge, resulting in a possibility that the search may fail. In addition, the slope of the output data yn may be buried in noise included in the output data yn, which may cause the search to fail. If the quality of the output data yn to be analyzed is low, inevitably the estimation of the solution becomes lowered. Therefore, in order to make the search successful, there is a need to designate a search space for acquiring high quality data that can approach the solution.

In FIG. 1, three parameters x1$n$, x2$n$ and yn are used. Since an actual semiconductor processing apparatus has a large number of input/output parameters, a vast device parameter space obtained by multidimensional vectorization of the index of each axis in FIG. 1 is searched. Therefore, in order to acquire quality data that can approach the solution efficiently from such a vast device parameter space, the device parameter space needs to be designated. In addition, the input/output relationship of the semiconductor processing apparatus is nonlinear in most cases, and there are a large number of local solutions in the device parameter space.

According to the present embodiment, the experimental conditions for searching the device parameter space are automatically determined in consideration of the analysis result of the input/output data of the semiconductor processing apparatus, and the verification of the experiment result (processing result) is automatically performed, and the above automatic operation is repeated. As a result, the device parameter space is searched to obtain the best solution efficiently. In other words, the value of the input parameter from which the value of the output parameter indicating the target state of the semiconductor processing apparatus and the processing result is obtained is efficiently found.

<System Configuration Example>

Figure 2:
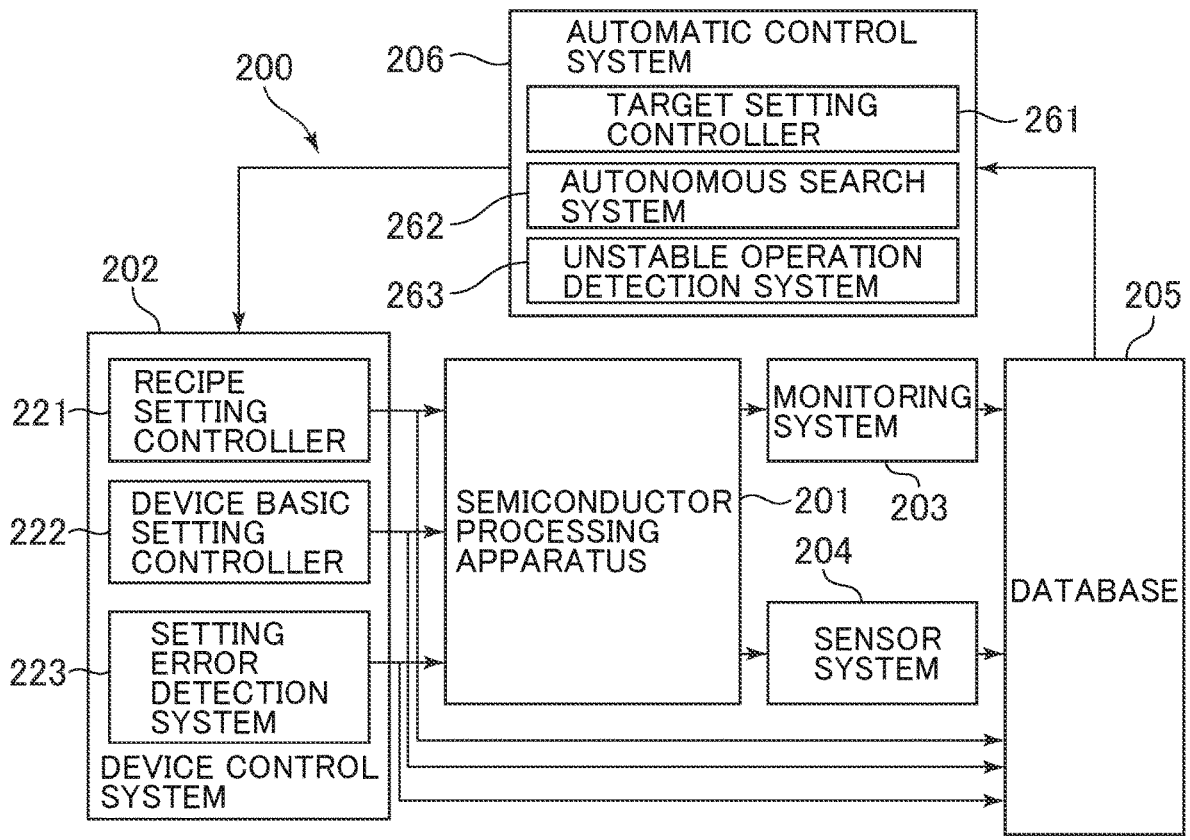
FIG. 2 is an illustrative diagram showing a system configuration example of a semiconductor manufacturing system according to the first embodiment of the present invention.

FIG. 2 is an illustrative diagram showing a system configuration example of the semiconductor manufacturing system. A semiconductor manufacturing system 200 includes a semiconductor processing apparatus 201, a device control system 202, a monitoring system 203, a sensor system 204, a database 205, and an automatic control system (search device) 206.

As described above, the semiconductor processing apparatus 201 is a device for processing a substrate such as a wafer or a semiconductor device. The semiconductor processing apparatus 201 is connected to the device control system 202, the monitoring system 203, and the sensor system 204.

The device control system 202 is a system that controls the semiconductor processing apparatus 201 when operating and processing the semiconductor processing apparatus 201. The device control system 202 has an input interface such as a GUI, and controls the execution of the semiconductor processing apparatus 201 with the values of input parameters input through the input interface. Further, the device control system 202 has a network interface, and acquires values of input parameters from an external computer and the database 205 through the network interface.

The device control system 202 includes a recipe setting controller 221, a device basic setting controller 222, and a setting error detection system 223. The recipe setting controller 221 sets the input parameter for determining the operation of the semiconductor processing apparatus 201 during processing and a value of the input parameter, in the semiconductor processing apparatus 201. The device basic setting controller 222 sets the input parameter for operating the semiconductor processing apparatus 201 and a value of the input parameter in the semiconductor processing apparatus 201.

The setting error detection system 223 determines whether the input parameters can be actually set in the semiconductor processing apparatus 201 at the time of setting the input parameters in the device basic setting controller 222. Specifically, for example, the setting error detection system 223 determines whether the entered input parameter is within a range that can be input and whether the input parameter is the combination of the values of the input parameters that enable operation of the semiconductor processing apparatus 201. When a value of the unsettable input parameter or the combination of the input parameters is detected, the setting error detection system 223 reports a setting error to an engineer or a host system which is connected with the semiconductor processing apparatus 201. When the setting error occurs, the setting error detection system 223 records as log data that a change in the entered input parameter is canceled or a process using the value of the entered input parameter is canceled.

The monitoring system 203 is a system that monitors or measures an object to be processed (processing result) that is being processed or has been processed in the semiconductor processing apparatus 201 and acquires monitor data. The monitoring system 203 includes a processing dimension measurement device using an optical monitor and an electron microscope, a temperature measurement device using an infrared light, a defect detection device using a Kelvin probe force microscope, and a prober device for evaluating electric characteristics of the object to be processed. The monitoring system 203 measures reflection, transmission, absorption, and polarization spectrum generated, for example, when a light, a laser light, and X-rays are made incident on the object to be processed, to thereby acquire the processed shape of the object to be processed, the thickness of a film to be processed and a processing defect as monitoring data. The monitoring system 203 does not have to be directly connected to the semiconductor processing apparatus 201 but may acquire the measurement result by transporting the object to be processed to the monitoring system 203 and store the result in the database 205. Further, the monitoring system 203 may take out a part of the object to be processed as a fragment, transport the fragment to the monitoring system to acquire the measurement result, and store the measurement result in the database 205.

The monitoring system 203 monitors a medium used for processing plasma, gas, liquid, and the like acting on an object to be processed during processing, and a product generated by processing. Those media and products are substances which directly act on the object to be treated or occur as a result of the action. The monitoring system 203 includes a plasma emission monitor using optical spectrum measurement, a sediment monitor in a processing chamber using infrared spectroscopy, an atom and molecular monitor released from the object to be processed using a mass spectrometer, and an electrical property monitor using a probe inside the processing chamber. Monitoring with those monitors can measure motoring data that can indirectly evaluate the processing result in real time and during processing on side.

The sensor system 204 is a system that acquires the sensor data indicating a device state of the semiconductor processing apparatus 201. The sensor system 204 is a collection of sensors. The sensor data includes power supply output values such as voltage, current and power, values of variable electrical elements such as capacitors and coils in a matching unit, flow rates of various used gases, temperature of a device frame and device components, a pressure in the processing chamber, an opening of a pressure control valve, a valve opening and closing state, a gas exhaust speed, operation timing and operation time of the processing and the device.

The database 205 stores values of various input parameters set by the device control system 202, values of output parameters which are processing results from the semiconductor processing apparatus 201, and monitor data and sensor data acquired by the monitoring system 203 and the sensor system 204. In addition, the database 205 stores the learning data. The learning data is input/output data which is a set of input parameter values (input data) given to the semiconductor processing apparatus 201 in the past and output parameter values (output data) output from the semiconductor processing apparatus 201. The database 205 may be a distributed database 205 that stores various types of data to be stored in different storage devices 302. A distributed database in which information handled by each system is stored in each system may be configured.

The automatic control system 206 searches a solution that satisfies the target with the use of the data stored in the database 205. The solution that satisfies the target is a value of at least one parameter of the values of the input parameters used for the operation of the semiconductor processing apparatus 201 and the values of the input parameters used for the operation of the semiconductor processing apparatus 201 under processing. The automatic control system 206 includes a target setting controller 261, an autonomous search system 262, and an unstable operation detection system 263.

The target setting controller 261 accepts the input of a value of a target input parameter, a value of an output parameter, and an allowable value of a difference or divergence between the search result and the target, as an initial value before a search is started. Further, the target setting controller 261 can accept the input of an upper limit of a time for executing one condition in the search, an upper limit of a total time of the number of times of searching, and the one set of searches, an upper limit of the total time of the entire search, an upper limit of an analysis time of the search result, and an upper limit of the number of analysis data. In addition, the target setting controller 261 can set the search availability for each input parameter, an upper limit value and a lower limit value of a control range of the input parameter to be searched, and a value for limiting a control range of the input parameter to be searched. Furthermore, the target setting controller 261 can accept the input of the best solution before starting the search including the past result, the analysis target data used for obtaining the solution, and a model function describing a relationship between the target and the input parameter obtained from the analysis. Furthermore, the target setting controller 261 can accept the input of position information data and image information data for use in measuring the processing target by the monitor system, for determining the measurement position or for guiding the measurement position to a desired measurement position.

The autonomous search system 262 acquires the contents input to the target setting controller 261 and sets a divided area obtained by dividing the control range of searchable input parameters into two or more regions for one or more parameters. As described above, in order to reach the target solution by repeating the search and the analysis of the search results, there is a need to set a time required for one set of searches to several days or less, desirably one hour or less, even at the maximum. In other words, when the number of search conditions for one set of searches is Ns, a search time for one set of searches is Ts [min], and a time required for one condition of searches is t1 [min], then the number of searches becomes Expression (1.1).

$$Ts = t1 \cdot Ns \tag{1.1}$$

The number of search conditions Ns may be determined so that Ts≤440 is satisfied when one set of searches requires one day or less, and Ts≤60 is satisfied when one set of searches requires one hour or less.

In order to increase the number of search conditions Ns, it is effective to shorten a measurement time of the sensor and the monitor that evaluate the search result. In particular, it is effective to use sensors and monitors that enable the measurement in real time during a search experiment.

Further, as described above, the characteristics of the medium acting on the object to be processed and the product generated by the processing, which are the data which can indirectly evaluate the processing result are measured by the sensor and the monitor, thereby being capable of performing the measurement in real time and during processing on site.

As the number of types of input parameters to be changed in the search increases, the search time Ts sharply increases. For example, when the number Da of types of input parameters is set to Da=10 and the number of region divisions A of each parameter is set to A=3, the search condition number Ns when searching all combinations of parameters is expressed by Expression (1.2).

$$Ns = A^{Da} \quad (1.2)$$

The search condition number Ns increases to 59049. In such a case, it is preferable to predict the value of each input parameter predicted to have a solution, and limit the number of input parameters that can be changed at the same time at the time of search with the use of the predicted value as the central condition. As a result, the search condition number Ns and the search time Ts are executable values. In predicting the center condition, past search results or engineer's knowledge can be used. Alternatively, an appropriate center condition may be given as an initial value of the search, and the search may be started.

Furthermore, the condition that a difference between the target and any data included in the acquired learning data is the minimum (closest to the target) can be set as the central condition. As the value indicating the difference between the learning data and the target, a total of the errors of the respective parameters can be used. The error can be calculated with the use of a difference, an absolute value, a square error, or the like of the respective parameters.

For example, when a divided area presumed to have a solution is designated for five out of ten types of input parameters, the other five types are changed, as a result of which the next search condition number Ns can be reduced to Ns=3⁵=243. Also, the number of types of input parameters that can be changed at once among the ten types of input parameters can be defined as Dc. The search condition number Ns is obtained from Expression (1.3) using a symbol C of the combination theory.

$$Ns = 1 + \sum_{i=1}^{Dc} (A-1)^i {}_{Da}C_i \quad (1.3)$$

The input parameters that can be changed at one time can be limited, thereby being capable of reducing the number of search conditions Ns. For example, if the number Dc of types of input parameters that can be changed is set to Dc=1, the number of search conditions Ns can be reduced to Ns=21, and likewise if Dc set to Dc=2, Ns can be reduced to Ns=201. Furthermore, a method of designating a divided area presumed to have a solution can be combined with a method of designating the type of a parameter that can be changed at once, in some input parameters among the types of input parameters.

The unstable operation detection system 263 detects a case where the semiconductor processing apparatus 201 can continue the processing operation but the processing becomes unstable at the time of the search execution. In a prestage of inputting the input parameters, the setting error detection system 223 confirms whether the input parameters can be input. However, the medium and parts to be controlled by the device in the semiconductor processing apparatus 201 have nonlinearity, and further processing is executed by combining those elements. Therefore, the setting error detection system 223 cannot detect a setting error (input parameter can be input), resulting in a possibility of discovering the input parameter that becomes unstable for the first time when actually executing the process.

Also, as the number of input parameters increases, the device parameter space expands. Therefore, when there is a locally unstable operation area in the device parameter space, there is a high possibility that the input parameter cannot be detected in advance.

Therefore, when the unstable operation detection system 263 detects the unstable operation of the semiconductor processing apparatus 201 during the processing of the semiconductor processing apparatus 201, the semiconductor processing apparatus 201 stores the input parameter and a value of the input parameter in the unstable operation. Further, the semiconductor processing apparatus 201 reports the input parameter and the value to an engineer or a host system to which the semiconductor processing apparatus 201 is connected. This makes it possible to determine or predict operation failure in the process and search due to the unstable operation of the semiconductor processing apparatus 201.

When the unstable operation is detected, a sequence for restoring the semiconductor processing apparatus 201 to the steady operation state is executed after completion of the processing, or the processing is immediately stopped, and a sequence for restoring the semiconductor processing apparatus 201 to the steady operation state is implemented to continue the search.

Examples of the unstable operation described above include local abnormal discharge during processing, vibration of the discharge intensity, an abrupt film forming speed variation and an abrupt film quality variation, gas pressure vibrations, instantaneous fluctuations in input power, vibration, and so on. A monitor capable of performing the measurement on site in real time and during processing, such as the emission spectrum monitor, the sediment monitor, the mass spectrometry monitor, the electric property monitor, and the pressure monitor, detects unstable operation.

<Example of Hardware Configuration of Search Device>

Figure 3:
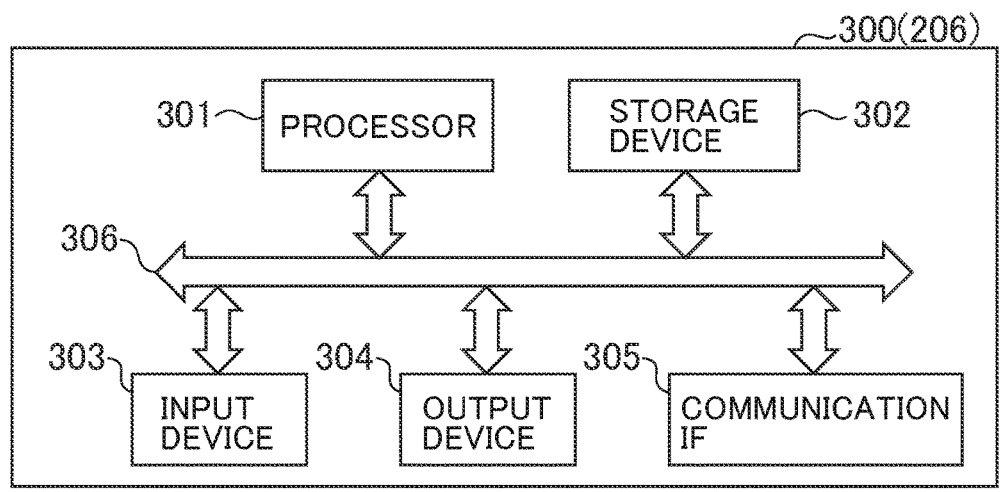
FIG. 3 is a block diagram showing a hardware configuration example of the search device according to the first embodiment of the present invention.

FIG. 3 is a block diagram showing a hardware configuration example of the search device 300. The search 300 searches for values of the input parameters to be solutions from the search area. The automatic control system 206 is an example of the search device 300. The search device 300 includes a processor 301, a storage device 302, an input device 303, an output device 304, and a communication interface (communication IF 305). The processor 301, the storage device 302, the input device 303, the output device 304, and the communication IF 305 are connected to each other by a bus. The processor 301 controls the search device 300. The storage device 302 is a work area of the processor 301. The storage device 302 is a non-transitory or transitory recording medium for storing various programs and data. Examples of the storage device 302 include a ROM (Read Only Memory), a RAM (Random Access Memory), an HDD (Hard Disk Drive), and a flash memory. The input device 303 inputs data. Examples of the input device 303 include a keyboard, a mouse, a touch panel, a ten key, and a scanner. The output device 304 outputs data. Examples of the output device 304 include a display and a printer. The communication IF 305 is connected to the network and transmits and receives data.

<Mechanical Configuration Example of Search Device 300>

Figure 4:
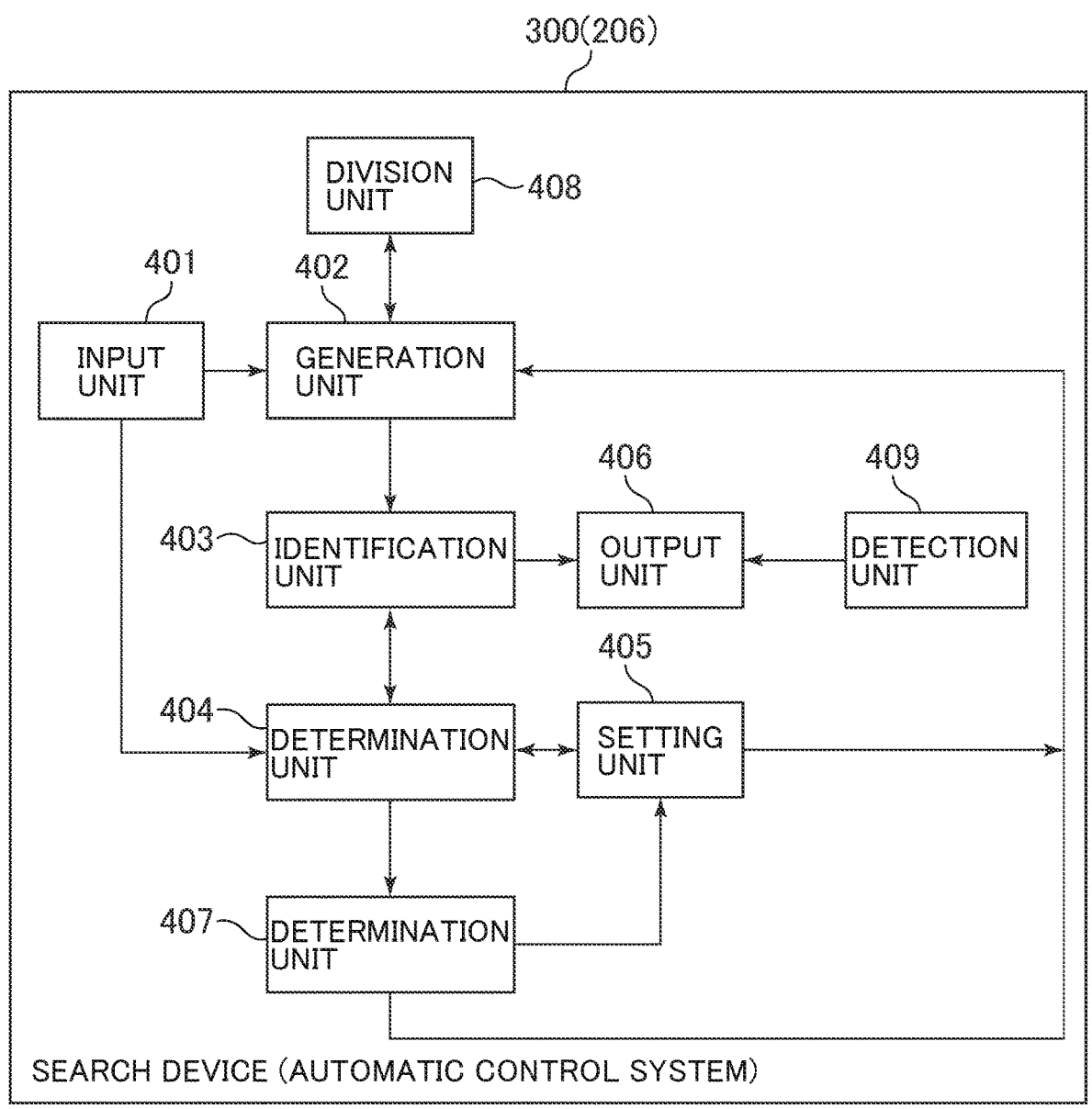
FIG. 4 is a block diagram showing a functional configuration example of the search device according to the first embodiment of the present invention.

FIG. 4 is a block diagram showing a functional configuration example of the search device 300. The search device 300 includes an input unit 401, a generation unit 402, an identification unit 403, a determination unit 404, a setting unit 405, an output unit 406, a determination unit 407, a division unit 408, and a detection unit 409. Specifically, each of the components 401 to 409 is realized by, for example, causing the processor 301 to execute a program stored in the storage device 302 shown in FIG. 3.

The input unit 401 accepts the input of various data by user operation or reading from the database 205. Specifically, for example, the input unit 401 receives an input of a condition value set in the semiconductor processing apparatus 201 that processes a semiconductor device. The conditions set in the semiconductor processing apparatus 201 are the input parameters described above. Specifically, the input parameters include, for example, a gas type, a gas flow rate, a pressure, an input power, a voltage, a current, a processing time, a heating temperature, a cooling temperature, a dose amount, and a light amount.

Further, the input unit 401 receives an input of a target value indicating the processing result of the semiconductor processed by the semiconductor processing apparatus 201. The processing result obtained by processing the semiconductor by the semiconductor processing apparatus 201 is the output parameters described above. Specifically, the output parameters include, for example, a semiconductor processing result (processing result) by the semiconductor processing apparatus 201 and data on a device state of the semiconductor processing apparatus 201. Specifically, the processing result of the semiconductor by the semiconductor processing apparatus 201 is, for example, a CD (Critical Dimension), a deposited film thickness, an ER (Etch Rate), a processed shape, a mask selection ratio, and a wafer plane distribution and a uniformity of those elements. Specifically, the data on the processing result of the semiconductor processing apparatus 201 and the device state of the semiconductor processing apparatus 201 includes, for example, data indicating a light reflection spectrum, a plasma light spectrum, a wafer incident current, a wafer voltage, a wafer temperature, a device part temperature, and a spatial distribution and uniformity of those elements. The target value indicating the processing result of the semiconductor processed by the semiconductor processing apparatus 201 is the value of the output parameter of the semiconductor processing apparatus 201 requested by the user.

Further, the input unit 401 receives the input of the reference value of the condition within the search area defined by the area between the condition (input parameter) and the processing result (output parameter). The search area is an area which is defined by the control range of the input parameter and the control range of the output parameter of the semiconductor processing apparatus 201, for searching the value of the input parameter. Specifically, for example, the search area is the search area A shown in FIG. 1. The reference value of the condition is a reference value of the input parameters. Specifically, the reference value is, for example, a value of the input parameter obtained in the past.

Further, the input unit 401 receives the input of a reference value of the processing result in the search area. The reference value of the processing result is a value of the output parameter of the semiconductor processing apparatus 201 when the reference value of the input parameter is given to the semiconductor processing apparatus 201.

Based on the set value of the condition in the search area and the measured value of the processing result when the set value is given to the semiconductor processing apparatus 201, the generation unit 402 generates a predictive model indicating a relationship between the condition and the processing result. The set value of the condition is, for example, a value of the input parameter prepared as learning data. The measured value of the processing result is the value of the output parameter of the semiconductor processing apparatus 201 in the case where the value of the input parameter (set value of the condition) prepared as the learning data is given to the semiconductor processing apparatus 201. The predictive model is a function that represents a relationship between the input parameters and the output parameters. The generation unit 402 generates a predictive model indicating a relationship between the set value of the condition in the search area and the measured value of the output by as a regression analysis that can handle multiple inputs and multiple outputs such as neural networks and support vector devices, and a statistical analysis such as a correlation analysis, a principal component analysis, and a multiple regression analysis.

The identification unit 403 acquires a predicted value corresponding to the target value from the predictive model by giving the target value input by the input unit 401 to the predictive model generated by the generation unit 402 and identifies an existence area of the predicted value from the search area. When the output parameter of the existence area of the predicted value has not been acquired, the generation unit 402 acquires the measured value of the output when the setting value of the condition in the divided area is given to the semiconductor processing apparatus 201, for each divided area.

When the target value is the value of the output parameter of the semiconductor processing apparatus 201, the identification unit 403 gives the value of the output parameter to the predictive model, thereby acquiring the value of the input parameter from the predictive model as the predicted value corresponding to the target value. Then, the identification unit 403 identifies the existence area of the value of the input parameter which is the predicted value from the search area. Specifically, for example, in FIG. 1, when the target value is the value y12 of the output parameter, the predicted value corresponding to the target value y12 is the values of the input parameter X1 and X2 identified by a contour line of the target value y12 in FIG. 1. Therefore, the identification unit 403 specifies the existence areas A1, A2, A3, A8, and A9 of the values of the input parameters X1 and X2 identified by the contour lines of the target value y12 from the search area A.

The determination unit 404 determines whether or not the measured value of the processing result corresponding to the predicted value is closer to the target value than the reference value of the processing result input by the input unit 401. Specifically, for example, in the search area A, the determination unit 404 obtains a distance (first distance) between the measured value of the processing result corresponding to the predicted value and the target value, and a distance (second distance) between the reference value of the processing result and the target value. The distance is, for example, a Euclidean distance. When the first distance is shorter than the second distance, the determination unit 404 determines that the measured value of the processing result corresponding to the predicted value is closer to the target value than the reference value of the processing result. When the first distance is not shorter than the second distance, the determination unit 404 determines that the measured value of the processing result corresponding to the predicted value is not closer to the target value than the reference value of the processing result.

In the case where it is determined by the determination unit 404 that the measured value of the processing result corresponding to the predicted value is closer to the target value than the reference value of the processing result, the setting unit 405 sets the predicted value and the measured value of the processing result corresponding to the predicted value to the reference value of the condition and the reference value of the processing result, and sets the existence area of the predicted value identified by the identification unit 403 to the search area. As a result, the reference value approaches the target value, and the search area is also narrowed down to the existence area of the predicted value.

The output unit 406 outputs a predicted value that satisfies the achievement condition when the predicted value satisfies the achievement condition of the target value. The achievement condition is, for example, an allowable range of the target value. The output unit 406 may display the predicted value that satisfies the achievement condition on a display that is an example of the output device 304 or may transmit the predicted value to the external device through the communication IF 305 and may store the predicted value in the storage device 302 or the database 205.

When it is determined by the determination unit 404 that the measured value of the processing result corresponding to the predicted value is not closer to the target value than the reference value of the processing result, the determination unit 407 excludes the predicted value and the measured value of the processing result corresponding to the predicted value Data (to be described later in Step S601 of FIG. 6). The exclusion data is a value of an input parameter that should not be given to the predictive model.

In this case, the setting unit 405 sets data excluding the exclusion data determined by the determination unit 407 as learning data. As a result, the generation unit 402 can use the learning data without exclusion data. This makes it possible to improve the search speed of the value of the input parameter which is the solution.

In addition, when the determination unit 404 determines that the measured value of the processing result corresponding to the predicted value is not closer to the target value than the reference value of the processing result, the determination unit 407 may determine the existence area of the predicted value as an exclusion area (to be described later in Step S602 of FIG. 6). The exclusion area is an area of the value of the input parameter that the predictive model should not output.

In addition, in this case, the setting unit 405 sets a remaining area excluding the exclusion area determined by the determination unit 407 from the search area as the search area. As a result, the setting unit 405 can narrow down the search area by excluding an area of the predicted values that can obtain only the processing result not close to the target value. Therefore, the setting unit 405 can improve the search speed of the value of the input parameter which is the solution.

The division unit 408 divides the search area into multiple areas. Specifically, for example, as shown in FIG. 1, the division unit 408 divides the search area A into nine areas (divided areas) A1 to A9. In this case, the generation unit 402 acquires, for each divided area, the measured value of the output when the setting value of the condition in the divided area is given to the semiconductor processing apparatus 201. Then, the generation unit 402 generates a predictive model based on the set value of the condition in each divided area and the measured value of the output. With the use of the multiple semiconductor processing apparatuses 201, the measured values can be acquired in parallel for each divided area, and the generation speed of the predictive model can be improved.

Figure 6:
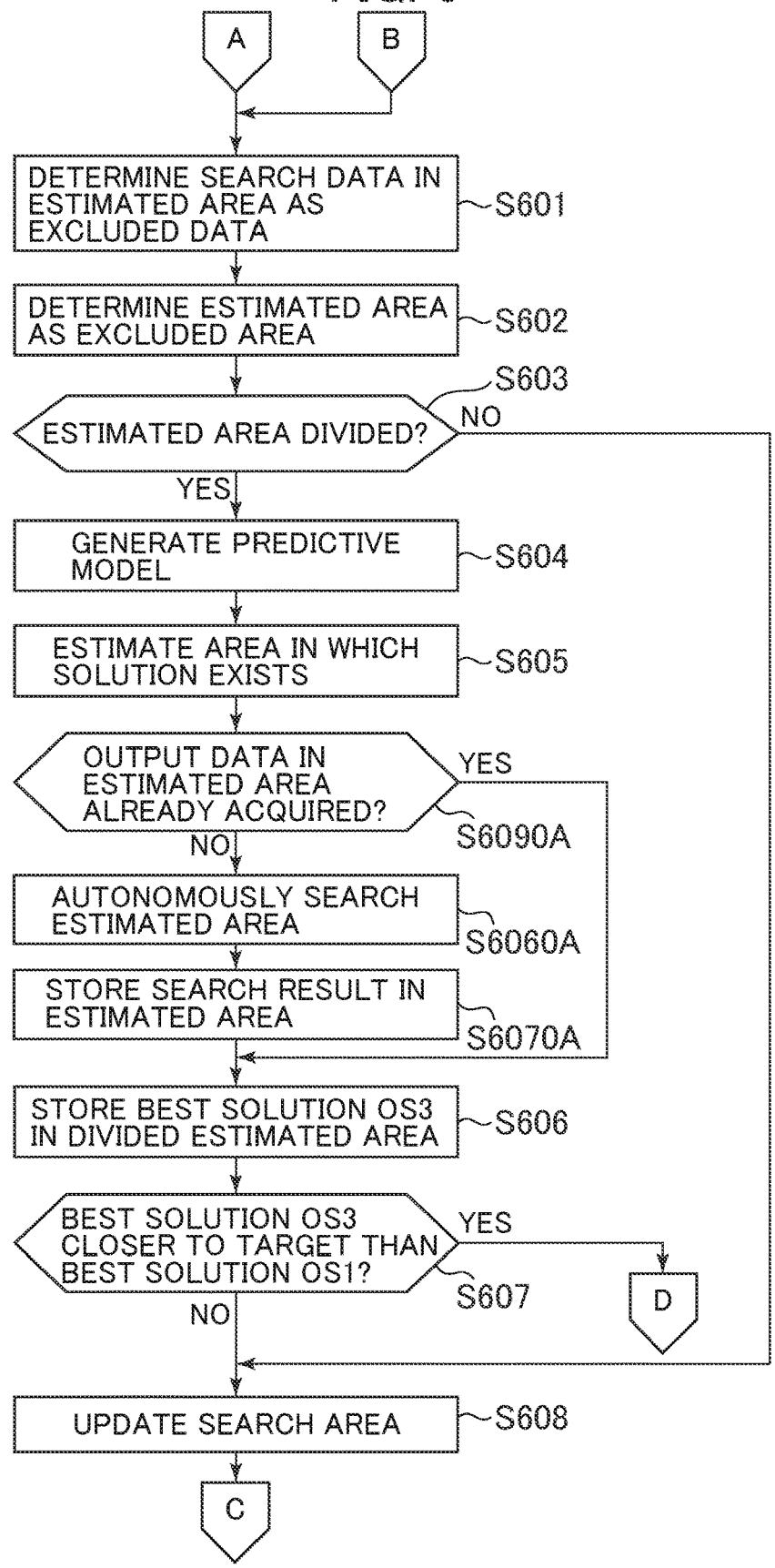
FIG. 6 is a flowchart 2 showing the control processing procedure example of the semiconductor processing apparatus according to the first embodiment of the present invention.

Further, when it is determined by the determination unit 404 that the measured value of the processing result corresponding to the predicted value is not closer to the target value than the reference value of the processing result, the setting unit 405 may set the existence area of the predicted value to the search area without setting the predicted value and the measured value of the processing result corresponding to the predicted value to the reference value of the condition and the reference value of the processing result (Steps S604 to S606 in FIG. 6 to be described later). As a result, the search area is further divided, thereby being capable of executing a more detailed search for a solution and confirming whether or not the solution is overlooked.

In addition, as described above, when the determination unit 404 determines that the measured value of the processing result corresponding to the predicted value is not closer to the target value than the reference value of the processing result, the determination unit 407 may determine the predicted value and the measured value of the processing result corresponding to the predicted value as the exclusion data. In that case, the generation unit 402 may generate the predictive model based on the residual measured value obtained by excluding the exclusion data from the measured value and the residual set value obtained by excluding the set value corresponding to the residual measured value from the set value (to be described in detail later in FIG. 7). As a result, the search speed of the value of the input parameter which is the solution can be improved.

In addition, as described above, when the determination unit 404 determines that the measured value of the processing result corresponding to the predicted value is not closer to the target value than the reference value of the processing result, the determination unit 407 may determine the existence area of the predicted value as the exclusion area. In that case, the generation unit 402 may generate the predictive model on the basis of the set value of the condition in the residual search area excluding the exclusion area from the search area and the measured value of the output when the set value is given to the semiconductor processing apparatus 201 (to be described later in FIG. 8). As a result, the search speed of the value of the input parameter which is the solution can be improved.

The detection unit 409 detects an unstable operation of the semiconductor processing apparatus 201 based on the output of the semiconductor processing apparatus 201 and a predetermined output threshold value. The detection unit 409 corresponds to the unstable operation detection system 263. In this case, the output unit 406 outputs the detection result by the detection unit 409.

<Example of Control Processing Procedure of Semiconductor Processing Apparatus 201>

Figure 5:
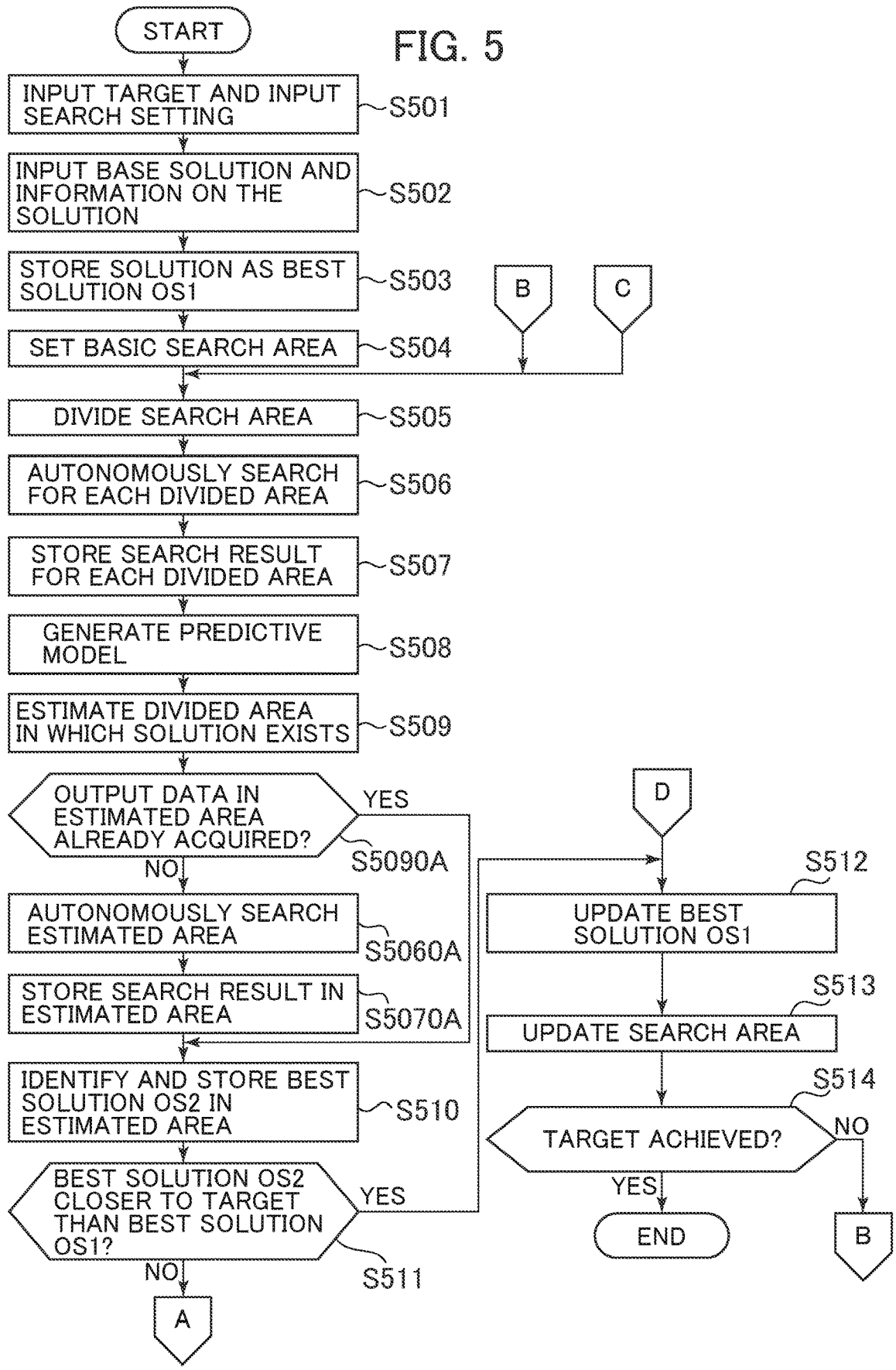
FIG. 5 is a flowchart 1 showing a control processing procedure example of a semiconductor processing apparatus according to the first embodiment of the present invention.

FIG. 5 is a flowchart 1 showing an example of a control processing procedure of the semiconductor processing apparatus 201. The search device 300 accepts the input of an output value (a target value of an output parameter) and a search setting from the target semiconductor processing apparatus 201 (Step S501). The search setting means, for example, an allow value of a difference or a divergence between the search result and the target value, an upper limit of the time to execute one condition in the search, the number of searches, an upper limit of the total time for one set of searches, an upper limit of the total time of the overall searches, an upper limit of the analysis time of the search result, an upper limit of the number of analysis data, a threshold of the acquisition frequency of the output data from the semiconductor processing apparatus 201, an upper limit of the acquisition time of output data (a value of the output parameter) from the semiconductor processing apparatus 201, and a lower limit of the number of output data from the semiconductor processing apparatus 201.

Next, the search device 300 accepts the input of a solution to be a base and the input of information on the solution (Step S502). Specifically, for example, the search device 300 accepts the input of the output parameter when the input parameters actually used in the past and the output parameters when using the input parameters in the past, the best solution (the value of the input parameter) before starting the search and the output parameter when using the best solution, the target value of the output parameter before starting the search, and a model function describing a relationship between the input parameter and the output parameter.

Next, the search device 300 stores the best solution input in Step S502 as the best solution OS1 (Step S503). If there is no solution, a symbol or a value indicating the farthest from the solution is set.

Next, the search device 300 sets the basic search area as a search area (Step S504). Specifically, for example, the search device 300 sets search availability for each input parameter, an upper limit value and a lower limit value of a control range of an input parameter to be searched, and a value for limiting the control range of the input parameter to be searched (for example, an upper limit value and a lower limit value). Also, the search unit 300 refers to the control range of the input parameters to be determined as a setting error by a setting error detection system 223, and determines the search area. Further, the search device 300 refers to the parameter detected by the unstable motion detection system 263 to determine the search area. In addition, the unstable operation detection system 263 holds the combination of the input parameters in which the operation of the semiconductor processing apparatus 201 has been disabled or unstable in the past, or the value of each input parameter range, and the search device 300 can determine the search area with the use of those held values.

For example, in FIG. 1, when two input parameters X1 and X2 are selected as the input parameter type, if the control range of the input parameter X1 is [x11, x1n], and the control range of the input parameter X2 is [x21, x2n], an area A in the entire range shown in FIG. 1 becomes the search area.

The input and setting contents of the target setting controller 261 in Steps S501 to S504 are delivered to the autonomous search system 262, and automatic search is executed by a procedure of Steps S505 to S510 to be described next.

The search device 300 divides the search area (Step S505). Specifically, for example, the search device 300 divides a control range of searchable input parameters into two or more areas for one or more input parameters. The divided areas are referred to as divided areas. In the case where the number of search conditions become larger, and it is predicted that the search cannot be completed within a desired time, a method of designating a divided area presumed to have a solution in some input parameters among the types of input parameters, and a method of identifying the type of input parameter that can be changed at once are used, there being capable of limiting the search area or reducing the number of search conditions. In addition, with the combination of those two methods, the search area can be limited or the number of search conditions can be reduced.

For example, in FIG. 1, when two input parameters X1 and X2 are selected as the type of input parameters, if the control range [x11, x1n] of the input parameter X1 is divided into x1a, x1b, and x1c, and the control range [x21, x2n] of the input parameter X2 is divided into x2a, x2b, and x2c, the nine divided areas A1 to A9 shown in FIG. 1 are obtained.

The search device 300 executes an autonomous search for each divided area (Step S506). In more detail, for example, the search device 300 acquires the input and output data of the semiconductor processing apparatus 201 under each search condition as a search result by autonomous search using the divided area and the search condition. The input and output data is a set of a value (input data) of the input parameter given to the semiconductor processing apparatus 201 and a value (output data) of the output parameter obtained from the semiconductor processing apparatus 201.

Specifically, for example, the search device 300 selects a value of the input parameter that satisfies the search condition for each divided area, and provides a value of the selected input parameter to the semiconductor processing apparatus 201. Then, the search device 300 acquires the output data (value of the output parameter) from the semiconductor processing apparatus 201. A combination of a value of the input parameter and a value of the output parameter corresponding to the parameter value is a search result.

In addition, in this case, the unstable operation detection system 263 detects a case where the semiconductor processing apparatus 201 can continue the processing operation, but the processing of the semiconductor processing apparatus 201 becomes unstable at the time of performing the autonomous search. When the unstable operation has been detected, the unstable operation detection system 263 executes a sequence for restoring the semiconductor processing apparatus 201 to a steady operation state after completion of the processing, or executes a sequence for immediately stopping the processing and restoring the semiconductor processing apparatus 201 to a steady operation state, to thereby continue an autonomous search by the target setting controller 261.

The search device 300 stores the search result for each divided area in the database 205 (Step S507). Specifically, for example, the search device 300 performs the input and output data which is a set of a value of the input parameter used in the autonomous search (Step S506), and a value of the output parameter of the semiconductor processing apparatus 201 acquired with the use of the value of the input parameter as the search result for each divided area in the database 205.

The search device 300 generates a predictive model for predicting a solution (input parameter) that satisfies the target (target output) (Step S508). Specifically, for example, the search device 300 generates a function indicating a relationship between the input and output data of the semiconductor processing apparatus 201 as the predictive model with the use of the learning data stored in the database 205 in Step S507. As a method of analyzing the relationship of the input and output data, a regression analysis that can deal with multiple inputs and multiple outputs such as a neural network, a support vector regression, and a regression using kernel method. A statistical analysis such as a correlation analysis, a principal component analysis, and a multiple regression analysis can be used.

In the generation of the predictive model, for example, the sensor data and monitor data for acquiring an indirect measured value for the processing result of the semiconductor processing apparatus 201 are used as the output data. There is a case where the acquisition frequency of the output data is lower than a frequency specified by the search setting, or longer than an acquisition time specified by the search setting, and the number of output data pieces that can be acquired by search is smaller than the number of output data specified by the search setting. In that case, it is sufficient to acquire the sensor data and the monitor data from which a larger number of data pieces can be acquired as compared with the number of output data pieces acquired. This makes it possible to analyze the relationship between the sensor data and the monitor data with respect to the output data, and the relationship between the sensor data and the input data with respect to the monitor data. Also, with the use of both those analysis results, the relationship of the input data to the output data can be obtained.

The search device 300 estimates the divided area in which the solution exists (Step S509). Then, if the output data within the area estimated to have the solution has already been acquired (Yes in Step S5090A), the search device 300 identifies the best solution OS2 from among the estimated divided areas, and stores the identified best solution OS2 in the database 205 (Step S510). Also, if there is a solution, when the output data in the estimated area has not been obtained (NO in Step S5090A), the search device 300 performs an autonomous search within the estimated area (Step S5060A), acquires the output data in the estimated area in which the solution exists, that is, the search result, and stores the search result in the database 205 (Step S5070A). The autonomous search and the storing of the result are the same process as that in Step S506 and Step S507. Step S509 has two processing methods. One is a method (first estimation method) of giving a target value of the output parameter given in Step S501 to the predictive model.

Specifically, in the first estimation method, for example, the search device 300 substitutes the target value of the output parameter given in Step S501 into the predictive model obtained in Step S508, thereby estimating the input data (value of the input parameter) which is the solution satisfying the target value of the output parameter. Then, the search device 300 identifies the divided area in which the input data as the solution exists. For example, when the predictive model is a function indicating the input and output relationship of FIG. 1, if y6 is given as the target value of the output parameter, three divided areas of A1, A4, and A7 are estimated as the divided areas in which the solution exists are estimated. If output data has not been acquired in each of the divided areas A1, A4, and A7, Steps S5060A and S5070A are executed as described above.

In Step S510, the search device 300 identifies, according to the output data that has already been acquired, a divided area in which output data equal to the target value y6 exists, a divided area in which there is the output data in which a difference or a divergence between the output data and the target value is smaller than an allowable value (allowable value given in S501), or a divided area in which there is the output data closest to the target value y6, and determines the identified divided area as an area in which the best solution OS2 is present (hereinafter referred to as identified divided area). When multiple divided areas that can be the identified divided area are identified, the search device 300 determines all of those divided areas as the divided areas in which the best solution OS2 exists. Alternatively, the search device 300 determines the divided area having the largest number of output data from among those multiple divided areas, in which the difference or divergence between the output data and the target value is smaller than the allowable value (allowable value given in S501), as the divided area in which the best solution is present. In the case of the above example, when the acquired output data is the same as that of the predicted model shown in FIG. 1, all of the divided areas A1, A4, and A7 in which a value equal to y6 or closer to y6 is obtained, or the divided area A4 is determined as the identified divided area. The search device 300 determines, as the best solution OS2, the value of the input parameter at the time of obtaining the output data which is equal to the target value of the output data in the identified divided area, whose difference or divergence from the target value is smaller than the allowable value (allowable value given in S501), or which is closest to the target value.

The other process in Step S509 can be applied to a case where an input parameter that is a solution satisfying the target value of the output parameter cannot be directly obtained by assigning the target value of the output parameter given in Step S501 to the predictive model (second estimation method). The second predictive model is a method in which the input parameters given to the predictive mode at once is set as one set, and multiple sets of input parameters are given to the predicted model, and the predicted output parameter is calculated to acquire the sets of input parameters which can obtain the processing result closest to the target output. For example, the search device 300 can create one or more sets of the input parameters included in each divided area for each divided area, give the created set of input parameters to the predictive model, and calculate the output parameter at that time. As a method of obtaining a representative estimated output for each divided area, as the set of input parameters included in the divided area, a value that is the center coordinates in the divided area can be used.

In the case where an extremely large number of sets of input parameters are given to the predictive model to calculate the estimated output, when the calculation time becomes enormous, as described using the Expressions (1.1) to (1.3) described above, the search device 300 can reduce the calculation time by determining the central condition of the input parameters to be given to the predictive model and limiting the types of input parameters that can be changed from the central condition. Also, the number of parameters that can be changed at once from the central condition is limited, thereby being capable of reducing the calculation time. As a result, the search device 300 can obtain the input parameter that can obtain the result closer to the target output while reducing the number of sets of input parameters given to the predictive model. When setting the center condition, the past search results or engineer's knowledge can be used. Alternatively, the center coordinates of the entire search area can be set as the center condition.

In the second estimation method, specifically, the search device 300 obtains the value of the output parameter to be the predicted value by substituting the value of the set of the input parameters into the predictive model obtained in Step S508. For example, when the predictive model is a function showing the input and output relationship of FIG. 1, if (x11, x21), (x11, x22), (x11, x23), (x12, x21), (x12, x22), (x12, x23), (x13, x21), (x13, x22), (x12, x22), (x12, x23), (x13, x21), (x13, x22), (x13, x23), (x1$n$, x21), (x1$n$, x22), and (x1$n$, x23) are given to the predictive mode as the values of the input parameters, the estimated output parameter corresponding to each input parameter can be obtained.

When the output parameter corresponding to each of those input parameters has not been acquired (yes in Step S5090A), the search device 300 executes an autonomous search with the use of each input parameter (Step S5060A), and acquires the output data in the area in which the solution is estimated to be present, that is, the search result, and stores the acquired search result in the database 205 (Step S5070A). The autonomous search and the storing of the results are the same process as that in Steps S506 and S507. If the output parameter corresponding to each input parameter has already been acquired (No in Step S5090A), the process proceeds to Step S510.

In Step S510, the search device 300 determines the value of the input parameter from which the value of the output parameter which is the closest predicted value from the target value of the output parameter is obtained as the best solution OS2, for example, in the divided area. For example, when the obtained output data is the same as that in FIG. 1 indicated by the predictive model, if the target value of the output parameter is y10, the value y10 of the output parameter corresponding to the value (x13, x23) of the input parameter is the closest value. Therefore, the best solution OS2 is (x13, x23). Which of the first estimation method and the second estimation method is to be applied is set in advance.

The search device 300 determines whether or not the value of the best solution OS2 is a solution that can obtain an output parameter closer to the target than the value of the best solution OS1 (Step S511). If the value of the best solution OS2 is a solution that can obtain the output parameter closer to the target than the value of the best solution OS1 (YES in Step S511), the process proceeds to Step S512. If not (No in Step S511), the process proceeds to Step S601 (FIG. 6).

If yes is in Step S511, the search device 300 updates the best solution OS1 by setting the best solution OS2 to the best solution OS1 (Step S512). Further, the search device 300 updates the search area by setting the divided area of the updated best solution OS1 as the search area (Step S514).

Thereafter, the search device 300 determines whether or not the target has been achieved (Step S514). When the target has been achieved (Yes in Step S514), the search device 300 completes the control process. On the other hand, when the target has not been achieved (No in Step S514), the process proceeds to Step S505 or Step S601 (FIG. 6). Whether or not to proceed to Step S505 or Step S601 (FIG. 6) may be set in advance, or the user may make selection each time. When the target has not been achieved yet (No in Step S514) and the process proceeds to Step S505, the search device 300 divides the updated search area in Step S513 (Step S505).

Specifically, in Step S514, for example, when the output parameter corresponding to the updated best solution OS1 is equal to the target value or the difference from the target value falls within the allowable range, the search device 300 determines that the target has been achieved (Yes in Step S514). If the output parameter corresponding to the updated best solution OS1 is equal to the target value or if the search time set in Step S501 has been elapsed even if the difference from the target value does not fall within the allowable range, the search device 300 determines that the target has been achieved (Yes in Step S514). On the other hand, if the output parameter corresponding to the updated best solution OS1 is not equal to the target value, or the difference from the target value does not fall within the allowable range, and the search time set in Step S501 has not been elapsed, the search device 300 determines that the target has not been achieved (No in Step S514).

FIG. 6 is a flowchart 2 showing an example of a control processing procedure of the semiconductor processing apparatus 201. The search device 300 determines the search data in the divided area obtained in Step S509 as exclusion data (Step S601). More specifically, for example, the search device 300 sets the input data (the value of the input parameter) and the output data (output parameter) within the estimated area as the exclusion data. The exclusion data is data that may be excluded in future processing (The exclusion from data to be actually analyzed is performed in S703 in FIG. 7 or S608 in FIGS. 6 to 8). Similarly, the search device 300 determines the divided area obtained in Step S510 as the exclusion area (Step S602). The exclusion area is an area that may be excluded in future processing (Exclusion from data to be actually analyzed is performed in S803 in FIG. 8 or S608 in FIG. 6 to FIG. 8).

Thereafter, the search device 300 determines whether or not to divide the divided area obtained in Step S509 (Step S603). In the case of dividing the area (Yes in Step S603), the process proceeds to Step S604, and in the case of dividing no area (No in Step S603), the process proceeds to Step S608.

Specifically, in Step S603, for example, the search device 300 determines whether or not to divide the divided area based on the presence or absence of a division instruction input from the user. Further, the search device 300 may forcibly divide the divided area (Yes in Step S603).

Thereafter, the search device 300 generates the predictive model as in Step S508 (Step S604). Next, as in Step S509, the search device 300 estimates the divided area in which the solution is present in a divided area group divided in Step S603 (Step S605). The estimated divided area is referred to as an estimated divided area. Then, the search device 300 executes the same processing as that in Steps S5090A, 55060A, and 55070A, in Steps S6090A, 56060A, and 56070A. Specifically, for example, when the output data within the area estimated to have the solution has already been acquired (Yes in Step S6090), the search device 300 identifies the best solution OS3 from among the estimated divided areas, and stores the identified best solution OS3 in the database 205 (Step S606). Likewise, when the output data in the estimated area has not been acquired (No in Step S6090), the search device 300 executes the autonomous search within the estimated area (Step S6060A), acquires the output data within the area estimated to have the solution, that is, the search result, and stores the acquired output data in the database 205 (Step S6070A).

Thereafter, as in Step S511, the search device 300 determines whether the value of the output parameter corresponding to the best solution OS3 is a solution closer to the target than the value of the output parameter corresponding to the best solution OS1 (Step S607). When an output parameter corresponding to the best solution OS3 is a solution closer to the target than the value of the output parameter corresponding to the best solution OS1 (Yes in Step S607), the process proceeds to Step S512, and if not (No in Step S607), the process proceeds to Step S608. In Step S608, the search device 300 updates the sear area by excluding the exclusion area from the search area, or excluding the exclusion area and the exclusion data (Step S608), and the process proceeds to Step S505.

Figure 7:
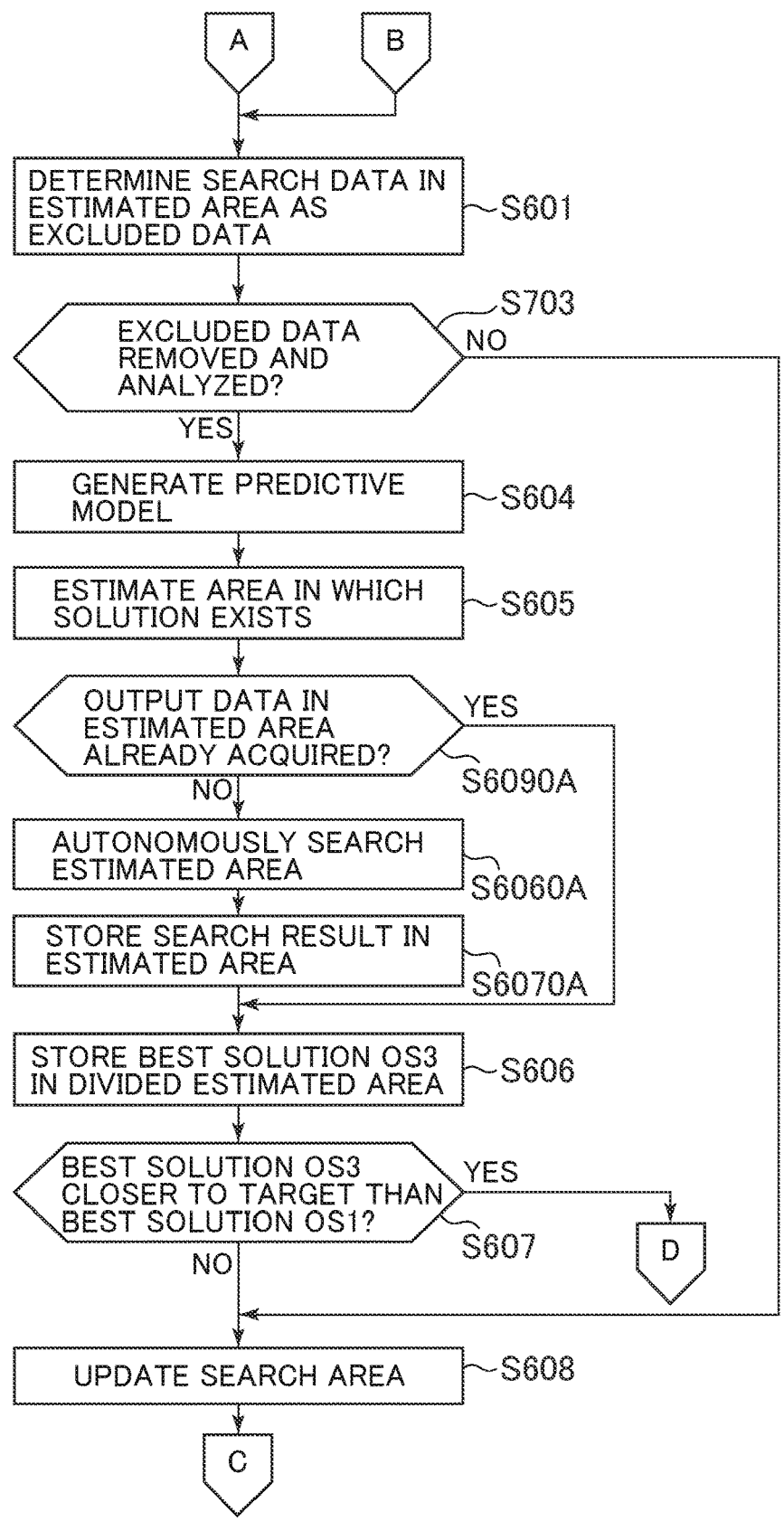
FIG. 7 is a flowchart 3 showing the control processing procedure example of the semiconductor processing apparatus according to the first embodiment of the present invention.

FIG. 7 is a flowchart 3 showing an example of a control processing procedure of the semiconductor processing apparatus 201. The flowchart 3 is another example of processing of the flowchart 2 shown in FIG. 6. The same Steps as in FIG. 6 are denoted by the same Step numbers, and a description of the same processing will be omitted. After Step S601, the search device 300 determines whether or not to exclude the exclusion data determined in Step S601 (Step S703). When the search device 300 excludes the exclusion data and analyzes data (Yes in Step S703), the process proceeds to Step S604, and when the search device 300 analyzes the data without excluding the exclusion data (No in Step S703), the process proceeds to Step S608.

Specifically, in Step S703, for example, the search device 300 determines whether or not to exclude the exclusion data and analyze the data based on the presence or absence of an exclusion instruction input from the user. Further, the search device 300 may forcibly exclude the exclusion data and analyze the data (Yes in Step S703).

Thereafter, the search device 300 generates the predictive model in the divided area without using the exclusion data (Step S604), and executes Steps S605, S6090A, S6060A, S6070A, S606, S607, and S608.

Figure 8:
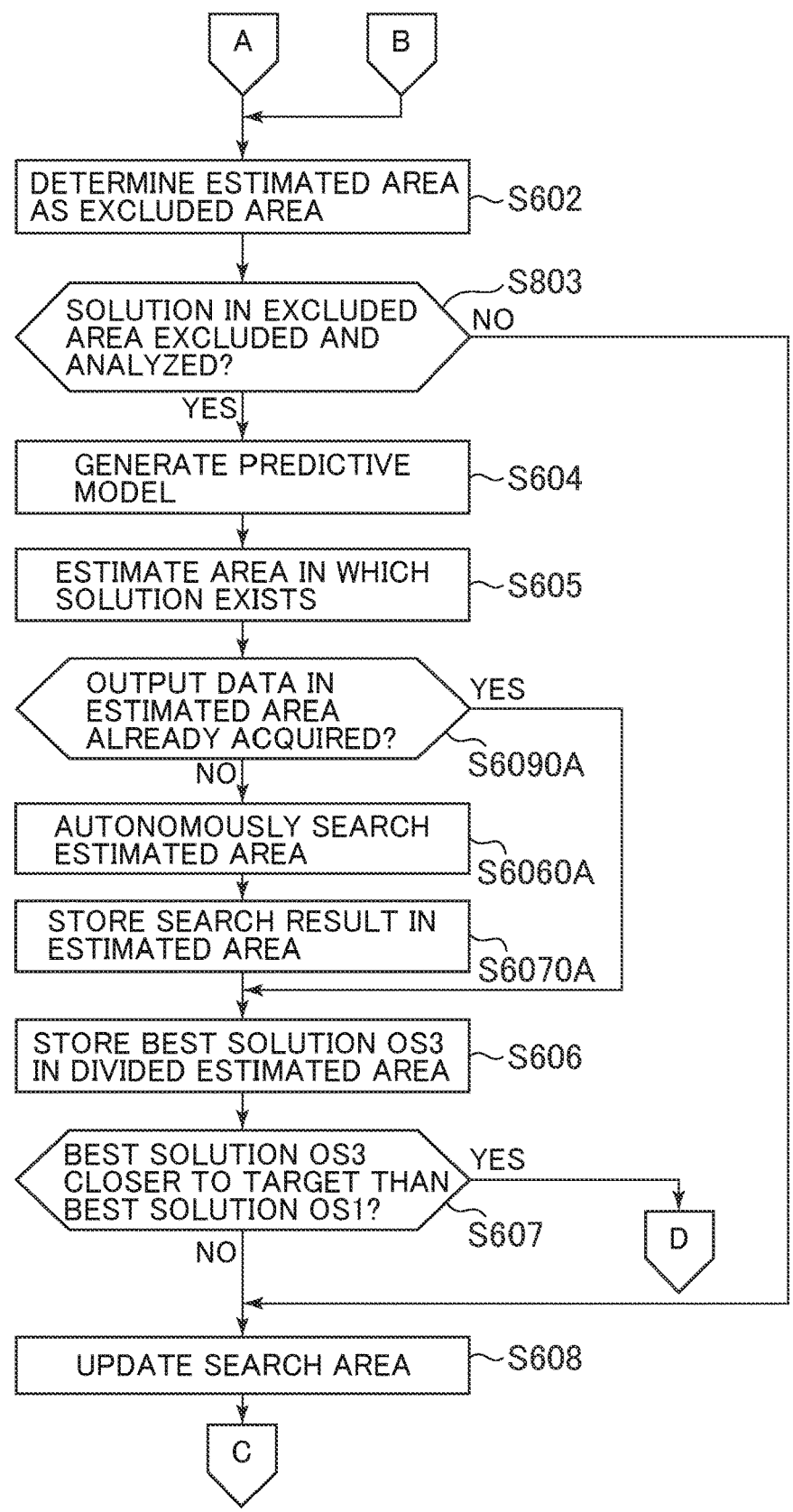
FIG. 8 is a flowchart 4 showing the control processing procedure example of the semiconductor processing apparatus according to the first embodiment of the present invention.

FIG. 8 is a flowchart 4 showing an example of a control processing procedure of the semiconductor processing apparatus 201. The flowchart 4 is another example of processing of the flowchart 2 shown in FIG. 6. The same Steps as in FIG. 6 are denoted by the same Step numbers, and a description of the same processing will be omitted. After Step S602, the search device 300 determines whether to exclude the exclusion area determined in Step S602 or not (S803 in Step S803). When excluding the exclusion area and analyzing the area (Yes in Step S803), the process proceeds to Step S604, and when analyzing the area without excluding the exclusion area (No in Step S803), the process proceeds to Step S608.

Specifically, in Step S803, for example, the search device 300 determines whether or not to analyze the area by excluding the solution (value of the input parameter) in the exclusion area, depending on whether or not an exclusion instruction is input from the user. Further, the search device 300 may forcibly exclude the exclusion area and analyze the area (Yes in Step S803).

Thereafter, the search device 300 generates the predictive model in the divided area as in Step S604 (Step S604). Next, the search device 300 estimates the divided area in which the solution is present in the divided area group divided in Step S603 without using the solution (value of the input parameter) in the exclusion area (Step S605). The estimated divided area is referred to as an estimated divided area. Then, the search device 300 executes Steps S6090A, 56060A, 56070A, S606, S607, and S608.

In the present control process, if a scale of data analysis, storage, transfer, and so on becomes large and an execution time of the processing becomes longer than a time to search for one condition, searching can be continued in parallel with those execution. In that situation, one or more of the number of input parameters to be changed in the search condition, the number of input parameters to be changed at the same time, and the number of divisions of the search area are increased. As a result, the number of search conditions is increased and the condition is searched, thereby being capable of increasing the search result with the use of the time for performing analysis or the like. In particular, a time required to analyze the data may be several minutes to several hours or more, and the search is continued during the analysis, thereby being capable of improving the search speed.

Application Example 1A of Control Process of Semiconductor Processing Apparatus 201

Next, an application example of the control process for correcting a device difference of the semiconductor processing apparatus 201 in the maintenance of the semiconductor processing apparatus 201 before mass production of the semiconductor device will be described. In this example, as an example for describing a procedure of reducing a difference in devices, the semiconductor processing apparatus 201 is an etching device that performs a discharge process. In addition, the input parameter at the time of executing the discharge process is referred to as a recipe. In an etching device performing the discharge process, as the output to be corrected, the processing result or the discharge characteristic used for the processing can be mentioned. As a correction method, there is a method of correcting another etching device so as to obtain the same output as that of the reference etching device, or a method of performing a correction so that the outputs of multiple etching devices become uniform.

Figure 9:
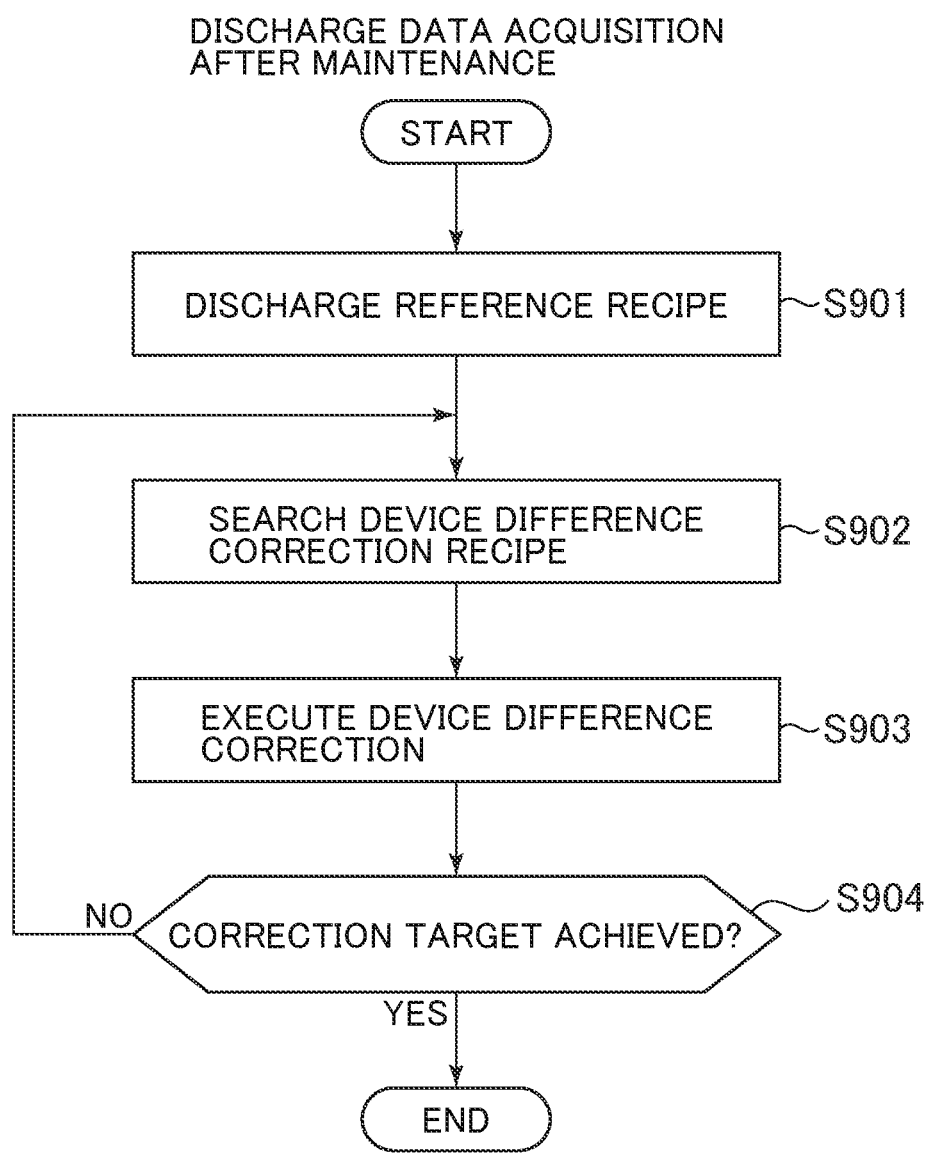
FIG. 9 is a flowchart showing a method of reducing a difference between devices according to the first embodiment of the present invention.

FIG. 9 is a flow chart showing a method of reducing a difference between devices. FIG. 9 specifically shows an example of a maintenance processing procedure of the semiconductor processing apparatus 201 before mass production of a semiconductor device, for example. In order to correct the device difference, the search device 300 starts acquiring discharge data after maintenance.

First, the search device 300 performs a reference recipe discharge with the use of a recipe for performing a basic discharging process, and acquires input and output data at that time. In addition, the search device 300 performs the discharging by a recipe used in mass production, and acquires the output data (value of the output parameter) at that time (Step S901). Step S901 is a process corresponding to Steps S501 to S504.

Next, the search device 300 searches a device difference correction recipe (Step S902). Step S902 is a process corresponding to Steps S505 to S507. Then, the search device 300 executes the device difference correction with the use of the device difference correction recipe searched in Step S902 (Step S903). Step S903 is a process corresponding to the processing of FIGS. 6 to 8. When the correction target has not been achieved (No in Step S904), the process returns to Step S902, and when the correction target has been achieved (Yes in Step S904, the process is completed. Step S904 is a process corresponding to Step S514.

The search speed may be improved by proceeding the search in parallel with the use of the multiple identical etching devices. In this situation, with the use of the multiple etching devices whose device difference has been corrected by the procedure of FIG. 9, the possibility that a solution satisfying the target can be enhanced. Further, the searched solution can be developed on those multiple devices to perform the solution.

As described above, with the execution of the search method by the search device 300 after maintenance of the semiconductor processing apparatus 201, the value of the output parameter of the semiconductor processing apparatus 201 can be brought closer to the value of the output parameter serving as a reference (automatic device difference correction function).

Application Example 2A of Control Process of Semiconductor Processing Apparatus 201

Next, an application example of a control process for correcting a change over time in mass production processing of a semiconductor device will be described.

Figure 10:
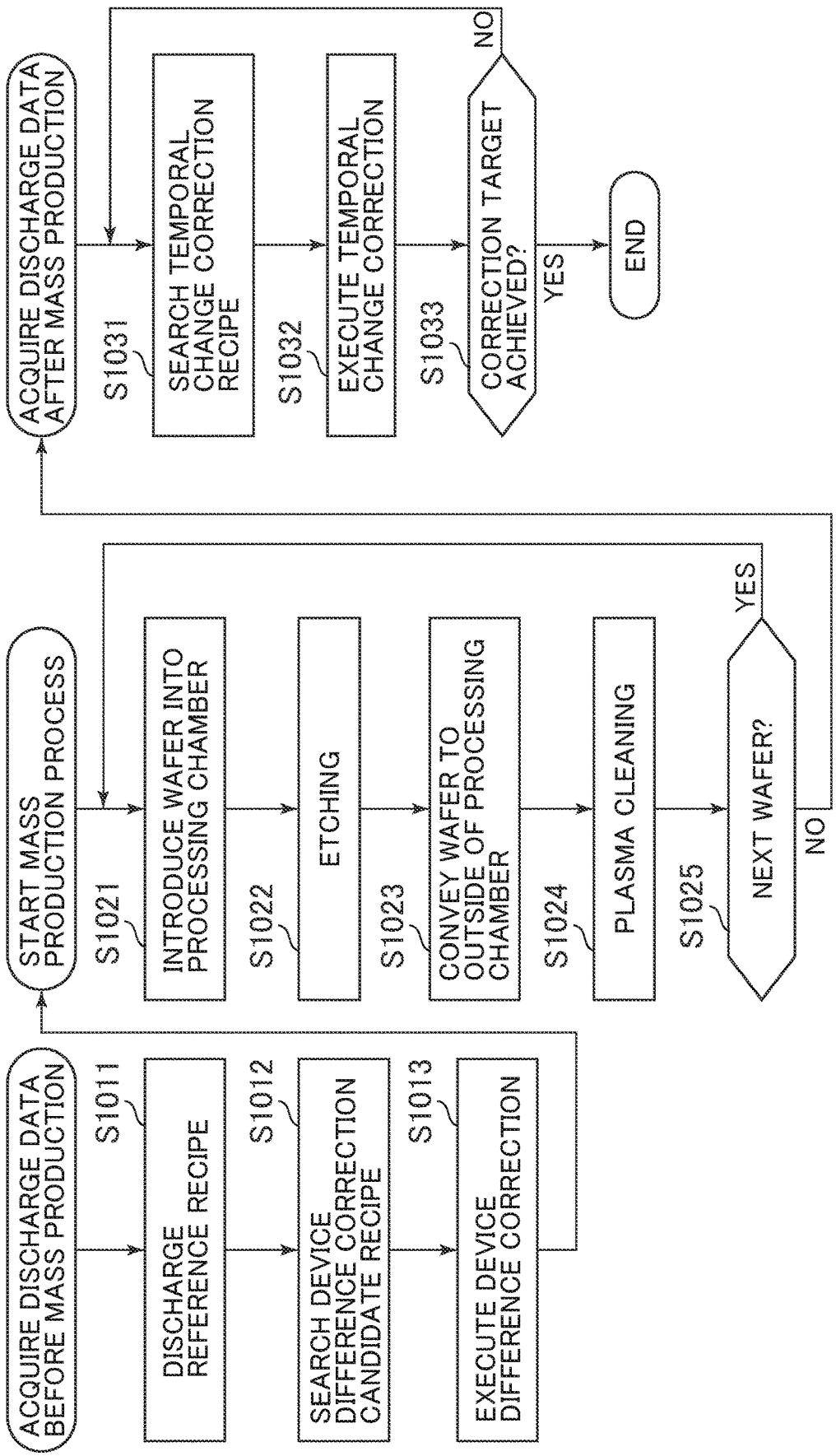
FIG. 10 is a flowchart showing a method of correcting a change over time according to the first embodiment of the present invention.

FIG. 10 is a flowchart showing a temporal change correction method. In FIG. 10, as in FIG. 9, as an example for describing a procedure for correcting a change over time, the semiconductor processing apparatus 201 is an etching device that uses discharge for processing. In the pre-mass production discharge data acquisition, in order to correct the temporal change during mass production, the search device 300 first gives a reference recipe for performing a basic discharging process to the etching device to perform a reference recipe discharge, and acquires the output data (the value of the output parameter) at that time (Step S1011). Step S1011 is a process corresponding to Steps S501 to S504.

Next, the search device 300 searches for a device difference correction candidate recipe (Step S1012). In Step S1012, output data or sensor data, and monitor data that can predict the temporal change of an object to be corrected according to the analysis result of the input and output data at past mass production are used. The search device 300 searches for the device difference correction candidate recipe for causing the etching device before mass-production start to vary data based on which to predict the temporal change to a value after the temporal change. Step S1012 is a process corresponding to Steps S505 to S507.

Next, the search device 300 executes a device difference correction (Step S1013). In Step S1013, the search device 300 compares the basic mass-production recipe used in a state in which the temporal change does not occur with the device difference correction candidate recipe searched in Step S1012, and clarifies the input parameter changed by the device difference correction candidate recipe. As a result, at a stage before mass production, a function that describes a relationship between the input parameter and the output parameter to be corrected can be generated at the stage before mass production, and a recipe to be a correction candidate can be generated according to the relationship. Step S1013 is a process corresponding to the processing of Steps S508 to S513 and FIGS. 6 to 8. Thereafter, the mass production process is started.

After Step S1013, when the mass production process of the semiconductor device is started, a wafer is introduced into a processing chamber (Step S1021), and the etching device etches the wafer (Step S1022). Etching (Step S1022) is performed by one Step or multiple Steps. In the case where the etching (Step S1022) is performed by the multiple Steps, the etching of each Step is executed by changing a discharge condition. The wafer is carried out of the processing chamber (Step S1023). After completion of the etching (Step S1022), the wafer is carried out of the processing chamber (Step S1023). In order to remove reactive organisms generated during etching and deposited on a surface of the processing chamber, a plasma cleaning is performed (Step S1024). If there is a next wafer (Yes in Step S1025), the operation returns to Step S1021, and if there is no next wafer (No in Step S1025), the process proceeds to acquisition of the discharge data after mass production.

The input and output data of the etching device under mass production is stored in the database 205, and the search device 300 continues analyzing the input and output data in parallel in real time. As a result, the estimation of the output data or the sensor data and the monitoring data based on which to be able to predict the temporal change in the object to be corrected can be continued during mass production. In addition, the search device 300 can increase the number of data pieces by aggregating the input and output data of the multiple etching devices that execute the same mass-production processing.

When the discharge data is acquired after mass production or when a designated time has elapsed from the start of mass production, the search device 300 executes the search of the recipe for correcting the temporal change (Step S1031). Specifically, for example, the search device 300 uses the data acquired in Steps S1011 and S1012, the relationship between the analyzed input and output data, and the correction candidate recipe as inputs in Step S502 to search for the temporal change correction recipe. Step S1031 is a process corresponding to Steps S505 to S507.

The search device 300 verifies the correction result with the use of the temporal change correction recipe that is the search result (Step S1032). Step S1032 is processing corresponding to the processing in Steps S508 to S513 and FIGS. 6 to 8.

In addition, prior to the execution of Steps S1031 and S1032, the search device 300 may analyze the output data acquired during mass production of the semiconductor device, estimate the output data or the sensor data, and the monitor data that can predict the temporal change in the object to be corrected, and execute Step S1012. This makes it to generate a function that describes the relationship between the input parameter and the output parameter of the object to be corrected, and generate a recipe to be a correction candidate from the relationship. With the use of those results in Step S502, the search device 300 can execute Steps S1031 and S1032.

Further, as the input of Step S502 in the above search, a recipe in which the input parameters frequently used for correction are changed with the use of an engineer's knowledge, and input and output data obtained at the time of being discharged using the recipe and analysis results of the input and output data may be used.

Then, when the correction target has not been achieved (No in Step S1033), the process returns to Step S1031, and when the correction target has been achieved (Yes in Step S1033), the process is completed. Step S1033 is a process corresponding to Step S514. When executing the search shown in FIG. 10, a search speed can be improved by advancing the search in parallel with the use of the multiple etching devices after mass production which have implemented the same mass-product processing. Further, the searched solution (input parameter) can be developed in the multiple etching devices that execute the same mass production process and corrected.

As described above, with the execution of the search method by the search device 300 after mass production of semiconductor, the temporal change in the values of the output parameters of the semiconductor processing apparatus 201 during mass production can be corrected (automatic temporal change correction function).

In this manner, the search device 300 automatically analyzes the values of the input parameters and the output parameters of the semiconductor processing apparatus 201, takes the analysis result into consideration and automatically determines the experiment condition for searching the value of the input parameter. The search device 300 automatically verifies the experiment result, and repeats those automatic operations, thereby being capable of automatically searching the value of the input parameter from which the targeted device state and processing result (value of the output parameter) is obtained. As a result, the semiconductor processing apparatus 201 per se can automatically bring out the device performance, and additionally can assist an engineer that performs a control model developed for bringing out the device performance and a selection of the device parameters (the combination of the input parameters with the output parameters).

As described above, the search device 300 according to the present embodiment includes the input unit 401, the generation unit 402, the identification unit 403, the determination unit 404, the setting unit 405, and the output unit 406. The input unit 401 accepts the input of the target value indicating the condition set in the semiconductor processing apparatus 201 which processes the semiconductor or the processing result of the semiconductor processed by the semiconductor processing apparatus 201, and a reference value of one of the condition or the processing result in the search area defined by a range of the condition and the processing result, which is indicated by the target value. The generation unit 402 generates the predictive model indicating the relationship between the condition and the processing result based on the set value of the condition in the search area and the measured value of the processing result when the set value is given to the semiconductor processing apparatus 201. The identification unit 403 gives the target value input by the input unit 401 to the predictive model generated by the generation unit 402 to acquire the predictive value from the predictive model and identifies the existence area of the predictive value from the search area. The determination unit 404 determines whether or not the measured value of the processing result corresponding to the predicted value is closer to the target value than the reference value input by the input unit 401. The setting unit 405 sets the predicted value to the reference value and sets the existence area of the predicted value identified by the identification unit to the search area when it is determined by the determination unit 404 that the measured value of the processing result corresponding to the predicted value is closer to the target value. The output unit 406 outputs the predicted value which meets the achievement condition when the measured value of the processing result corresponding to the predicted value meets the achievement condition.

This makes it possible to improve an arrival accuracy to the best solution regarding the input and output of the semiconductor processing apparatus 201. Therefore, it is possible to improve the operation efficiency and optimize the processing in the semiconductor processing apparatus 201.

Further, in the search device 300, when the determination unit 404 determines that the measured value of the processing result corresponding to the predictive value obtained from the predictive model is not closer to the target value, the determination unit 407 determines the predicted value in the existence area of the predicted value and the measured value of the processing result corresponding to the predicted value as the exclusion data, and the setting unit 405 sets the residual area obtained by excluding the exclusion area identified by the exclusion data and the target value given to the semiconductor processing apparatus 201 when the exclusion data is obtained from the search area, as the search area. As a result, the exclusion area in which the combination of the predicted value not closer to the target value with the measured value of the processing result is present can be excluded from the latest search area, and the arrival accuracy to the best solution can be improved.

Further, in the search device 300, the division unit 408 divides the search area into multiple areas, and when the determination unit 404 determines that the measured value of the processing result corresponding to the predicted value is closer to the target value, the identification unit 403 sets the predicted value to a reference value and identifies the existence area of the predicted value from among the multiple divided areas. As a result, the search device 300 can easily identify the existence area of the predicted value, and can improve the search speed.

Further, in the search device 300, the division unit 408 divides the search area into multiple areas, the generation unit 402 acquires the measured value of the processing result when the set value of the condition in the divided area is given to the semiconductor processing apparatus 201 for each divided area, and the generation unit 402 generates the predictive model based on the set value of the condition and the measured value of the processing result in each divided area. As a result, with the use of the multiple semiconductor processing apparatuses 201, the search device 300 can acquire the measured values in parallel for each divided area, and can increase the generation speed of the predictive model.

Further, in the search device 300, when the determination unit 404 determines that the measured value of the processing result corresponding to the predicted value is not close to the target value, the determination unit 407 determines the data acquired in the existence area of the predicted value as the exclusion data, and the generation unit 402 generates the predictive model based on the specific measured value excluding the exclusion data from the measured value and the specific set value excluding the set value given to the semiconductor processing apparatus 201 when the exclusion data is obtained from the set value. Further, the search device 300 can exclude the exclusion area in which the combination of the predicted value not closer to the target value and the set value is present, from the predicted value candidate, and can improve the accuracy of the predictive model. Therefore, an excellent predicted value can be obtained by the generated predictive model.

Further, in the search device 300, the detection unit 409 detects the unstable operation of the semiconductor processing apparatus 201 on the basis of the measured value of the processing result and the predetermined output threshold value, and the output unit 406 outputs the detection result by the detection unit 409. This makes it possible to prompt the user as to whether or not the search can be continued.

Second Embodiment

In a second embodiment, in addition to the area division according to the first embodiment, a demonstration experiment is performed based on a predictive model to search for an optimum solution that satisfies a target. For that reason, according to the second embodiment, the result of a demonstration experiment (processing result) is added to learning data to update the demonstration experiment is repeated until a target is satisfied, and an optimum solution is searched by gradually updating the target toward a final target. The semiconductor manufacturing system has the same configuration as that of the first embodiment, and the contents of the processing will be described with respect to portions different from the first embodiment.

<Search Example of Input Parameter>

Figure 11:
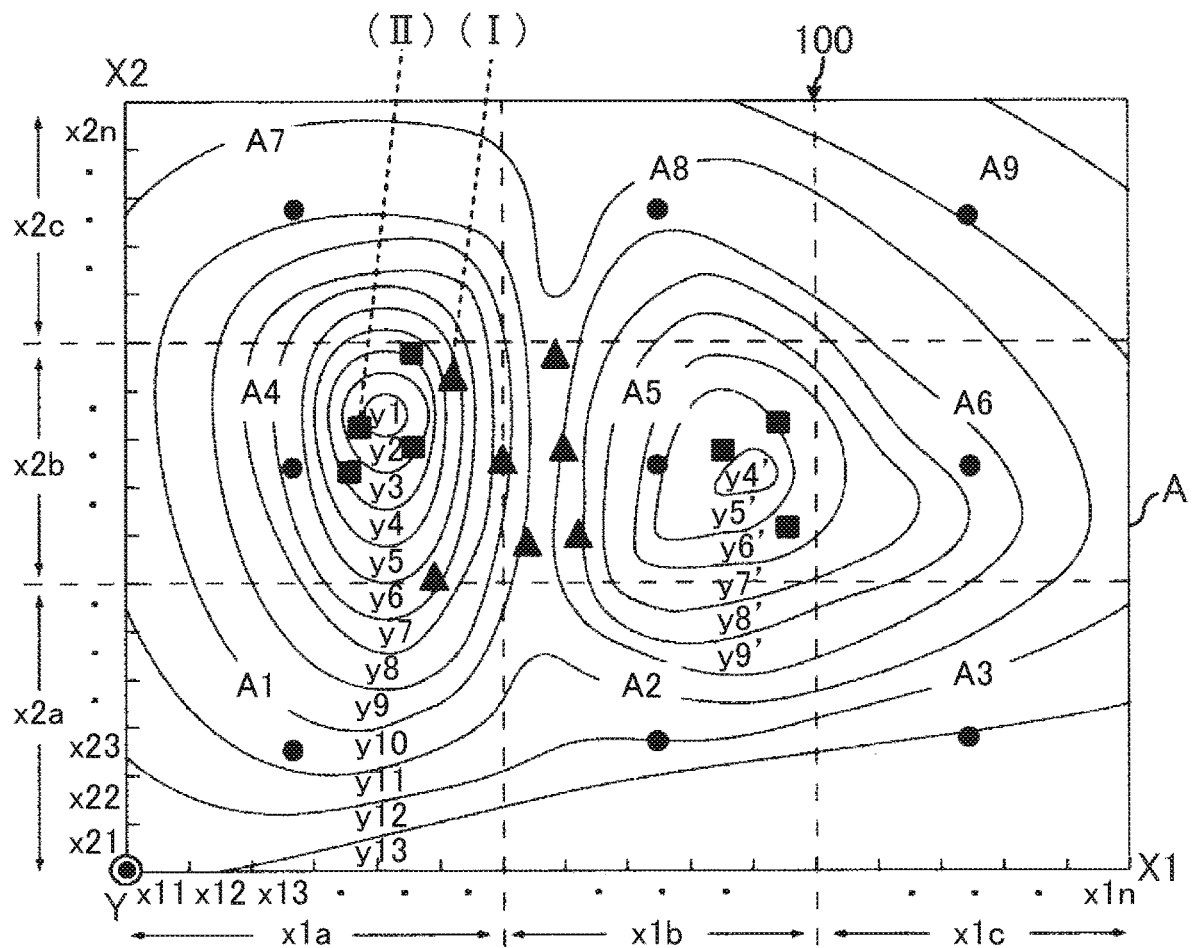
FIG. 11 is an illustrative diagram showing a search example of input parameters according to a second embodiment of the present invention.

FIG. 11 is an illustrative view showing a search example of input parameters. FIG. 11 shows an example of a combination of input data with output data for a semiconductor processing apparatus when searching the input data (a value of an input parameter described above) which can obtain the output data (a value of an output parameter) satisfying a target in a semiconductor processing apparatus as in the first embodiment shown in FIG. 1.

In the second embodiment, a parameter of an initial data point (circle mark) in the drawing is given to a search device 300 to generate a predictive model, and a prediction result by the predictive model is calculated as a first prediction point (triangle mark) in the drawing. The search device 300 executes a demonstration experiment with the data of a first predicted point in a semiconductor processing apparatus 201, and updates the predictive model with the demonstration experiment result (processing result) as learning data.

The search device 300 updates the predictive model from the learning data to which the previous demonstration experiment result is added to calculate the prediction result by the predictive model as a second prediction point (square mark) in the drawing. The search device 300 repeats the above processing until the result (processing result) of the demonstration experiment satisfies the target, thereby being capable of searching the best solution.

The functional units shown in FIG. 4 of the first embodiment have the following functions in the second embodiment. The identification unit 403 acquires multiple predicted values corresponding to a target value from the predictive model by giving the target value input by the input unit 401 to the predictive model generated by the generating unit 402. Then, the identification unit 403 acquires the measured value of each output when each predicted value is given as the setting value to the semiconductor processing apparatus 201.

When the target value is the value of the output parameter of the semiconductor processing apparatus 201, the identification unit 403 gives the value of the output parameter to the predictive model, thereby identifying the value of the input parameter from the predictive model as the predicted value corresponding to the target value.

Specifically, for example, in FIG. 11, when the target value is the value y12 of the output parameter, the predicted value corresponding to the target value y12 is a value of the input parameters X1 and X2 identified by a contour line of the target value y12 in FIG. 11. Therefore, the identification unit 403 identifies the input parameters X1, X2 ((x11, x21), (x21, x21), (x13, x21), and so on) identified by the contour line of the target value y12 from the search area A.

The determination unit 404 is the same as that in the first embodiment, and determines whether or not the measured value of the processing result corresponding to the predicted value is closer to the target value than the reference value of the processing result input by the input unit 401.

In the case where it is determined by the determination unit 404 that the measured value of the processing result corresponding to the predicted value is closer to the target value than the reference value of the processing result, the setting unit 405 sets the predicted value and the measured value of the processing result corresponding to the predicted value to a reference value of the condition and a reference value of the processing result.

The output unit 406 is the same as that in the first embodiment, and outputs a predicted value that satisfies the achievement condition when the predicted value satisfies the achievement condition of the target value.

When it is determined by the determination unit 404 that the measured value of the processing result corresponding to the predicted value is not closer to the target value than the reference value of the processing result, the determination unit 407 determines the predicted value and the measured value of the processing result corresponding to the predicted value as the exclusion data (to be described later in Step A601 of FIG. 13). The exclusion data is a value of the input parameter that should not be given to the predictive model.

In that case, the setting unit 405 sets data excluding the exclusion data determined by the determination unit 407 as learning data. As a result, the generation unit 402 can use learning data without exclusion data. This makes it possible to improve the search speed of the value of the input parameter which is the solution.

In addition, when the determination unit 404 determines that the measured value of the processing result corresponding to the predicted value is not closer to the target value than the reference value of the processing result, the determination unit 407 may determine a peripheral area of the predicted value as an exclusion area (to be described later in Step A602 of FIG. 13). The exclusion area is an area of the value of the input parameter that should not be output by the predictive model. Further, the acquired data included in the peripheral area of the predicted value may be determined as the exclusion data.

In addition, in that case, the setting unit 405 sets the residual area excluding the exclusion area determined by the determination unit 407 from the search area as the search area. This makes it possible to narrow down the search area by excluding a range of the predicted values that can obtain only the processing result not close to the target value. Therefore, it is possible to improve a search speed of the value of the input parameter which is the solution.

The division unit 408 is similar to that of the first embodiment, and divides the search area into multiple areas.

In addition, as described above, when the determination unit 404 determines that the measured value of the processing result corresponding to the predicted value is not closer to the target value than the reference value of the processing result, the determination unit 407 may determine the predicted value and the measured value of the processing result corresponding to the predicted value as the exclusion data. In that case, similarly to FIG. 9 of the first embodiment, the generation unit 402 may generate the predicted model based on the residual measured value obtained by excluding the exclusion data from the measured value and the residual set value obtained by excluding the set value corresponding to the residual measured value from the set value. As a result, it is possible to improve the search speed of the value of the input parameter which is the solution.

Further, as described above, when the determination unit 407 determines that the target value corresponding to the predicted value is not closer to the target value than the reference value of the processing result, the determination unit 407 determines the peripheral area of the predicted value as the exclusion area. In that case, the generation unit 402 may generate, in the same manner as in FIG. 6 of the first embodiment, the predictive model based on the set value of the condition in the residual search area excluding the exclusion area from the search area and the measured value of the output when the set value is given to the semiconductor processing apparatus 201. As a result, it is possible to improve the search speed of the value of the input parameter which is the solution.

The detection unit 409 is similar to that of the first embodiment, and detects an unstable operation of the semiconductor processing apparatus 201 based on the output of the semiconductor processing apparatus 201 and a predetermined output threshold value.

<Example of Control Processing Procedure of Semiconductor Processing Apparatus 201>

Figure 12:
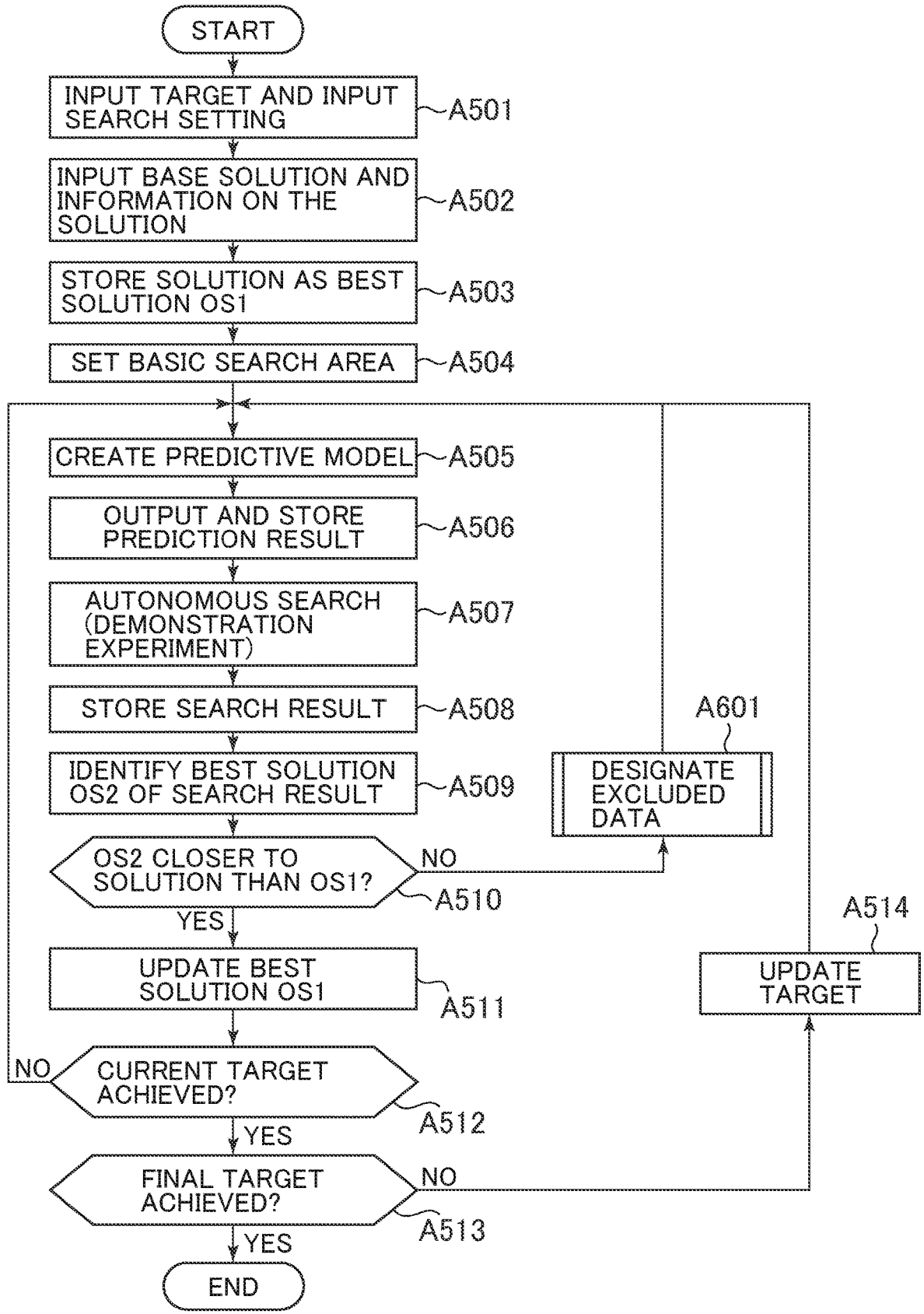
FIG. 12 is a flowchart showing a control processing procedure example of a semiconductor processing apparatus according to the second embodiment of the present invention.

FIG. 12 is a flowchart showing an example of a control processing procedure of the semiconductor processing apparatus 201 according to the second embodiment. Steps A501 to A504 in the figure are the same as Steps S501 to S504 of FIG. 5 of the first embodiment. The search device 300 accepts the input of an output value (a target value of the output parameter) and a search setting from the target semiconductor processing apparatus 201 (Step A501).

Next, the search device 300 accepts the input of a solution as a base and the input of information on the solution (Step A502).

Next, the search device 300 stores the best solution input in Step A502 as the best solution OS1 (Step A503). If there is no solution, a symbol or a value indicative of being farthest from the solution is set.

Next, the search device 300 sets the basic search area as a search area (Step A504).

For example, in FIG. 11, when two input parameters X1 and X2 are selected as the type of the input parameters, if the control range of the input parameter X1 is set to [x11, x1n], and the control range of the input parameter X2 is set to [x21, x2n], the search area is an area A in the entire range shown in FIG. 11.

The input and setting contents of the target setting controller 261 in Steps A501 to A504 are delivered to the autonomous search system 262 and a semi-automatic search that the engineer instructs automatic search, search execution or continuation availability by a procedure of Steps A505 to A509 to be described next is executed.

The search device 300 generates the predictive model for predicting the solution (input parameter) that satisfies the target (target output) (Step A505). Specifically, for example, the search device 300 generates a function indicating the relationship between the input and output data of the semiconductor processing apparatus 201 as the predictive model with the use of the data (for example, initial data) stored in the database 205 in Step A505. The input and output data is a combination of the value (input data) of the input parameter given to the semiconductor processing apparatus 201 and the value (output data) of the output parameter obtained from the semiconductor processing apparatus 201. As a method for analyzing the relationship between the input and output data, as in the first embodiment, a regression analysis that can handle multiple inputs and multiple outputs such as a neural network, a support vector regression, a regression using a kernel method, and so on can be used. A statistical analysis such as a correlation analysis, a principal component analysis, a multiple regression analysis, and so on can be used.

In generating the predictive model, for example, the sensor data and the monitor data for acquiring indirect measured values for the processing result of the semiconductor processing apparatus 201 are used as the output data. There are some cases where the acquisition frequency of the output data is lower than a frequency specified by the search setting, or longer than an acquisition time specified by the search setting, and the number of output data pieces that can be acquired by search is smaller than the number of output data pieces defined by the search setting. In those cases, it is sufficient to acquire the sensor data and the monitor data from which a larger number of data pieces can be acquired as compared with the number of output data pieces specified in the search setting. As a result, it is possible to analyze a relationship of the sensor data and the monitor data with respect to the output data and a relationship of the input data with respect to the sensor data and the monitor data. Also, with the use of both of those analysis results, a relationship of the input data to the output data can be obtained.

In generating the predictive model, a part of an object to be processed is taken out as a fragment, and the fragment is transferred to the monitor system 203 to acquire the measurement result (processing result), as a result of which, the data stored in the database 205 can also be used as an output result. At that time, when a time required for fragmentation of the object to be processed and data acquisition becomes random or long, an upper limit of the acquisition time of the output data (value of the output parameter) from the semiconductor processing apparatus 201 may be set to sufficiently a long time. Alternatively, the processing can be continued by separately transmitting an acquisition completion signal to the search device 300 without setting the upper limit of the acquisition time of the output data.

In measurement by the monitor system 203, with the use of the above-described position information data and image information data input to the target setting controller 261, a desired output data can be automatically measured according to a desired position to be processed.

Next, with the use of the generated predictive model, the search device 300 predicts a parameter for obtaining a processing result from which a target solution is obtained or which is close to the target solution and stores the predicted parameter as a prediction result (Step A506).

For example, in FIG. 11, when the two input parameters X1 and X2 are selected as the type of input parameters, an output of the prediction result will be described with reference to a case where the initial data (A1 to A9) in FIG. 11 is given as data for creating an analysis model. In addition, the target in this case is to search for the input parameters X1 and X2 where the output parameter y becomes the largest.

With the use of the initial data, the search device 300 generates a regression model for obtaining its input and output relationship as a predictive model. As described above, when the control range of the input parameter X1 is divided into [x11, x1n] and the control range of the input parameter X2 is divided into [x21, x2n], the number of regions of a graph 100 is $n^2$. In the case where X1 and X2 are divided into 16 pieces, the number of regions is $n^2=256$. In FIG. 11, since the number of initial data is 9, about 3.5% of data in the whole area is acquired.

Therefore, since an accurate distribution of Y shown in the graph 100 cannot be known, it is extremely difficult to search, as a prediction result obtained from the predictive model, a combination of X1 and X2 (x15, X210) for obtaining the best solution y1 with one prediction. In addition, as described above, when the input parameter space becomes multidimensional vectorized and becomes vast, the search for the best solution becomes more difficult.

In order to search for the best solution in a single prediction, there is a need to acquire and analyze data covering the whole area in the search space, but, as described above, as the number of parameters increases, the combination of parameters becomes huge, the search for the entire region becomes huge in search time and extremely difficult to implement.

In order to efficiently search the solution while avoiding these problems, (a) an acquisition of model creation data, (b) a creation of a predictive model, (c) an acquisition of prediction result, and (d) a demonstration experiment of the prediction are performed. Further, (a') the demonstration experiment data may be added to the data for model creation to repeat prediction and demonstration. In other words, with the use of the initial data in FIG. 11, the above processes (a) to (d) are performed, and a first predicted data (=demonstration data) in FIG. 11 may be added to the database 205 as the model creation data, the processes (b), (c), and (d) may be repeated, and the processes (a') to (d) may be repeated.

Those processes (a), (b), (c), and (d) correspond to the respective Steps of A502, A505, A506, and A507 in FIG. 12. In addition, the process (a') corresponds to Step S508.

Specifically, for example, the search device 300 acquires the input and output data of the semiconductor processing apparatus 201 under each search condition as a demonstration experiment result, that is, a search result, by autonomous search with the prediction condition as a search condition.

Specifically, for example, the search device 300 selects the value of the input parameter that satisfies the search condition for each divided area, and provides the value of the selected input parameter to the semiconductor processing apparatus 201. Then, the search device 300 acquires the output data (value of the output parameter) from the semiconductor processing apparatus 201. A combination of the value of the input parameter and the value of the output parameter corresponding to the value is a search result.

In addition, in that case, the semiconductor processing apparatus 201 can continue the processing operation at the time of executing the autonomous search, but the unstable operation detection system 263 detects a case where the operation of the semiconductor processing apparatus 201 becomes unstable. When the unstable operation is detected, a sequence for restoring the semiconductor processing apparatus 201 to the steady operation state is executed after completion of the processing, or a sequence for immediately stopping the processing and restoring the semiconductor processing apparatus 201 to the steady operation state is executed, to continue the autonomous search by the target setting controller 261.

The search device 300 stores the search result in the database 205 (Step A508). Specifically, for example, the search device 300 stores the input and output data which is a set of the value of the input parameter used in the autonomous search (Step A507) and the value of the output parameter of the semiconductor processing apparatus 201 acquired with the use of the value of the input parameter in the database 205 as a search result.

If there are one or more points to be predicted at one time in Step A506, the above processes (a) or (a') to (d) can be repeated. However, when the number of prediction points is 1 point, the local solutions predicted from the model are routed one by one until reaching the final optimum solution, and as the local solutions increase, the search becomes prolonged.

Moreover, if a total time of predictive model creation and the output of the prediction results is long relative to a time required for acquiring one point of data in the demonstration experiment, if the number of prediction points is one point, the semiconductor processing apparatus 201 enters a standby state until the prediction result is output. Every time the processes (a') to (d) mentioned above are repeated, a waiting time of the standby state occurs, and the search is prolonged.

Therefore, the multiple prediction data points are obtained, thereby being capable of proceeding with the demonstration experiment during preparation of the predictive model and output of the prediction result, and being capable of enhancing the efficiency of the search.

In addition, when the multiple predicted data points are provided, since the best solution taking a wider search area into consideration is obtained, the search can be advanced with high efficiency while avoiding the local solution which is less likely to become the final best solution.

Since the data acquired in Steps A507 and A508 are new data that has not yet been acquired, this data is provided to an engineer, thereby being capable of supporting the analysis and the grasp of the result performed by the engineer.

For that reason, when there is an update speed of data requested by the engineer, that is, a time width in which data is to be updated, it is desirable to set the search time in Step A507 according to the time width. The time to update the data requested by the engineer is, for example, 24 hours, 8 hours, 1 hour, 30 minutes, and so on.

Therefore, the output number of the prediction result in Step A506, that is, the number of prediction data pieces can be increased in accordance with a data update request time of the engineer. For example, if the engineer requests data update every hour, and it takes ten minutes for one search, it is desirable to set the number of predicted data points to 6 accordingly.

As a result, it is possible to efficiently carry out the search and the analysis of the engineer in FIG. 12 can be advanced with high efficiency. In the preparation of the predictive model in Step A505, a predictive model dependent on a regression method using an analysis method adopted in predictive model generation, for example, a neural network, a support vector regression, and a kernel method is created. The various analysis models have a strong point and a weak point for each model with respect to the type of the input and output data, the distribution characteristic of those pieces of data, and the number of data pieces, and increase or decrease the prediction accuracy. For that reason, when a single prediction engine is used, the prediction engine may be inappropriate for the input and output data acquired by the prediction engine, and the search time is prolonged. Therefore, the multiple predicted data pieces are obtained with the use of multiple kinds of predictive models (prediction engines), thereby being capable of increasing the possibility of being able to output a more excellent prediction result while coping with various input and output data.

When the demonstration experiment data corresponding to the data output as the prediction result has already been acquired, the efficiency of the search can be improved by not conducting the demonstration experiment of the data.

Next, the best solution OS2 is identified from the acquired data, and the identified best solution OS2 is stored in the database 205 (Step A509).

The processes of Steps A505 to A509 have two kinds of method. One method is a method of giving a target value of the output parameter given in Step S501 to the predictive model (first estimation method).

Specifically, in the first estimation method, for example, the search device 300 assigns the target value of the output parameter given in Step A501 to the predictive model obtained in Step A505, thereby estimating the input data (the data of the input parameters) that is a solution which satisfies the target value of the output parameter.

In Step A507, the search device 300 performs a demonstration experiment of the predicted input data and stores the resultantly obtained output data in the database 205 in Step A508.

In Step A509, the search device 300 identifies the input parameter from which the output data equal to the target value can be acquired from the acquired output data, the input parameter from which the output data whose difference or divergence from the target value is smaller than the allowable value (allowable value given in S501) an be acquired, or the input parameter from which the output data closest to the target value can be acquired, and determines one of those input parameters which is closest to the target value as the best solution OS2.

In the first estimation method, a predictive model that can uniquely obtain the input parameter from which the target value of the output parameter can be obtained is used. In that case, the prediction result is one data.

In order to increase the number of prediction points, an upper limit value, a lower limit value, an intermediate value between the target value and the upper limit value, a value obtained by equally dividing between the target value and the upper limit value, an intermediate value between the target value and the lower limit value, and a value obtained by equally dividing between the target value and the lower limit value in an allowable range of the target value of the output parameter may be given to the predictive model. In addition, as described above, with the use of the multiple predictive models, the number of prediction points can be increased.

In the case of the above example, in the case where the predictive model is created with the use of the initial data in FIG. 11, y1 is given as the target value to the predictive model, prediction is performed, and the output data acquired in the demonstration experiment is the same as that in the predictive model shown in FIG. 11, when (x1.6, x211 (data (I) in FIG. 111) is acquired as the output data of the first prediction point, the input parameter (x16, x211) from which y5, which is best among the output data acquired up to then, is obtained is the best solution OS2.

Another process from Step A505 to Step A509 is a method in which the substitution of the target value of the output parameter given in Step A501 into the predictive model can be applied to a case where the input parameter which is a solution satisfying the target value of the output parameter is not obtained directly (second estimation method).

In the method, a set of a large number of input parameters is given to the predictive model with the input parameters given to the predictive model at once as one set, the estimated output parameter is calculated, and a set of the input parameters from which a processing result closest to the target output is obtained is acquired. After creating the predictive model, for example, as shown in FIG. 11, a search area of the graph 100 is divided into A1 to A9 and the like, and one or more sets of input parameters included in each divided area are created for each divided area, the sets of the input parameters are given to the predictive model, thereby being capable of calculating the output parameter at that time. As a method of obtaining a representative estimated output for each divided region, as a set of input parameters included in the divided area, a value that is center coordinates in the divided area can be used.

In the case of calculating the estimated output by giving the set of an extremely large number of input parameters to the predictive model, when the calculation time becomes enormous, as described with reference to Expressions (1.1) to (1.3), the calculation time can be reduced by determining the center condition of the input parameter given to the predictive model and limiting the types of input parameters that can be changed from the center condition. Also, the number of parameters that can be changed at once from the center condition is limited, thereby being capable of reducing the calculation time. This makes it possible to obtain the input parameter that can obtain a processing result closer to a target output while reducing the number of sets of input parameters given to the predictive model. When setting the center condition, past search results or engineer's knowledge can be used. Alternatively, the center coordinates of the entire search area can be set as the center condition.

In the second estimation method, specifically, the search device 300 obtains the value of the output parameter to be the prediction value by substituting the value of the set of the input parameters into the predictive model obtained in Step A506. For example, a predictive model is created with the use of the initial data of FIG. 11, and as the values of the input parameters to the predictive model, (x11, x21), (x11, x22), (x11, x23), (x12, x21), (x12, x22), (x12, x23), (x13, x21), (x13, x22), (x13, x23), (x1n, x21), (x1n, x22) and (x1n, x23) are given, thereby being capable of obtaining the estimated output parameter corresponding to each input parameter.

Among those estimated output parameters, the search device 300 identifies the input parameter that can acquire the output data in which the difference or divergence between the estimated output data and the target value is smaller than the allowable value (allowable value given in S501), or the input parameter that can acquire the estimated output data closest to the target value, and stores the estimated output data and the input parameter as the prediction result.

The first prediction point in FIG. 11 is an example of a prediction result when the predictive model is created using the initial data and y6 or more are set as the allowable values with the target value as y1 and y6 or more. In this example, because prediction is performed from a very small number of initial data, each point predicted to have a value of y6 or more is different from the actual output value shown in FIG. 11.

Next, the actual data of the first prediction point is acquired. The predictive model is updated with the use of the initial data and the output data of the first prediction point. An example of the prediction result by the updated predictive model is a second prediction point in FIG. 11. The best solution included in the output data of the first prediction result is (x16, x211) where the output y5 is obtained. On the other hand, with the addition of the demonstration experimental data (output data) of the first prediction and the prediction point to the initial data, (x14, x210 (data (II) of FIG. 11)) which is the output result closer to the target y1 is obtained in the demonstration experimental data of the second prediction and the prediction point.

By repeating the above process, the input parameter which satisfies the output y1 which is the target value can be obtained. Also, the number of data required to obtain the target result is reduced, thereby being capable of performing the efficient search.

Then, in Step A509, the search device 300 determines the value of the input parameter from which the value of the output parameter closest to the target value of the output parameter is obtained as the best solution OS2, for example. It should be noted that which one of the first estimation method and the second estimation method is to be applied is preset.

The search device 300 determines whether or not the value of the best solution OS2 is a solution that can obtain an output parameter closer to the target than the value of the best solution OS1 (Step A510). If the value of the best solution OS2 is a solution that can obtain the output parameter closer to the target than the value of the best solution OS1 (Yes in Step A510), the process proceeds to Step A511, and if not (No in Step A510), the process proceeds to Step S601 (FIG. 13).

In the case of Yes in Step A510, the search device 300 updates the best solution OS1 by setting the best solution OS2 to the best solution OS1 (Step A511).

Thereafter, the search device 300 determines whether or not the current target has been achieved (Step A510). When the current target has been achieved (Yes in Step A512), the search device 300 proceeds to Step S513 to determine whether or not the final target has been achieved. On the other hand, when the current target has not been achieved (No in Step A512), the process proceeds to Step A505.

Thereafter, the search device 300 determines whether or not the final target has been achieved (Step A513). When the final target has been achieved (Yes in Step A513), the search device 300 completes the control process. On the other hand, when the target has not been achieved (No in Step A513), the process proceeds to Step A514 to update the target.

Specifically, in Step A512, for example, when the output parameter corresponding to the updated best solution OS1 is equal to the current target value or a difference from the current target value is within the allowable range, the search device 300 determines that the current target has been achieved (Yes in Step A512). Even if the output parameter corresponding to the updated best solution OS1 is equal to the current target value or the difference from the current target value is not within the allowable range, if the search time set in Step A501 elapses, the search device 300 determines that the target has been achieved (Yes in Step A512). On the other hand, if the output parameter corresponding to the updated best solution OS1 is equal to the current target value or the difference from the current target value is not within the allowable range, and the search time set in Step A501 does not elapse, the search device 300 determines that the target has not been achieved (No in Step A512).

Specifically, in Step A513, for example, when the output parameter corresponding to the updated best solution OS1 is equal to the final target value or the difference between the final target value is within the allowable range, the search device 300 determines that the final target has been achieved (Yes in Step A513). In addition, if the output parameter corresponding to the updated best solution OS1 is equal to the final target value, or if the search time set in Step A501 elapses even if the difference from the final target value is not within the allowable range, the search device 300 determines that the target has been achieved (Yes in Step A513). On the other hand, when the output parameter corresponding to the updated best solution OS1 is equal to the final target value, or the difference from the final target value is not within the allowable range and the search time set in Step A501 has not elapsed, the search device 300 determines that the target has not been achieved (No in Step A513).

In Step A514, the target value, the difference between the search result and the target value, or the allowable value of the divergence is updated. In proceeding with the process from A505 to A512, when the final target is given from the beginning, or when a very small value is given as a difference between the search result and the target value, or the allowable value of divergence, a difficulty level of the more preferable best solution OS2 rises, resulting in a possibility that the solution cannot be found. In order to avoid the above drawback, in an initial stage of the search, another target different from the final target can be given as the current target. When the current target has been achieved and the final target has not been satisfied (No in Step A513), the target value is gradually brought closer to the final target value in Step A514. As a result, the possibility of finding out the solution that achieves the final target can be increased.

Further, when a large value is given as the difference between the search result and the target value or the allowable value of the divergence, the current target has been achieved and the final target is not satisfied (No in Step A513), the target value is gradually brought closer to the final target value, thereby being capable of increasing the possibility that the solution that achieves the final target can be found out.

As a method of gradually updating from the initial target to the final target, multiple target values having values between the initial target and the final target are prepared, the initial target may be given as the first current target, the target value approaching the final target may be updated as the current target value every time the current target is achieved. Alternatively, the initial target is given as the first current target, the multiple target values can be prepared so as to gradually approach the final target at a fixed rate, and used.

It is to be noted that, although the case where the initial data has already been acquired has been described in the above data, when there is no initial data, the initial data can be acquired with the use of the area division method of the first embodiment. Alternatively, conditions for initial data acquisition can be determined and initial data can be acquired with the use of an experimental design method. That is, the area division method is a processing method of Steps S501 to S507 in FIG. 5 showing the first embodiment with the inclusion of Steps of setting the basic search area, dividing the search area, and performing autonomous search for each divided area.

Figure 13:
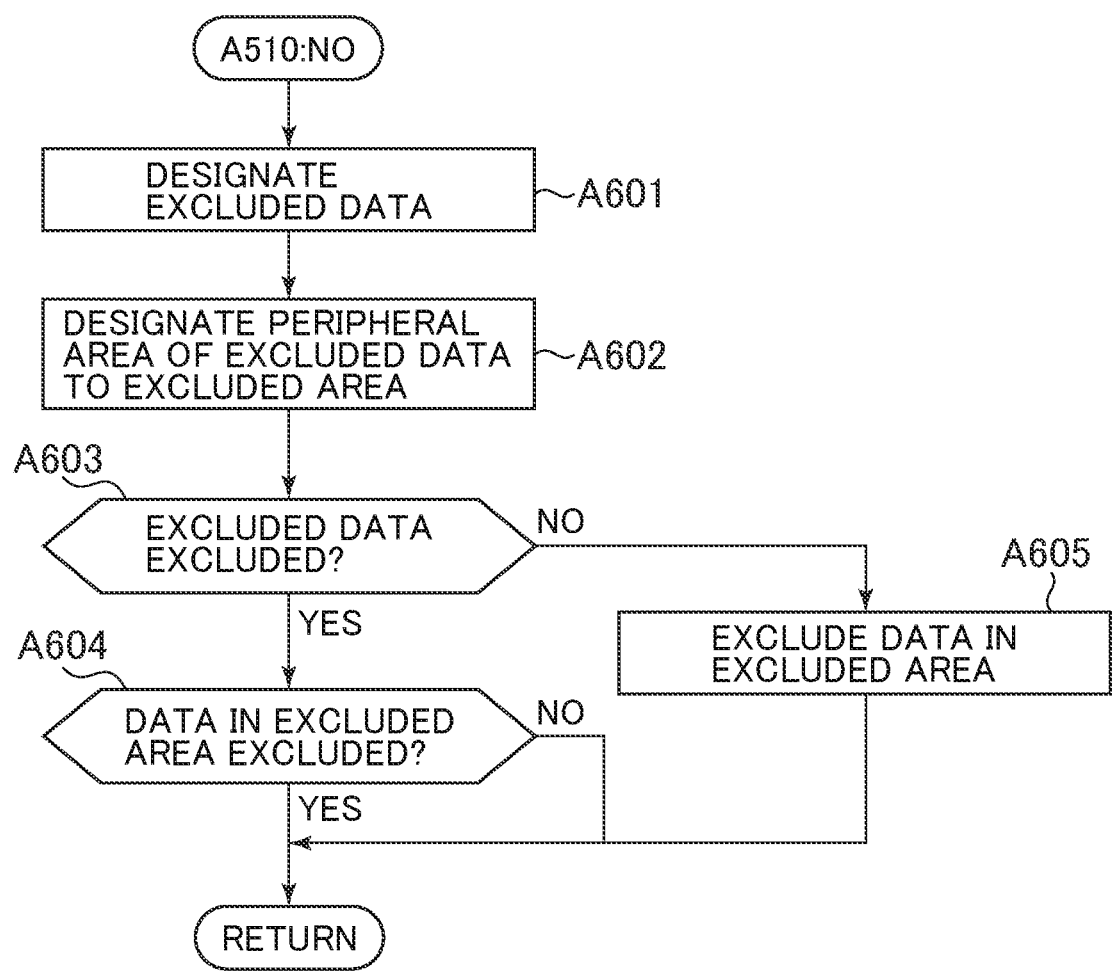
FIG. 13 is a flowchart showing the control processing procedure example of the semiconductor processing apparatus according to the second embodiment of the present invention.

FIG. 13 is a flowchart showing an example of a control processing procedure of the semiconductor processing apparatus 201. When the determination result of Step A510 in FIG. 12 is No, the search device 300 proceeds to A601 in FIG. 13. In Step A601, in the data obtained up to Step A505, the best solution OS1 or data obtained until the best solution OS1 is updated is determined as the exclusion data.

More specifically, the update of the best solution OS1 means, for example, that the OS1 at the time of obtaining the first prediction data point in FIG. 11 is set as the new best solution OS1 by acquiring the data of the second prediction data point. In this example, the data obtained until the best solution OS1 is updated is the second predicted data point, and in Step A601, the data is determined as exclusion data.

In the following description, a case where the best solution OS1 is an object of exclusion data will be described. Specifically, in Step A601, for example, the search device 300 determines the input data (value of the input parameter) and the output data (output parameter) of the best solution OS1 as the exclusion data. The exclusion data is data that may be excluded in future processing.

Next, the search device 300 determines a peripheral area of the exclusion data determined in Step A601 as the exclusion area (Step A602). The exclusion area may be excluded in future processing.

Hereinafter, similarly to the description in Step A601, a case where the best solution OS1 is an object of the exclusion data will be described.

As a method of determining the peripheral region of the exclusion data, a value obtained by changing a predetermined ratio from each parameter of the best solution OS1 can be used. In other words, for example, if a rate of change is set to 1%, each parameter ±1% of the best solution OS1 is set, and if ±5% is set, each parameter ±5% of the best solution OS1 may be set. Further, this ratio may be set for each parameter of the best solution OS1. As a method of setting the ratio, a ratio to the range of values which can be applied by each parameter can be used. In other words, when the parameter A of the best solution OS1 can range from 0 to 200, the change ratio is set as 3%, and the value of the parameter A of the best solution OS1 is 150, 150±6 is an exclusion area of the parameter of the best solution OS1.

After Step A602, the search device 300 determines whether or not to exclude the exclusion data determined in Step A601 (Step 603). When excluded (Yes in Step A603), the process proceeds to Step A604, and when not excluded (No in Step A603), the process proceeds to Step A605.

In Step A603, specifically, for example, the search device 300 determines whether or not to exclude the exclusion data based on the presence or absence of an exclusion instruction input from the user. In addition, the search device 300 may forcibly exclude the exclusion data (Yes in Step A603).

After Step A603, the search device 300 determines whether or not to exclude the data in the exclusion area determined in Step A602 (Step A604). After determination of whether the data is excluded (Yes in Step A604) or the data is not excluded (NO in Step A604), the process proceeds to Step S505.

Specifically, in Step A604, for example, the search device 300 determines whether or not to exclude data in the exclusion area, depending on whether or not an exclusion instruction is input from the user. Further, the search device 300 may forcibly exclude data in the exclusion area (Yes in Step A604).

When the solution in the exclusion area is excluded from the solution and not analyzed (No in Step A603) in Step A603, the search device 300 proceeds to Step A605, and after the data in the exclusion area has been excluded in Step A605, the process proceeds to Step A505.

In addition, in Step A601, the method of designating the exclusion data and the exclusion area using the area division method of FIG. 6, FIG. 7, and FIG. 8 of the first embodiment can be used. In "A", "B", "C", and "D" in the flowcharts of FIGS. 5 to 8 of the first embodiment are "A" corresponds to No in Step A601, "B" and "C" correspond to Step A604 and Step A605 to Step A505, "D" corresponds to each flow of Step A511 to Step A512.

In the present control process, if the scale of data analysis, storage, transfer, and so on becomes large and the execution time becomes longer than the time to search for one condition, the search can be continued in parallel with those execution. In this situation, one or more of the number of input parameters to be changed in the search condition, the number of input parameters to be changed at the same time, and the number of divisions of the search area are increased. As a result, the number of search conditions is increased and this condition is searched, thereby being capable of increasing the search result with the use of the time for performing analysis or the like. In particular, a time required to analyze the data may be several minutes to several hours or more, and the search is continued during the analysis, thereby being capable of improving the search speed.

Application Example 1B of Control Process of Semiconductor Processing Apparatus 201

Next, an application example of the control process for correcting the device difference of the semiconductor processing apparatus 201 in the maintenance of the semiconductor processing apparatus 201 before mass production of the semiconductor device will be described. In this example, as an example for describing a procedure of reducing a difference in devices, the semiconductor processing apparatus 201 is an etching device that performs a discharge process. In addition, in this example, the input parameter at the time of executing the discharge process is referred to as a recipe. In the etching device performing the discharge process, as the output to be corrected, the processing result or the discharge characteristic used for the process can be mentioned. As a correction method, there is a method of correcting other etching device so as to obtain the same output as that of the reference etching device, or a method of performing a correction so that the outputs of multiple etching devices become uniform.

The device difference reduction method is the same as in FIG. 9 of the first embodiment, and the search device 300 starts obtaining discharge data after maintenance.

First, the search device 300 performs a reference recipe discharge using a recipe for performing a basic discharging process, and acquires the input and output data at that time. In addition, discharging is performed by a recipe used for mass production, and output data (value of the output parameter) at that time is obtained (Step S901 in FIG. 9). Step S901 is a process corresponding to Steps A501 to A504.

In the reference recipe discharge, a recipe can be set with the use of the area division method in the same way as in FIG. 9 of the first embodiment, and input and output data at that time can be acquired. Alternatively, a recipe can be set with the use of the experiment design method, and input and output data at that time can be acquired.

Next, the search device 300 predicts a device difference correction recipe candidate (Step S902 in FIG. 9). Step S902 is a process corresponding to Steps A505 to A506 of the second embodiment.

Then, the search device 300 executes a device difference correction that also serves as a demonstration experiment with the use of the device difference correction recipe predicted in Step S902 (Step S903 in FIG. 9). Step S903 is a process corresponding to the processes of Steps A507 to A511 and FIG. 13. When the correction target has not been achieved (No in Step S904), the process returns to Step S902 and when the correction target has been achieved (Yes in Step S904), the processing is completed. Step S904 is a process corresponding to A512 and A513.

The search speed may be improved by proceeding the search in parallel with the use of multiple identical etching devices. In that case, with the use of the multiple etching devices whose device difference has been corrected by the procedure of FIG. 9, the possibility that a solution satisfying the target can be searched can be enhanced. Furthermore, the searched solution can be developed on those multiple devices to perform a correction.

As described above, with the execution of the search method by the search device 300 after maintenance of the semiconductor processing apparatus 201, the value of the output parameter of the semiconductor processing apparatus 201 can be brought closer to the value of the output parameter serving as a reference (automatic device difference correction function).

Application Example 2B of Control Process of Semiconductor Processing Apparatus 201

Next, in the mass production process of the semiconductor device, a control process for correcting the change over time is the same as in FIG. 10 of the first embodiment.

In the second embodiment, as in FIG. 9 of the first embodiment, as an example for describing a procedure for correcting a change over time, the semiconductor processing apparatus 201 is configured by an etching device that uses discharge for processing. In the pre-mass production discharge data acquisition, in order to correct the temporal change during mass production, the search device 300 first gives a reference recipe for performing a basic discharging process to the etching device to perform a reference recipe discharge, and acquires the output data (value of the output parameter) at that time (Step S1011). Step S1011 is a process corresponding to the Steps A501 to A504.

In the reference recipe discharge, the recipe can be set with the use of the area division method of the first embodiment, and the input and output data at that time can be acquired. Alternatively, a recipe can be set with the use of the experiment design method, and the input and output data at that time can be acquired.

Next, the search device 300 predicts the device difference correction candidate recipe (Step S1012). In Step S1012, the output data, the sensor data, and the monitor data that can predict a temporal change of the correction target from the analysis result of the input and output data at past mass production are used. Then, the search device 300 executes the prediction of the device difference correction candidate recipe for varying data that can predict the temporal change up to a value after the temporal change in the etching device before the start of mass production. Step S1012 is a process corresponding to Steps A505 to A506.

Next, the search device 300 executes the device difference correction serving also as the demonstration experiment with the use of the device difference correction recipe predicted in Step S1012 (Step S1013).

In Step S1013, the search device 300 compares the basic mass production recipe used in a state in which the temporal change does not occur with the device difference correction candidate recipe searched in Step S1012, and clarifies the input parameter changed by the device difference correction candidate recipe. This makes it possible to generate a function that describes the relationship between the input parameter to be corrected and the output parameter at a stage before mass production, and can generate a recipe to be a correction candidate from the relationship. Step S1013 is a process corresponding to the process of Steps A507 to A511 and FIG. 13. Thereafter, the mass production process is started.

After Step S1013, when the mass production process of the semiconductor device is started, a wafer is introduced into a processing chamber (Step S1021), and the etching device etches the wafer Step S1022). Etching (Step S1022) is performed by one Step or multiple Steps. In the case where the etching (Step S1022) is performed by multiple steps, the etching of each step is executed by changing discharge conditions. After completion of etching (Step S1022), the wafer is carried out of the processing chamber (Step S1023). In order to remove reactive organisms generated during etching and deposited on a surface of a processing chamber, plasma cleaning is performed (Step S1024). If there is the next wafer (Yes in Step S1025), the process returns to Step S1021, and if there is no next wafer (No in Step S1025), the process proceeds to acquisition of discharge data after mass production.

The input and output data of the etching device under mass production is stored in the database 205, and the search device 300 continues analyzing the input and output data in parallel in real time. As a result, it is possible to continue estimation of the output data or the sensor data and the monitor data that can predict changes over time in the correction target during mass production. Further, the search device 300 can increase the number of data pieces by aggregating the input and output data of the multiple etching devices that perform the same production process.

When the discharge data is acquired after the mass production or when the designated time has elapsed from the start of mass production, the search device 300 predicts a recipe candidate for correcting the change over time (Step S1031). Specifically, for example, the search device 300 uses the data acquired in Steps S1011 and S1012, the relationship between the analyzed input and output data and the correction candidate recipe as inputs in Step A502, and predicts a candidate for the temporal change correction recipe Predict. Step S1031 is a process corresponding to Steps A505 to A506.

Then, the search device 300 executes the correction that also serves as a demonstration experiment, that is, verifies the correction result with the use of the temporal correction recipe predicted in Step 1031 (Step S1032). Step S1032 is a process corresponds to the processes of Steps A507 to A511 and FIG. 13.

Prior to the execution of Steps S1031 and S1032, the search device 300 may analyze the output data acquired during mass production of the semiconductor device, estimate the output data, the sensor data, and the monitor data that can predict change over time of the correction object, and execute Step S1012. This makes it possible to generate a function that describes the relationship between the input parameter to be corrected and the output parameter, and generate a recipe to be a correction candidate from the relationship. With the use of those results in Step S502, the search device 300 can execute Steps S1031 and S1032.

Further, as the input of Step A502 in the above process, a recipe in which the input parameter frequently used for correction is changed with the use of engineer's knowledge, and the input and output data obtained when the discharge is performed with the use of the recipe and the analysis result may be used.

Then, when the correction target has not been achieved (No in Step S1033), the process returns to Step S1031, and when the correction target has been achieved (Yes in Step S1033), the process is terminated. Step S1033 is a process corresponding to Steps A512 and A513. When executing the search shown in FIG. 10, the search speed can be improved by advancing the search in parallel with the use of the multiple mass-produced etching devices having executed the same mass production process. Further, the searched solution (input parameter) can be developed on the multiple etching devices that execute the same mass production process to execute a correction.

As described above, with the execution of the search method by the search device 300 after mass production of semiconductors, thereby being capable of correcting changes over time in the values of the output parameters of the mass-produced semiconductor processing apparatus 201 (automatic temporal change correction function).

Application Example 3 of Control Process of Semiconductor Processing Apparatus 201

Next, an application example of a control process for optimizing a processed shape in processing of a semiconductor device will be described.

Figure 14:
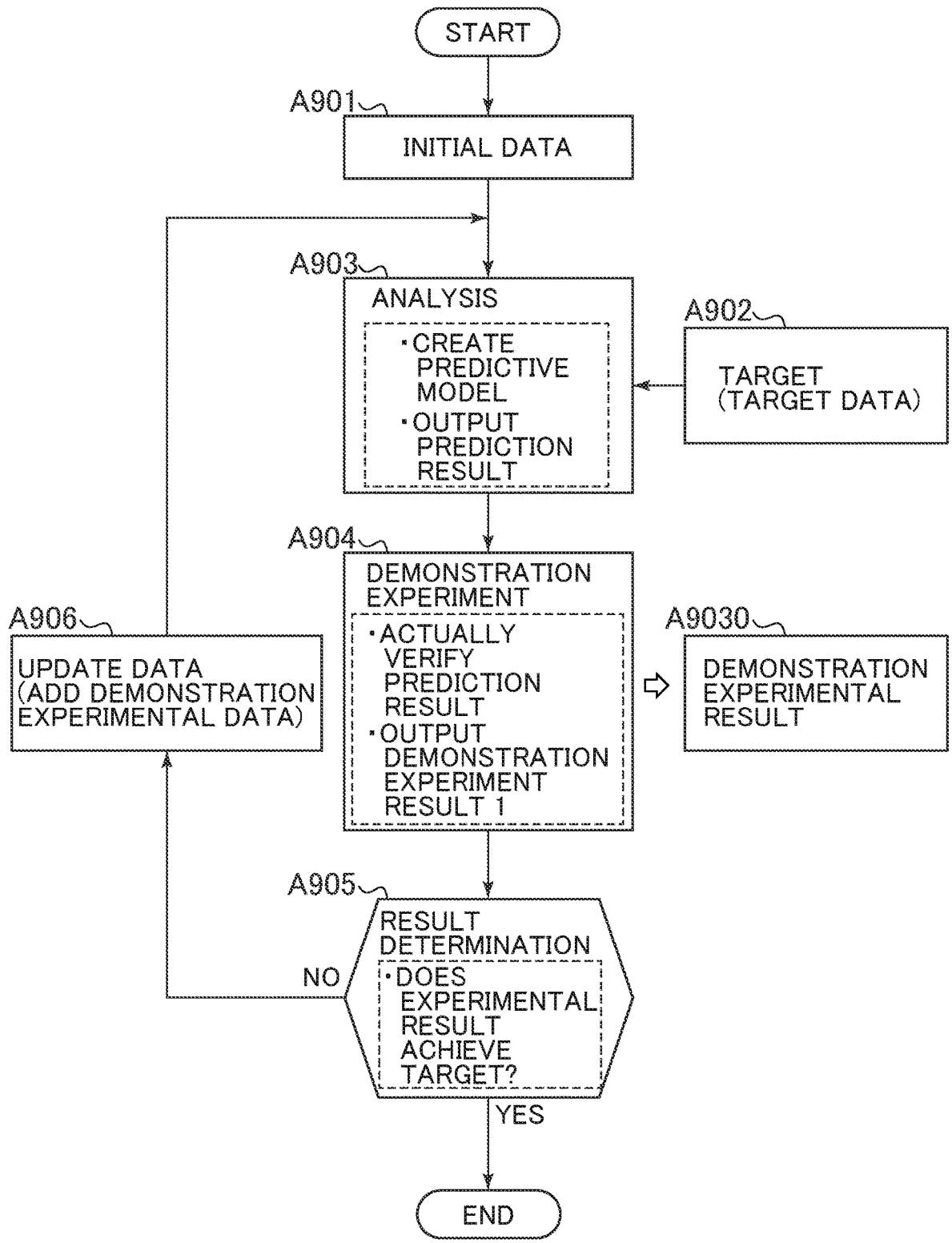
FIG. 14 is a flowchart showing a method for optimizing a processed shape according to the second embodiment of the present invention.

FIG. 14 is a flowchart showing an overview of a method for optimizing a processed shape. In FIG. 14, as in FIG. 10, an example of the semiconductor processing apparatus 201 is an etching device that uses discharge for processing.

Further, as an example of input and output data in the optimization of the processed shape, the input data of the device as the recipe and the output data as processed shape data will be described.

First, the search device 300 performs etching with the use of a basic recipe that can etch a film to be processed, and acquires the input and output data at that time as initial data (Step A901). Step A901 is a process corresponding to Steps A501 to A504 shown in FIG. 12.

In the initial data acquisition described above, a recipe is set with the use of the same area division method as in the first embodiment, and input and output data obtained by etching with the use of the recipe can be acquired. Alternatively, a recipe may be set with the use of an experimental design method, and input and output data obtained by etching with the use of the recipe may be acquired.

Next, a target processed shape is given to the search device 300 (Step A902). Then, the search device 300 predicts a candidate of the processed shape optimization recipe (Step A903).

Step A902 is a process corresponding to Step A502, and Step A903 is a process corresponding to Steps A505 to A506.

Then, the search device 300 executes the demonstration experiment with the use of the processed shape optimization recipe predicted in Step A903, and outputs the demonstration experiment result A9030 (Step A904). Thereafter, the search device 300 determines whether or not the demonstration experiment result satisfies the target value (Step A905).

Steps A904 and A905 are processes corresponding to the processes in Steps A507 to A511 and FIG. 13. When the target has not been achieved (No in Step A905), the data acquired in the demonstration experiment (demonstration experiment result A9030) is added to the database to update the data (Step A906) and the process returns to Step A903.

When the correction target has been achieved (Yes in Step A905), the process is terminated. Step A905 is a process corresponding to Steps A512 and A513.

Figure 15:
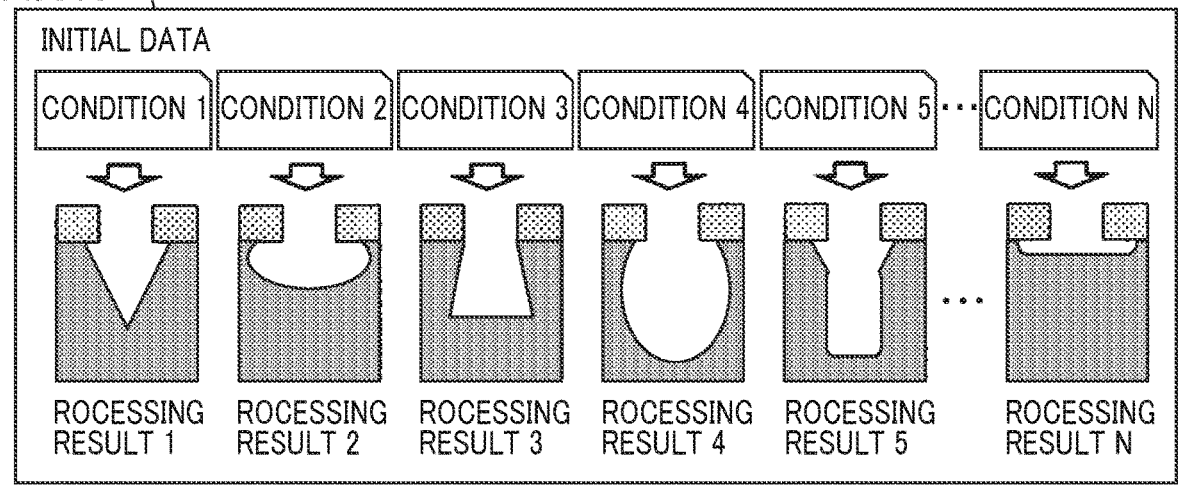
FIG. 15 is an illustrative diagram showing an example of initial data according to the second embodiment of the present invention.

The initial data used in Step A901 can receive a plurality of recipes shown in FIG. 15 and processed shape data when etching is performed with the use of each recipe. With the use of the initial data including various etching shapes, when predicting the solution with the use of the predictive model, it is efficiently predicted in which area in a recipe parameter space the recipe parameter for realizing the target shape is present.

In the initial data A9010, as shown in FIG. 15, a tapered shape (condition 1), a round shape (conditions 2 and 4), a reverse taper shape (condition 3), and an undercut shape (conditions 1, 2, 4, 5, N) are indicated, and other shapes include an etch stop shape in which no etching progresses, a bowing shape (bow shape), a shape in which a mask is etched, and the like. For example, if there is only one type of shape in the initial data, it is difficult to predict a solution that satisfies other shapes in the prediction model obtained from that data. For that reason, it is desirable that at least two or more, preferably three or more of those shapes are included in the initial data.

FIG. 15 is a diagram showing an example of the initial data A 9010. The initial data A9010 is configured by a pair of processing results 1 to N corresponding to the conditions 1 to N, and the processing results 1 to N are examples of the cross-sectional shape of the processing target.

Figure 16:
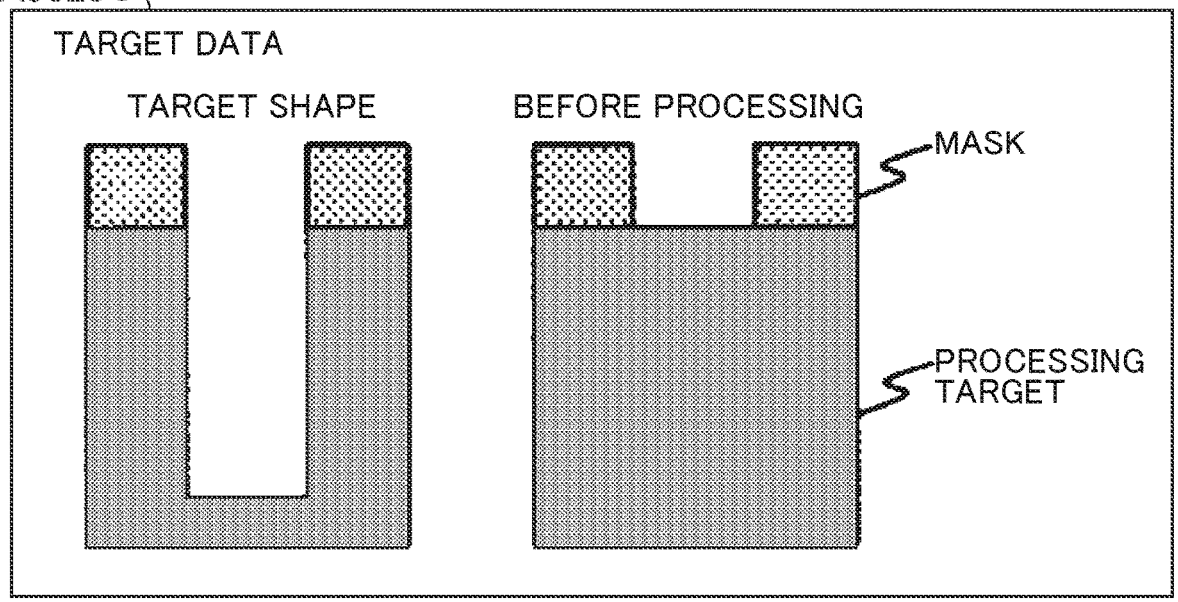
FIG. 16 is an illustrative diagram showing an example of target data according to the second embodiment of the present invention.

As the target data used in Step A902, for example, a vertical processed shape such as target data A9020 shown in FIG. 16 is given. FIG. 16 is a diagram showing an example of the target data A9020. The target data A9020 shows an example of a cross-sectional shape of a processing object before processing and a target cross-sectional shape.

Figure 17:
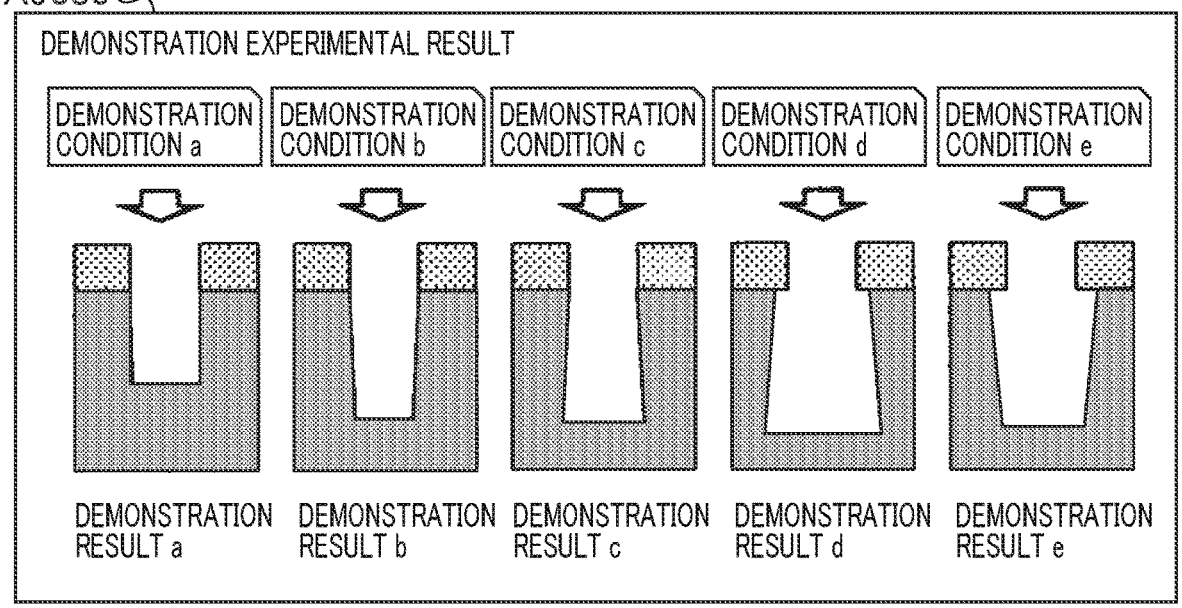
FIG. 17 is an illustrative diagram showing a demonstration experiment result example according to the second embodiment of the present invention.

An example of the demonstration experiment result of Step A903 is shown in the demonstration experiment result A9030 shown in FIG. 17. In this case, an output (processed shape) approaching the target shape is obtained rather than the shape included in the initial data, which corresponds to Yes in Step A510. The demonstration experiment result A9030 is configured by pairs of demonstration results a to e corresponding to the demonstration conditions a to e, and the demonstration results a to e show examples of the cross-sectional shape of the object to be processed.

The search speed may be improved by advancing the search in parallel with the use of the multiple identical etching devices. In that case, with the use of the multiple etching devices whose device difference has been corrected by the same procedure as that in FIG. 10 of the first embodiment, the possibility that a solution satisfying the target can be searched can be enhanced. Furthermore, it is possible to search for a recipe that can find an optimal processed shape by expanding the searched solution to those plural devices.

Figure 18:
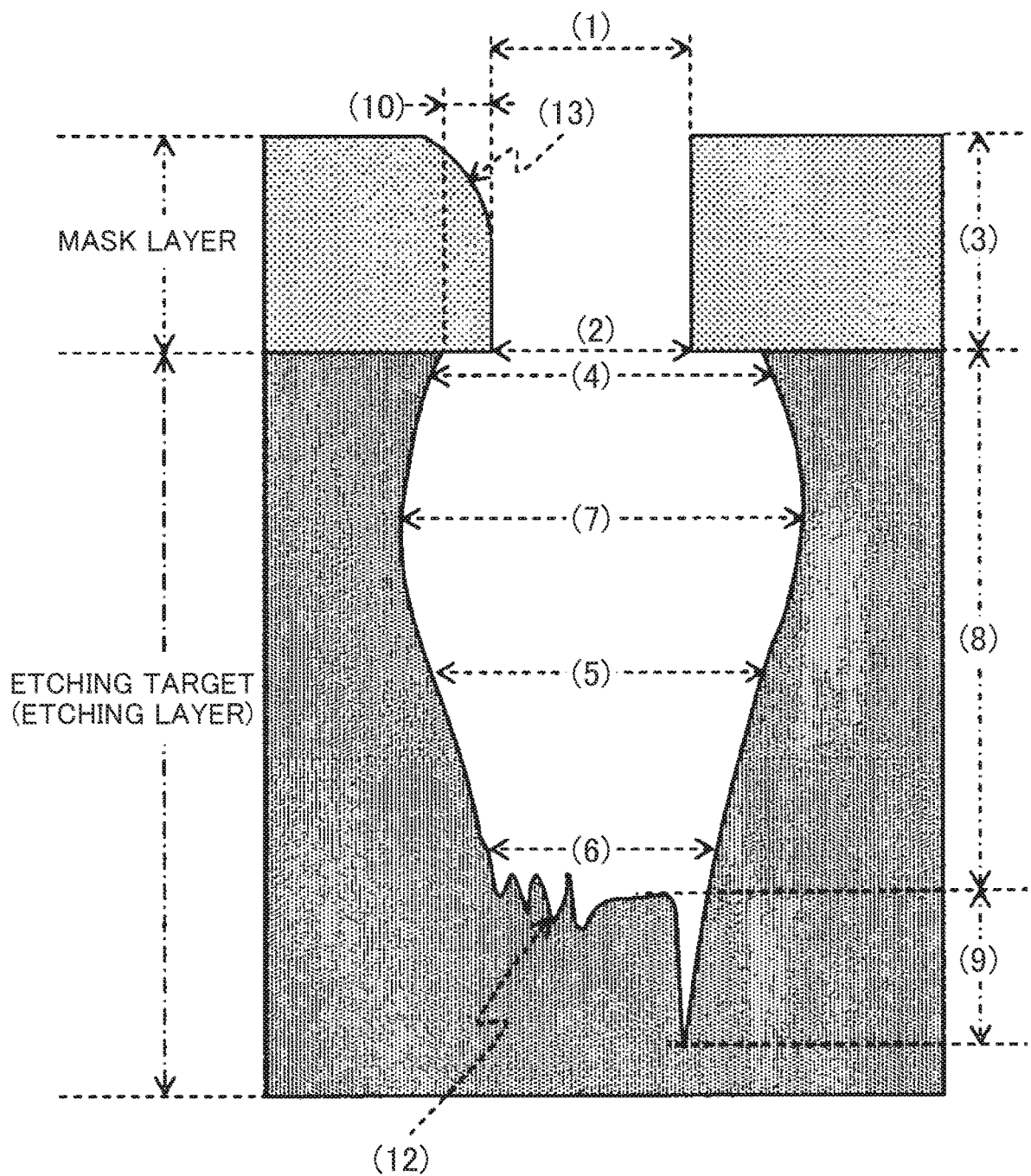
FIG. 18 is a cross-sectional view showing an example of a processed shape according to the second embodiment of the present invention.
Figure 19:
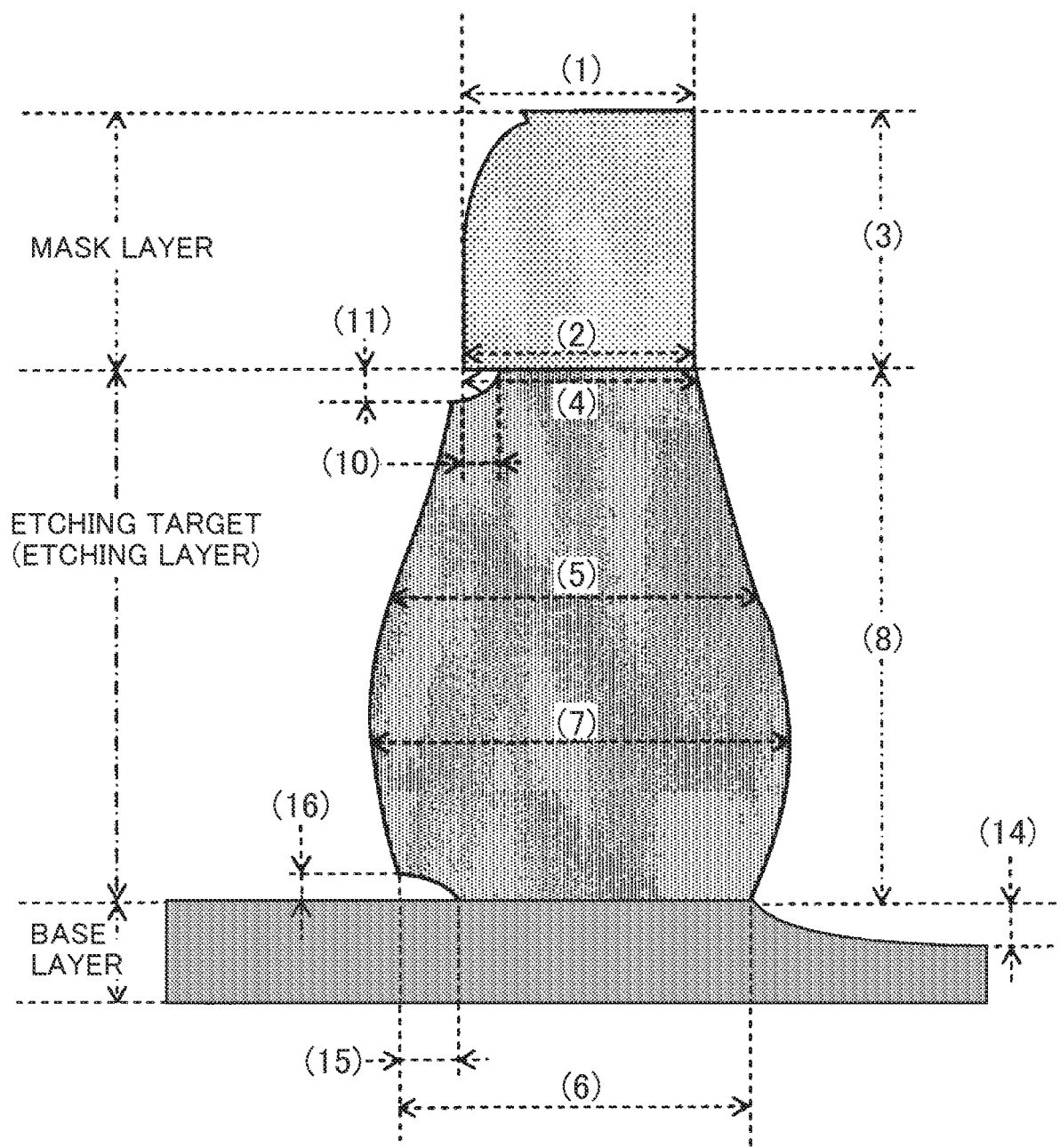
FIG. 19 is a cross-sectional view showing an example of the processed shape according to the second embodiment of the present invention.

FIGS. 18 and 19 show examples of a processed sectional shape acquired with the use of an electron microscope, FIG. 18 shows a groove or hole processing, and FIG. 19 shows a sectional shape in a line or pillar (columnar) processing. As the initial data, an image per se of the cross section can be used. Also, as shown in FIGS. 18 and 19, measured values such as (1) a mask top width, (2) a mask bottom width, (3) a mask thickness, (4) a processing part top width, (5) a width of a center portion of the processing part, (6) a width of a processing bottom, (7) a maximum width of the processing part, (8) a processing depth, (9) a width of a micro groove, (10) an undercut width, (11) an undercut depth, (12) a surface roughness, (13) a mask consumption, (14) a bottom removal depth, (15) a notch width, and (16) a notch height, and so on can be used as processed shape data. Also, it is desirable to acquire a more accurate value for each value, but those values may be represented by large/medium/small, ○/△/×, or discretized numerical values of those values such as 0/1/2 and those data can be used. Differential data of each output data of cross sections of different grooves, holes, lines, and pillars can be used as the processed shape data.

In this way, the searching method by the search device 300 is executed in the semiconductor processing apparatus 201, thereby being capable of bringing the value of the output parameter of the semiconductor processing apparatus 201 closer to the value of the target output parameter (device output optimization function).

Figure 20:
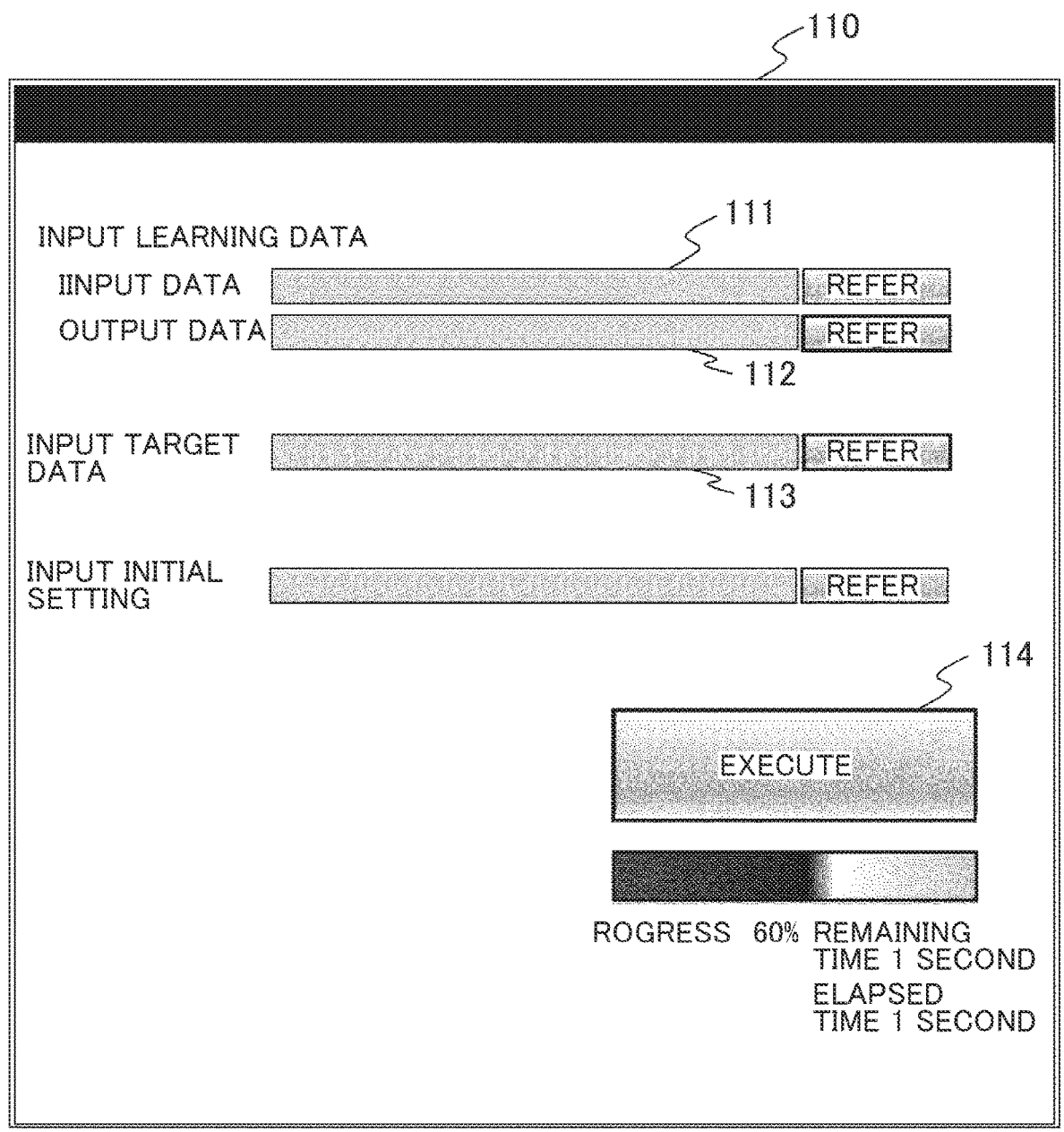
FIG. 20 is an illustrative diagram showing an initial setting screen according to the second embodiment of the present invention.
Figure 21:
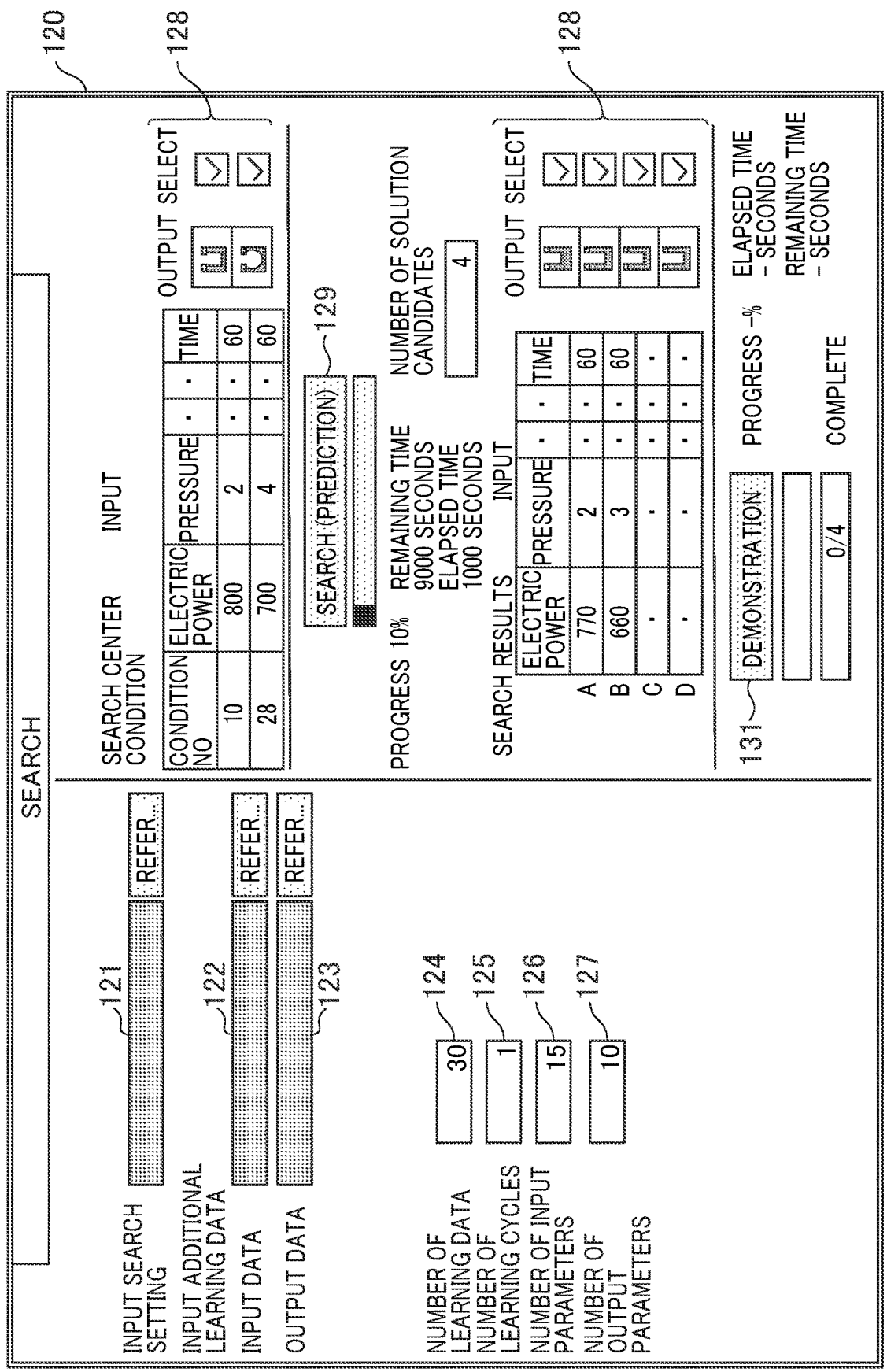
FIG. 21 is an illustrative diagram showing a search screen according to the second embodiment of the present invention.

FIGS. 20 and 21 show examples of a GUI which is a user interface of the search device 300.

FIG. 20 shows an initial setting screen 110 for designating initial data to be analyzed. In the initial setting screen 110, first, the input and output data (device input data) 111, the output data 112, and the target data (target value) 113 are input as filenames. Although a file that aggregates the input and output data as initial data to be analyzed can be designated, at that time, there is a need to describe an identifier for discriminating input parameters and output parameters inside the file.

After designating the above data, each data is read by clicking an execution button 114 and stored in the database 205. Further, on the initial setting screen 110, an indicator indicating a progress of file saving, a degree of progress, a time to completion of saving, and an elapsed time from the start of saving may be displayed.

After the execution button 114 in FIG. 20 has been clicked, the process proceeds to the search screen 120 for setting and searching for the search condition in FIG. 21. In the search screen 120, the search setting 121 is first input with the file name. Also, the input data 122 and the output data 123 acquired by the demonstration experiment can be entered by file name.

In the search screen 120, the number of learning data 124, the number of learning cycles 125, the number of input parameters 126, and the number of output parameters 127 included in the data to be learned may be displayed. The number of learning cycles 125 is the number of times the set of learning data for generating the prediction model has been acquired. Each time the demonstration experiment is performed and the input data 122 and the output data 123 resultantly obtained are added to the database 205 as additional learning data, 1 is added.

When the search setting condition is designated candidates of the center condition are displayed in an area 128, and which can be selected as the center condition from the displayed center condition. When the center condition is selected and a search (prediction) button 129 is clicked, prediction is started, and the prediction result is displayed in the area 130 during prediction or after completion of prediction.

On the search screen 120, the progress degree of the prediction, the elapsed time from the start of the prediction, the remaining time to continue the prediction, and the number of candidates of the solution that can be predicted may be displayed. Also, the estimated time until the prediction is completed may be displayed.

On the search screen 120, either or both of predicted inputs and outputs are displayed as prediction results, thereby making it possible to select a candidate for a demonstration experiment. When the demonstration experiment is selected and a demonstration experiment button 131 is clicked, the demonstration experiment is started. On the search screen 120, the progress degree of the demonstration experiment, the elapsed time since the start of the demonstration experiment, and the remaining time for continuing the demonstration experiment may be displayed.

Also, the number of demonstration experiments selected above, the number of completed demonstration experiments and the remaining number, and an estimated time to completion of the demonstration experiment may be displayed. After the demonstration experiment has been completed, the result of the demonstration experiment is added to the aforementioned additional learning data, and with the repetition of the prediction and demonstration experiment, the learning cycle is advanced and the search is continued.

Selection of the center condition candidates and candidates for demonstration experiments, and start of prediction and demonstration experiments can be directed by engineers. Alternatively, a method of selecting the candidates of the center condition and the candidates of the demonstration experiment is designated in the search setting input in advance, the candidates can be automatically selected. In addition, when the output data can be automatically acquired with the use of a sensor or a monitor, prediction and demonstration cases can be automatically started.

Figure 22:
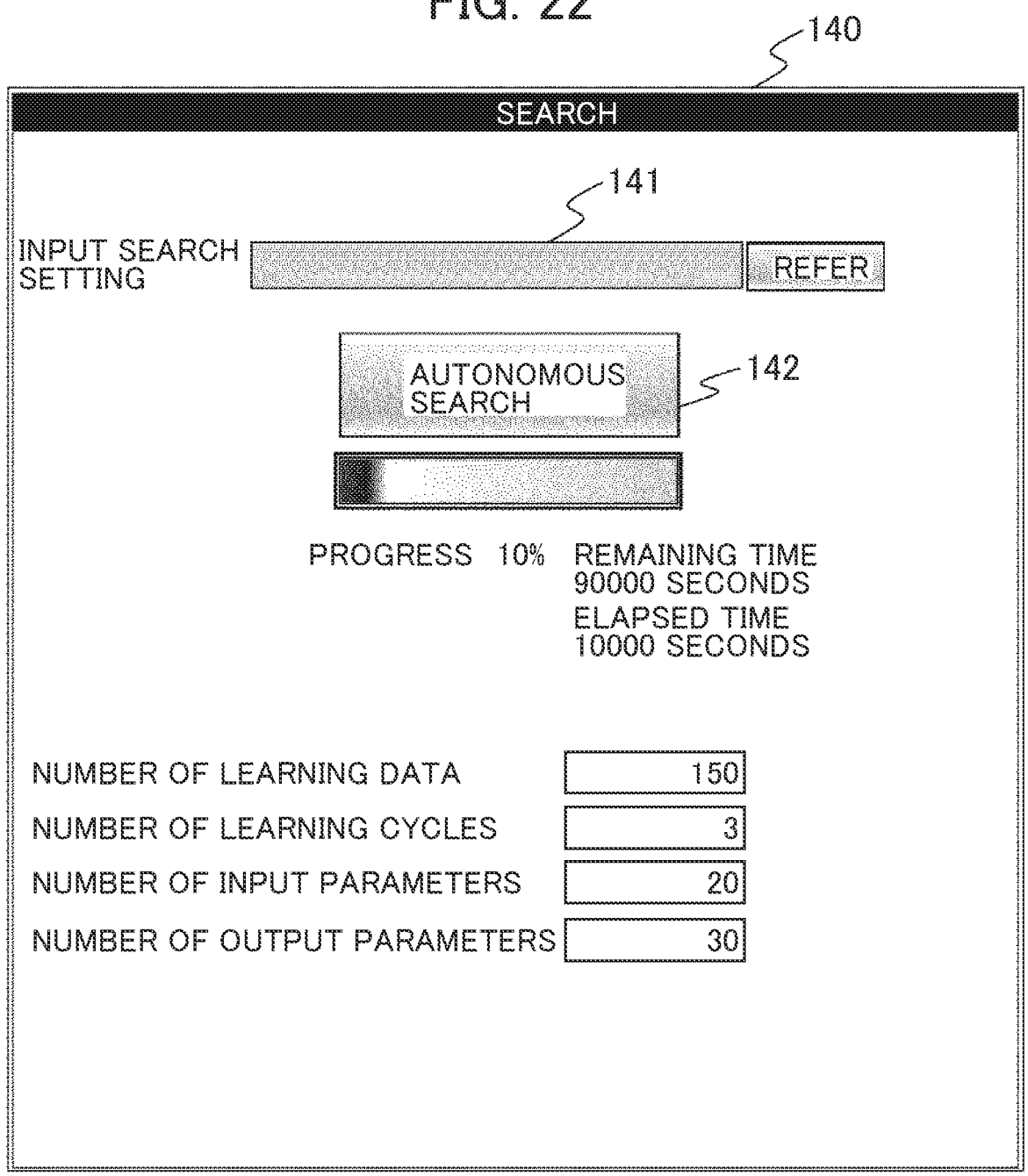
FIG. 22 is an illustrative diagram showing a search screen for autonomous search according to the second embodiment of the present invention.

FIG. 22 shows a search screen 140 in the case where candidates for the center condition and candidates for the demonstration experiment are automatically selected, and the prediction and the demonstration experiment are automatically started. After performing the search setting input 141, the autonomous search button 142 is clicked to automatically continue the search.

In this manner, the search device 300 automatically analyzes the values of the input parameters and the output parameters of the semiconductor processing apparatus 201, and takes the analysis result into consideration and automatically sets the experiment condition for searching the value of the input parameter. Then, the search device 300 automatically verifies the experiment result, and with the repetition of those automatic operations, the value of the input parameter from which the targeted device state and the processing result (value of the output parameter) are obtained can be automatically searched. As a result, the semiconductor processing apparatus 201 per se can automatically bring out the device performance, and in addition, can support an engineer who develops a control model to bring out the device performance and selects the device parameters (a combination of the input parameters and the output parameters).

As described above, the search device 300 according to the present embodiment includes the input unit 401, the generation unit 402, the identification unit 403, the determination unit 404, the setting unit 405, and the output unit 406. The input unit 401 accepts the input of the target value indicating the condition set in the semiconductor processing apparatus 201 which processes the semiconductor or the processing result of the semiconductor processed by the semiconductor processing apparatus 201, and a reference value of one of the condition or the processing result in the search area defined by a range of the condition and the processing result, which is indicated by the target value. The generation unit 402 generates the predictive model indicating the relationship between the condition and the processing result based on the set value of the condition in the search area and the measured value of the processing result when the set value is given to the semiconductor processing apparatus 201. The identification unit 403 gives the target value input by the input unit 401 to the predictive model generated by the generation unit 402 to acquire the predictive value from the predictive model. The determination unit 404 determines whether or not the measured value of the processing result corresponding to predicted value is closer to the target value than the reference value input by the input unit 401. The setting unit 405 sets the predicted value to the reference value and sets the existence area of the predicted value identified by the identification unit to the search area when it is determined by the determination unit 404 that the measured value of the processing result corresponding to the predicted value is closer to the target value. The output unit 406 outputs the predicted value which meets the achievement condition when the predicted value meets the achievement condition.

This makes it possible to improve an arrival accuracy to the best solution regarding the input and output of the semiconductor processing apparatus 201. Therefore, it is possible to improve the operation efficiency and optimize the processing in the semiconductor processing apparatus 201.

Further, in the search device 300, when the determination unit 404 determines that the measured value of the processing result corresponding to the predictive value obtained from the predictive model is not closer to the target value, the determination unit 407 determines the predicted value and data acquired as the output data corresponding to the predicted value as the exclusion data, and the setting unit 405 sets the residual area obtained by excluding the exclusion data and the exclusion area set when the exclusion data is obtained from the search area as the search area. As a result, the exclusion area in which the combination of the predicted value not closer to the target value with the measured value of the processing result corresponding to the predicted value is present can be excluded from the latest search area, and the arrival accuracy to the best solution can be improved.

Further, in the search device 300, the division unit 408 divides the search area into a plurality of areas, and when the determining unit 404 determines that the measured value of the processing result corresponding to predicted value is closer to the target value, the identification unit 403 sets the predicted value as the reference value and identifies the existence area of the predicted value from among the plurality of divided areas. This makes it possible to easily identify the existence area of the predicted value and to improve the search speed.

Further, in the search device 300, the division unit 408 divides the search area into a plurality of areas, the generation unit 402 acquires the measured value of the processing result when the set value of the condition in the divided area is given to the semiconductor processing apparatus 201 for each divided area, and the generation unit 402 generates a prediction model based on the set value of the condition in each divided region and the measured value of the processing result. As a result, with the use of the plurality of semiconductor processing apparatuses 201, the measured values can be acquired in parallel for each divided area, and the generation speed of the predictive model can be increased.

In addition, in the search device 300, when the determination unit 404 determines that the measured value of the processing result corresponding to the predicted value is not close to the target value, the determination unit 407 determines the data acquired as the prediction value and the output data corresponding to the prediction value as the exclusion data, and the generation unit 402 generates the predictive model based on the identified measured value excluding the exclusion data from the measured value and the identified set value excluding the set value given to the semiconductor processing apparatus 201 when the exclusion data is obtained from the set value. Further, the excluded area in which the combination of the predicted value and the measured value of the processing result corresponding to the predicted value not close to the target value exists can be excluded from the predicted value candidate, thereby being capable of improving the accuracy of the predictive model. Therefore, a more excellent prediction value can be obtained by the generated predictive model.

Further, in the search device 300, the detection unit 409 detects the unstable operation of the semiconductor processing apparatus 201 on the basis of the measured value of the processing result and a predetermined output threshold value, and the output unit 406 outputs the detection result by the detection unit 409. This makes it possible to prompt the user as to whether or not the search can be continued.

Application Example 4 of Control Process of Semiconductor Processing Apparatus 201

Another example in which the control process of the semiconductor processing apparatus 201 is applied to the control process for optimizing the processed shape in the processing of the semiconductor device will be described. In the development of micropattern machining process, deformation, collapse, or elimination of a part or all of a pattern occurs, often resulting in failure to acquire the measured values of the processing results. A description will be given of a method of using defect substitute data in place of defect data when the measurement of the processing object cannot be performed or the defect data occurs in the output data by skipping the measurement. As a specific example of the above control process, an example of using the measured values of a pattern upper surface as output data will be described.

If a pattern to be processed is deformed or a part of the patter is collapsed or eliminated, assuming that the output data is the measured value of the pattern cross section, the output data as the measurement result are largely different depending on a position where a cross-section of the processing object is measured, and the processing result cannot be evaluated. In addition, analysis using the processing results and generation of the predictive model with high precision cannot be performed. For that reason, in such a case, it is desirable to use the measured value of the upper surface of the pattern as output data in order to accurately evaluate the processing result.

Figure 23A:
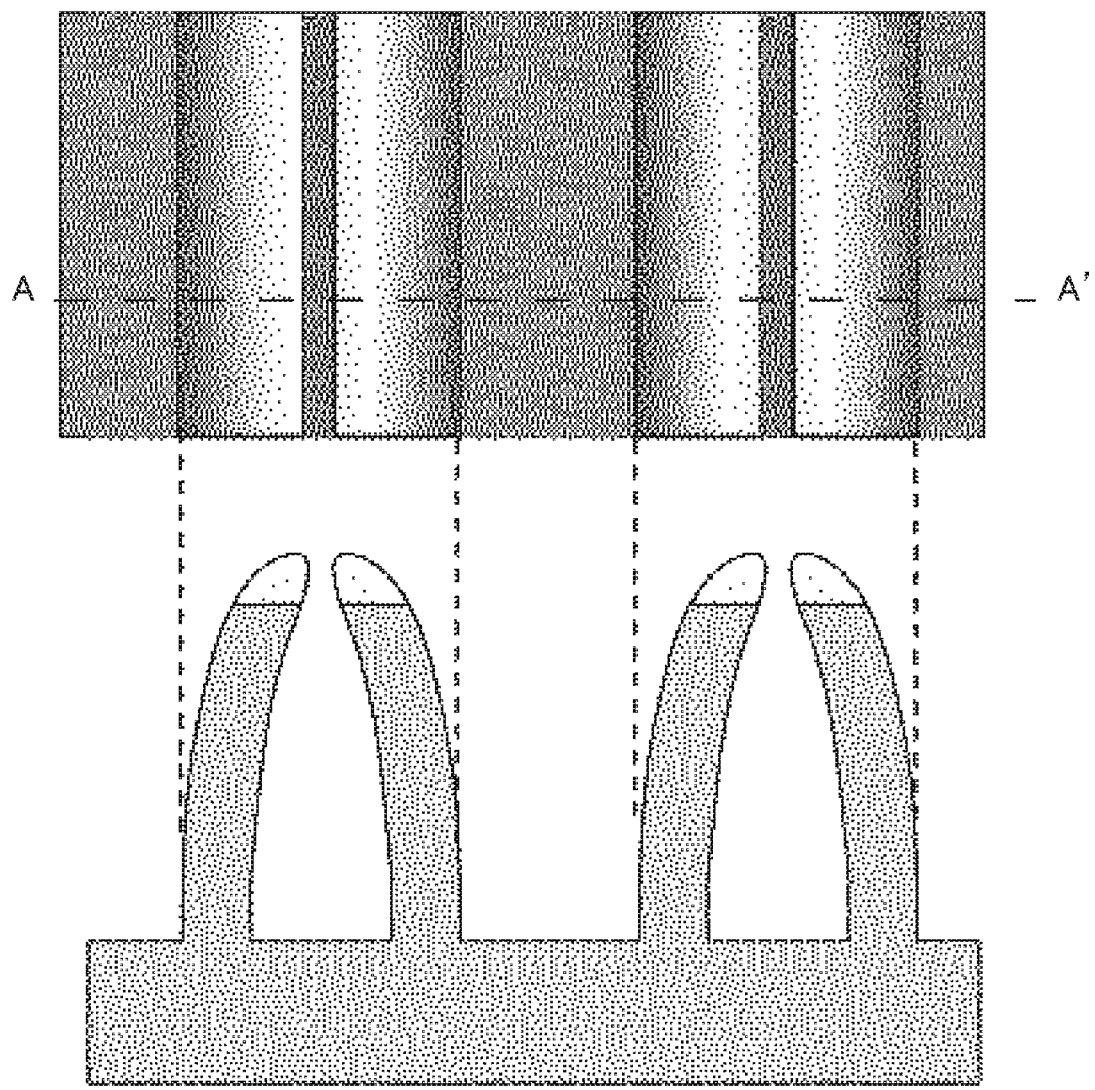
FIG. 23A is a schematic diagram showing an example of the processed shape according to the second embodiment of the present invention.
Figure 23B:
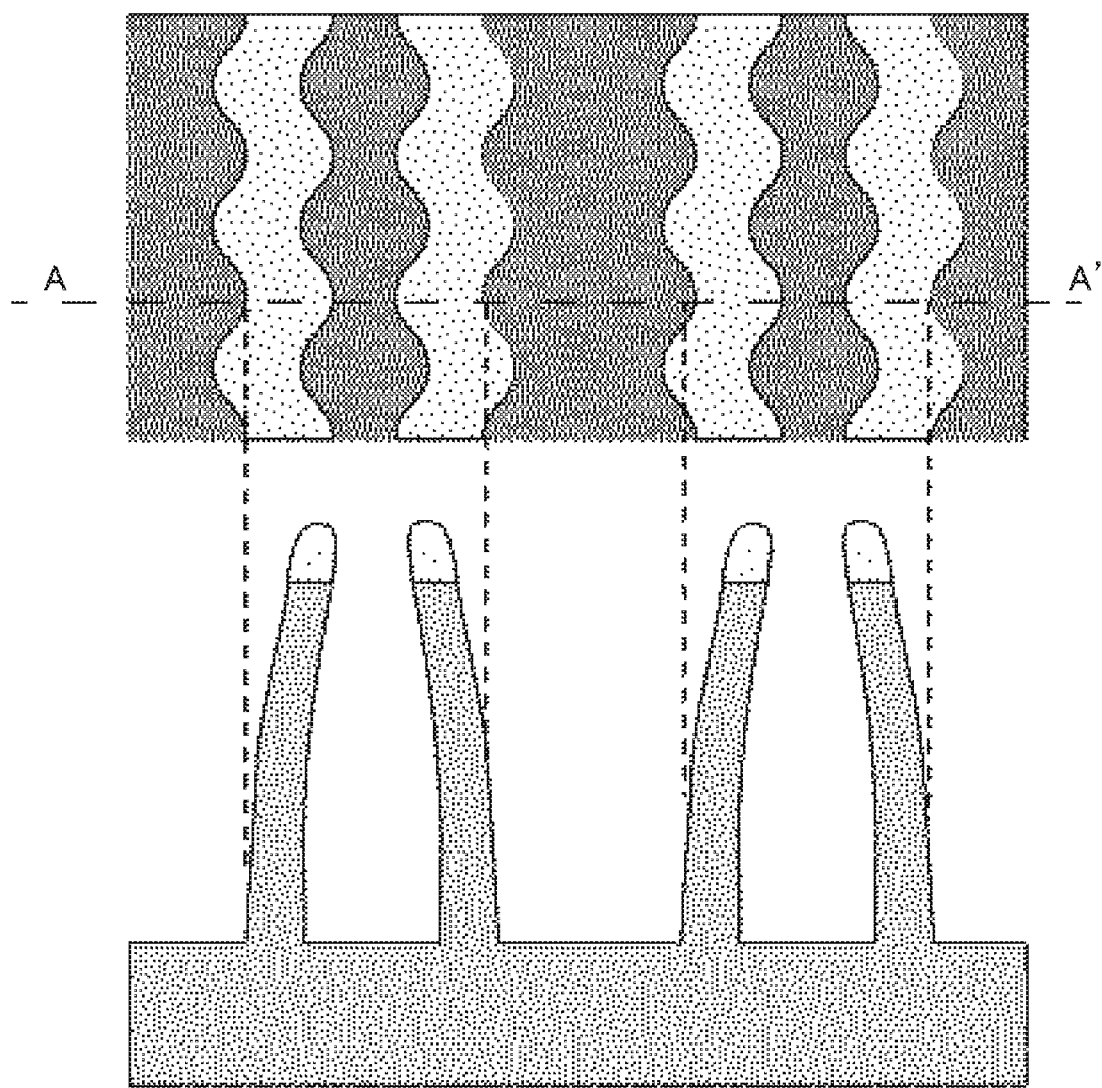
FIG. 23B is a schematic view showing an example of the processed shape according to the second embodiment of the present invention.
Figure 23C:
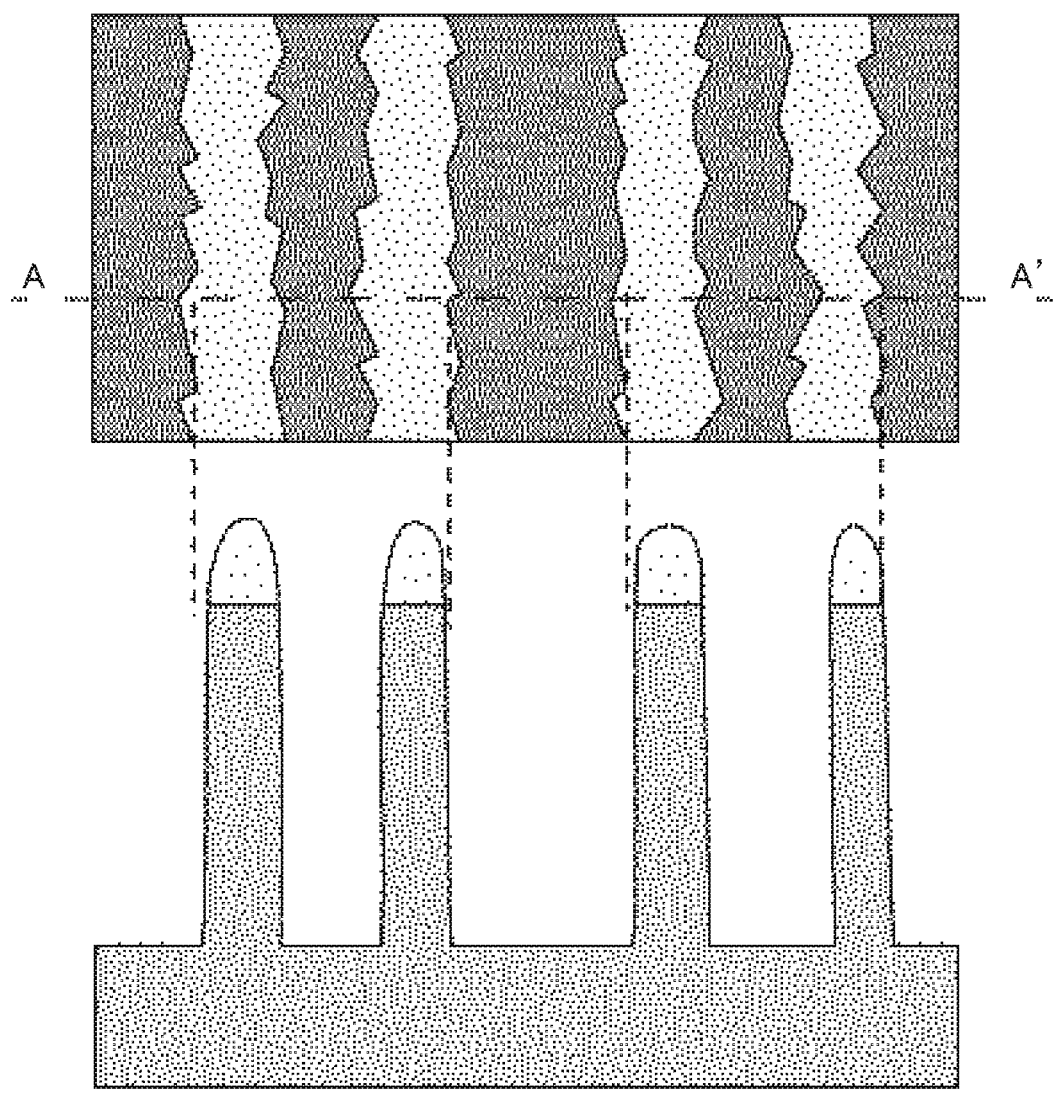
FIG. 23C is a schematic diagram showing an example of the processed shape according to the second embodiment of the present invention.

FIG. 23A to FIG. 23C, FIG. 24 and FIG. 25 show images (top view) and cross-sectional views of the images (schematic diagrams) obtained by using the electron microscope to obtain the pattern upper surface shape after processing. FIGS. 23A to 23C are schematic diagrams in the case where distortion occurs in the pattern, an upper part of the figure shows the image (top view) of the upper surface, and the image (cross-sectional view) of a cross section along a dotted line A-A' is shown in a lower row. In the case of FIGS. 23B and 23C, depending on the pattern distortion, the sectional shape varies depending on the cross-section acquisition position. Therefore, in order to obtain such a shape without distortion, the predictive model is generated with information on distortion obtainable from the upper surface of the pattern as output data, and the output data and input data used for processing as input and output data, and there is a need to search the solution for the purpose of obtaining a shape without distortion.

Figure 24:
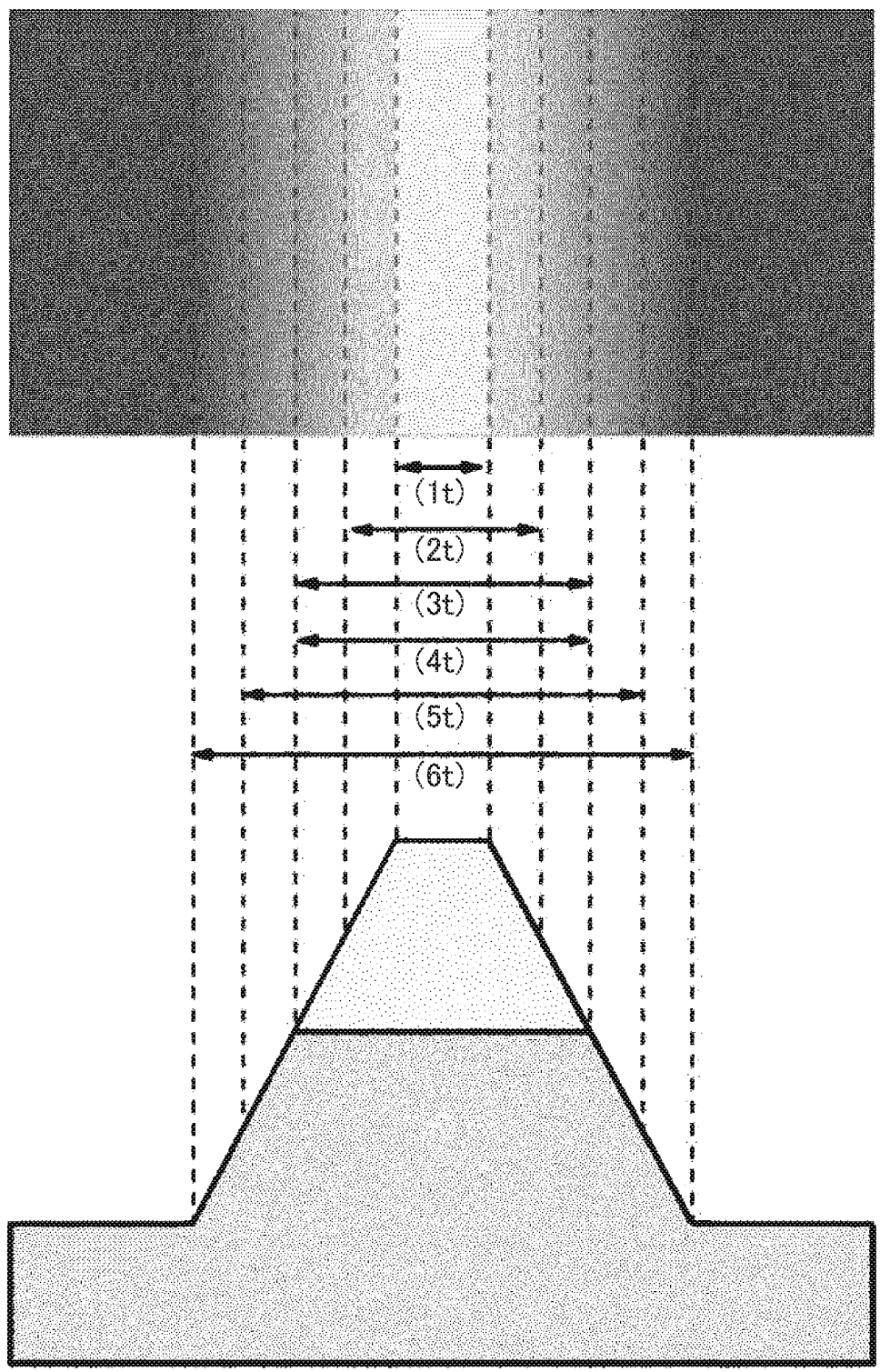
FIG. 24 is a schematic view showing an example of the processed shape according to the second embodiment of the present invention.

FIG. 24 shows an example in which measurement is performed to acquire an image of gray scale gradation according to the height and material of the measurement pattern. From this grayscale information, the boundary and edge position of each layer such as the mask and the object to be processed can be acquired. As the output data of the upper surface in the groove or line processing, the measured values of (1t) a mask top width, (2t) a width of the mask center part, (3t) a mask bottom width, (4t) a processing part top width, (5t) a width of a processing part center part, and (6t) a width of a processing bottom, or the like can be used as the processed shape data.

Figure 25:
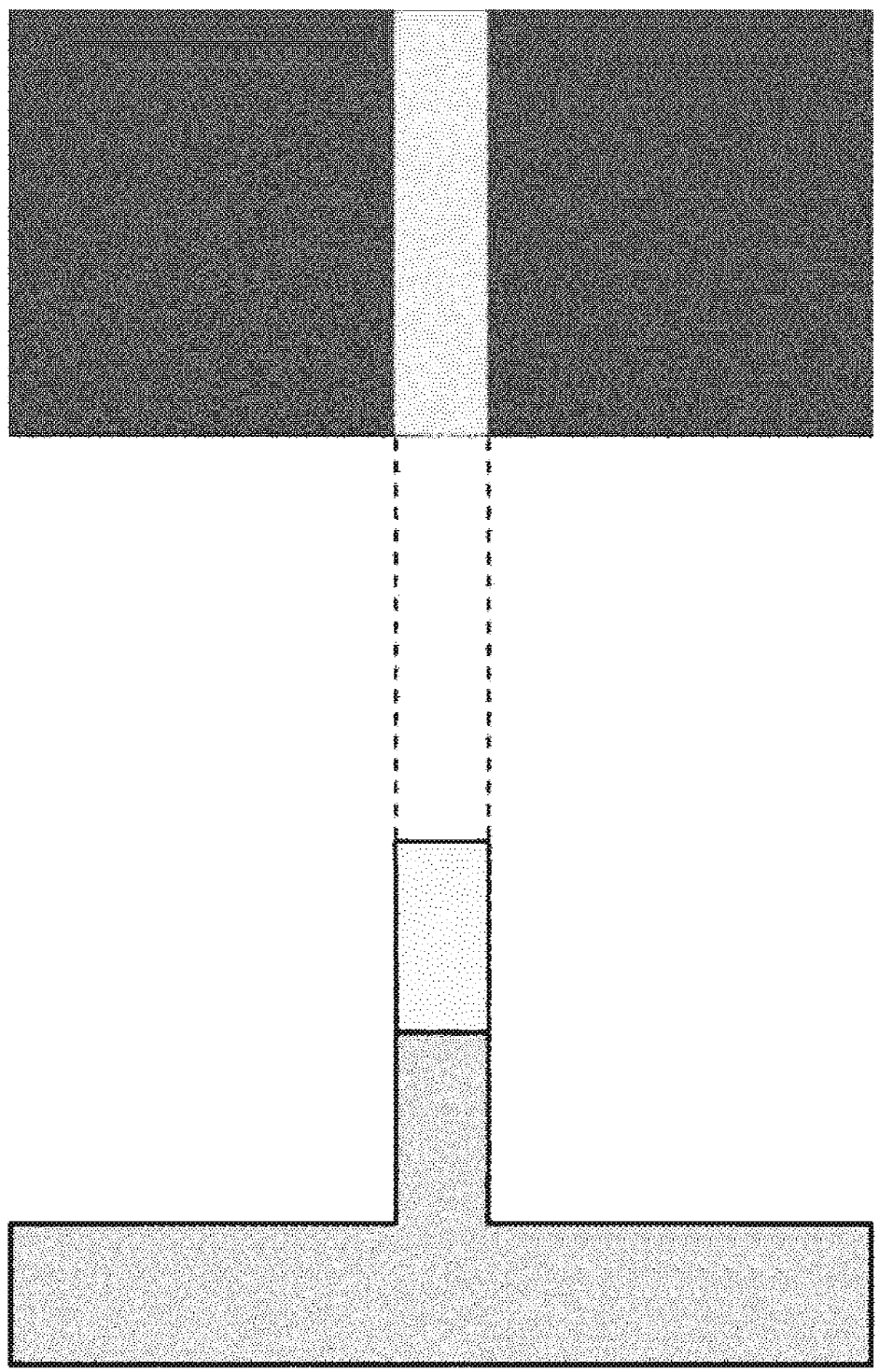
FIG. 25 is a schematic view showing an example of the processed shape according to the second embodiment of the present invention.
Figure 26:
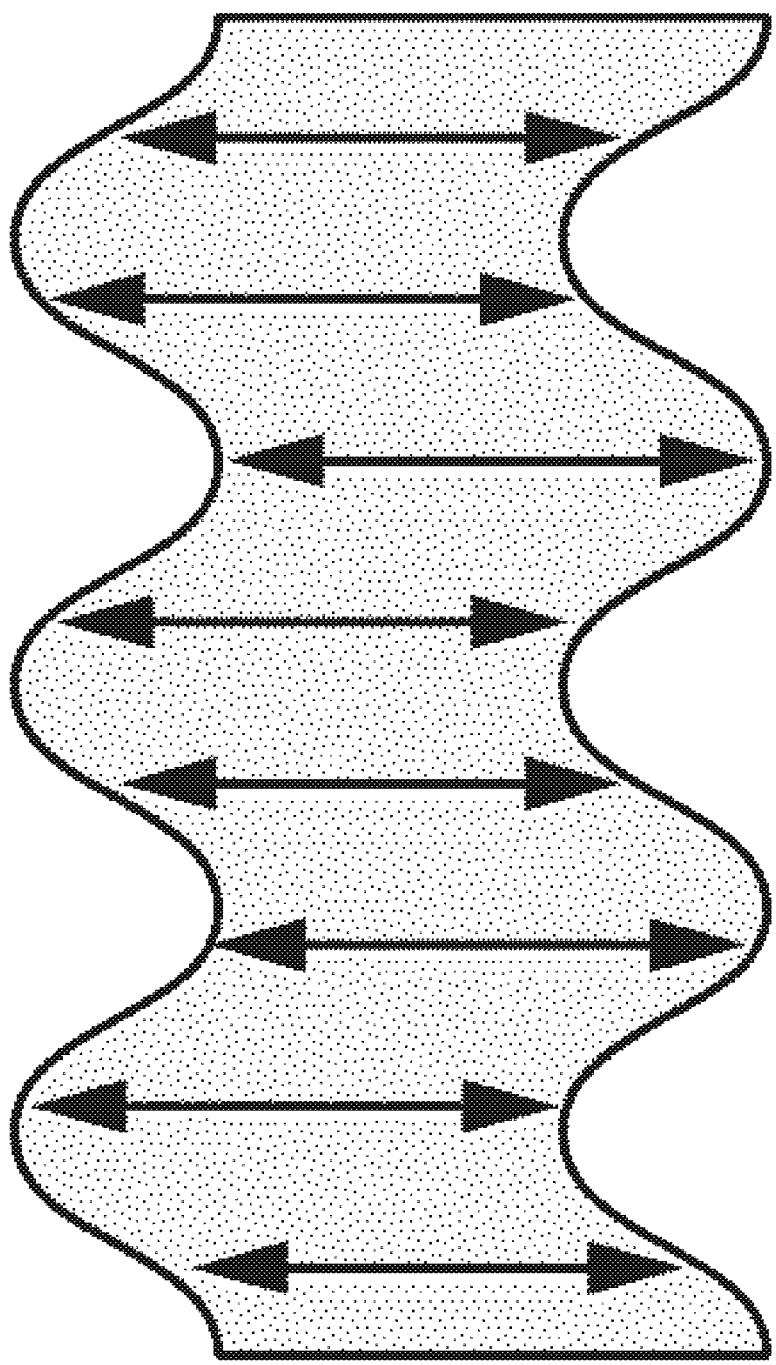
FIG. 26 is a diagram showing a part of a top structure in an example of the processed shape according to the second embodiment of the present invention.

In addition, as shown in FIG. 25, when lines are processed vertically, (1t) to (6t) have the same value. On the other hand, FIG. 26 is an enlarged view of the top structure of the line portion. As shown in FIG. 26, in fine grooves or line processing, irregularities of edges occurring in a direction perpendicular to the longitudinal direction of the grooves or lines cannot be ignored. In the same groove or line, an average value, a variance, and a standard deviation (line width roughness (LWR)) when the line width (any one of (1t) to (6t), according to the measurement definition) is measured at multiple points can be used as the processed shape data.

Figure 27:
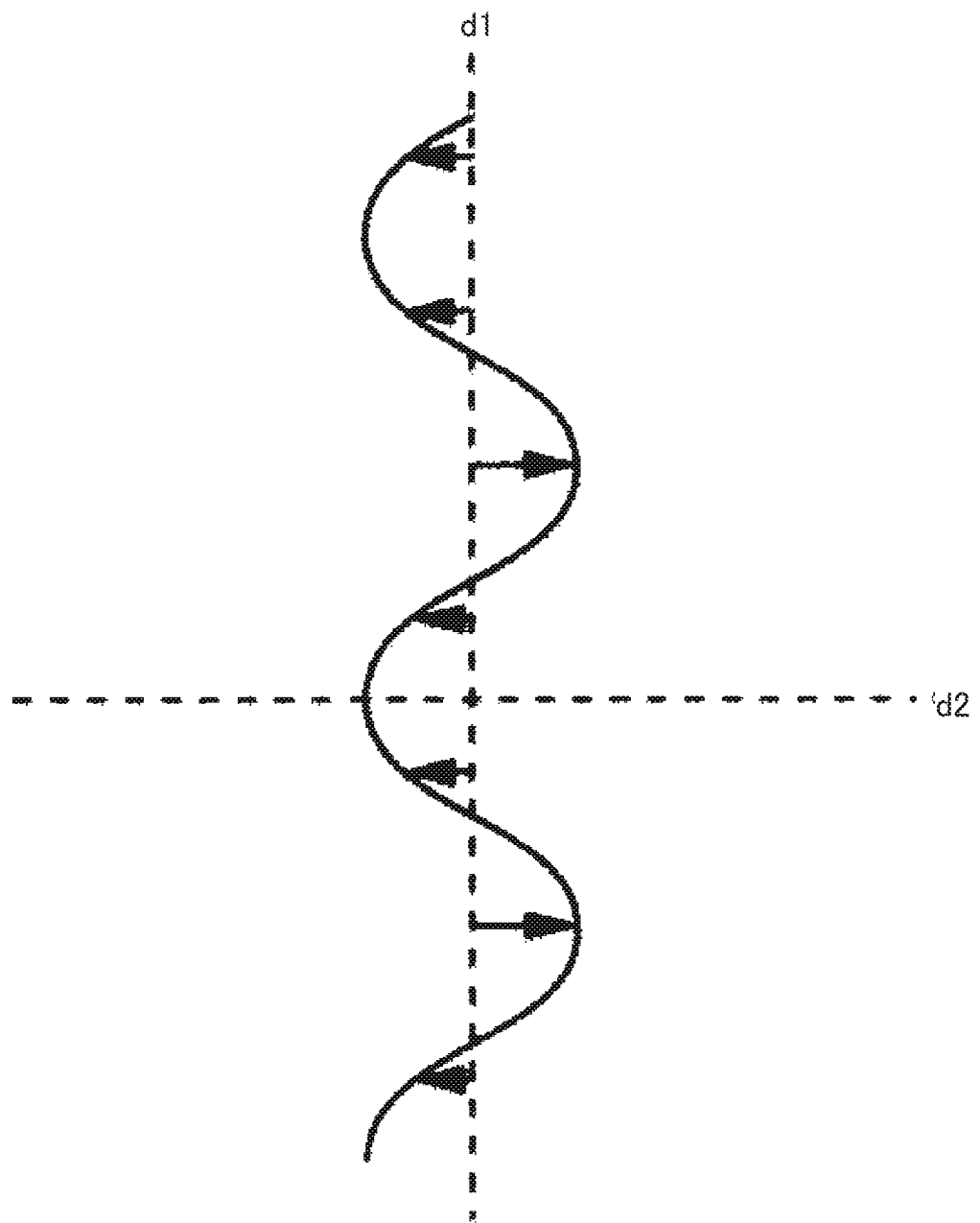
FIG. 27 is a diagram showing a part of the top structure in an example of the processed shape according to the second embodiment of the present invention.

Further, FIG. 27 shows one of two boundary lines defining the line width shown in FIG. 24. When a line obtained by linearly approximating a line or a specific line with respect to the line is defined as an axis d1 and an axis perpendicular to the axis d1 is defined as an axis d2, a line edge roughness (LER) which is a standard deviation when a distance between the line and the axis d1 along the axis d2 direction is measured at multiple points can be used as processed shape data.

Further, differential data of each output data of the upper surface in different grooves or lines can be used as the processed shape data.

When extremely large pattern deformation beyond a measurable range occurs or when collapse or elimination of a part or the whole of the pattern occurs, some or all of those output data pieces cannot be measured. In general, it is not possible to construct a predictive model using the input and output data including defect data as it is. In order to avoid the above situation, the input or output parameter value including the defect data, or the input and output data acquired when the defect data occurs is removed, and only the remaining input and output data not including the defect data may be used to configure the predictive model. However, when the defect data occurs frequently, the acquisition success rate of usable input and output data decreases, and it takes a lot of time to configure the predictive model with high precision. If the loss of a sample to be processed continues due to the acquisition of the initial learning data or the failure of the demonstration experiment, energy and raw materials and the like required for operation of the device will also continue to be lost.

For that reason, in the case where the defect data is generated, in order to improve the acquisition efficiency of input and output data and to configure the predictive model with high precision, as the defect substitute data, a distance separated from the target value by at least a constant value or more is used. This is because of the following reason. In general, the predictive model is configured on the premise that all input and output parameters are correct measurement data. However, if collapse or elimination occurs in a part or the whole of the pattern, a true value is unclear for a part or the whole of the measured value measured on the cross section after processing or on the top surface. Under such circumstances, in the case where a predictive model is configured by inappropriate defect substitution data, for example, defect substitution data such that a desired process can be performed, the prediction based on the predictive model is naturally far apart from the actual solution.

For that reason, in determining the defect substitute data, an upper limit value and a lower limit value of a range where a difference from the target value of the output data falls within an allowable range are respectively set as an upper limit allowance value and a lower limit allowance value, and the upper limit allowable value or the lower limit allowable value is taken as a reference value of the defect substitute data.

The value of the defect substitute data needs to be a value at which the difference from the target value is outside the allowable range. For example, a value that is greater than or equal to a constant multiple of the upper limit value, a value that is greater than the constant multiple of the upper limit allowable value, a lower limit allowable value or less, a value less than the lower limit allowable value, a value obtained by dividing the lower limit allowable value by a constant or less, a value obtained by dividing the lower limit allowable value by a constant, and so on can be used. In this example, the constant can be arbitrarily determined as a numerical value which is 1 or more, or larger than 1. Alternatively, a constant multiplied value of the target value or a value obtained by dividing the target value by a constant (however, in any case, there is a necessary for the difference from the target value to be outside the allowable range) may be used.

Further, the value may be set according to the object to be processed. For example, in a line and space pattern in which grooves and lines are repeated, as a reference value of the defect replacement data with respect to a line width (groove width), a full pitch which is the total width of grooves and lines, or a half pitch can be used.

Further, the value may be set according to a phenomenon occurring during processing. For example, when collapse or elimination of a part or the entire of the pattern occurs, it is impossible to measure the value related to the width dimension of the pattern. At that time, 0 can be used as the value of the defect substitute data concerning the width dimension of the portion left after processing such as a line. Specific examples of the width dimension include (1t) a mask top width, (2t) a width of a mask central part, (3t) a mask bottom width, (4t) a processed part top width, (5t) a width of a processing part center part, (6t) a width of a processed bottom in FIG. 24, (1) a mask top width, (2) a mask bottom width, (4) a processed part top width, (5) a width of a processed part center part, (6) a width of a processed bottom, and (7) a processed part maximum width in FIG. 19. In the thickness of the portion left after processing of the mask or the like, 0 can be used as the value of the defect substitute data. Specific examples of the thickness dimension are (3) a mask thickness in FIG. 18 and (3) a mask thickness in FIG. 19.

In addition, when processing of the pattern is not performed at all, values related to the width dimension of the pattern formed for the first time by processing cannot be measured. At that time, half pitch or full pitch can be used as the value of the defect substitution data related to the width dimension of the portion left after processing of the line or the like. Specific examples of the width dimension include (4t) a processed part top width, (5t) a width of a processed part center part, (6t) a width of a processed bottom in FIG. 24, (1) a mask top width, (2) a mask bottom width, (4) a processed part top width, (5) a width of a processed part center part, (6) a width of a processed bottom, and (7) a processed part maximum width in FIG. 18, and (4) a processed part top width, (5) a width of a processed part center part, (6) a width of a processed bottom, and (7) a processed part maximum width in FIG. 19.

Further, in the output data that has already been acquired, a value whose difference from the target value is outside the allowable range, which is the farthest in the distance from the target value can be used as a reference value of the defect substitute data. The above upper limit allowable value, the lower limit allowable value, the full pitch, or the half pitch is used as a reference value of the defect substitute data until the number of acquisitions of input and output data is designated in advance, and the specified number of input and output data is acquired. After the designated number of input and output data have been acquired, a value whose difference from the target value is outside the allowable range, which is a value farthest in the distance from the target value, may be used as a reference value of the defect substitute data. This is because there is a possibility of giving the defect substitute data closer to a true value by setting the reference value of the defect substitute data as the worst output data actually acquired at the stage when the input and output data is accumulated to some extent.

However, as long as it is defect substitute data, the difference from the target value should be larger than the acquired output data. Therefore, when the acquired output data exists, the value of the defect substitute data is compared with the value of the acquired output data, and a value whose difference from the target value is outside the allowable range and which is larger in difference from the target value, is used as a value of the defect substitute data, thereby being capable of improving the accuracy of the predictive model.

Conversely, in the input and output parameters whose input and output data equal to or more than the designated number has already been acquired, a model that predicts defect data according to the input and output data, which has already been acquired, is generated, and the defect value can be predicted according to the defect data predictive model.

If the predicted value is taken as the defect prediction data, the defect prediction data can be used instead of the defect substitute data.

In order to determine whether the output data could be measured or could not been measured or skipped in measurement after the defect substitute data has been stored, for the purpose of identifying data that could be measured and the defective data, or specifying the defect data, symbols or numeral values may be allocated to the output parameters, and stored as measurement availability data. Further, the measurement availability data can be used as output data and a predictive model can be generated with the use of the input data corresponding to the measurement availability data. With the use of the predictive model, measurement availability in the demonstration experiment is predicted, thereby being capable of selecting the condition under which the demonstration experiment is actually performed.

If collapse or elimination of a part or the whole of the target pattern frequently occurs, a pattern different from the target pattern or the output data of a sample, which is processed at the same time as the target pattern or processed by the same input parameter, is acquired, thereby being capable of increasing the output data which can be acquired. In the output data, a test pattern or a test sample, which is correlated with the target pattern but different from the target, is selected, and the predictive model is generated with the use of the above output data, thereby being capable of improving the prediction precision. As compared with the target pattern, it is preferable that the output data is likely to be measurable, that is, collapse or elimination of a part or the whole of the pattern hardly occurs. For example, when the target pattern is a groove, a hole, a line, a pillar, a line and space, it is possible to select a groove, a hole, a line, a pillar, a line and space having a larger dimension as the test pattern. In a situation where the etching of an etching object is not advanced, a blanket film on which no mask layer is formed can be used as a test sample. Further, with the use of a plurality of types of test patterns and test samples, more measurable output data can be increased.

The thickness or depth value included in the pattern to be processed can be measured with the use of an optical interferometer. Also, in the case where measurement of the target pattern portion by the optical interferometer cannot be performed due to the collapse of a part or the whole of the pattern, the thickness or the depth can be measured with the use of a pattern portion different from the aforementioned target.

Next, an application example of a control process for optimizing a processed shape using defect replacement data instead of defect data in processing of a semiconductor device will be described.

In this example, as the output data, a case using output data on an upper surface of the processing pattern or output data on an upper surface and a section will be described. FIG. 28 shows an example of measured output data and defect data in the case of acquiring output data of the upper surface as measurement 1 and output data of the section as measurement 2.

In FIG. 28, LER 11 and LER 12 in the measurement 1 are the above-mentioned LER values, CDtv 11 and CDtv 12 are the aforementioned (1t) to (6t) width dimensions (refer to FIG. 24). Further, CD21 and CD22 in the measurement 2 are the width dimensions in the above-mentioned cross section, and Depth 21 and Depth 22 are the depth dimensions in the above-mentioned cross section. In the measurement 1, LER 11 and CDtv 11 can be measured, and measured values are acquired. On the other hand, LER 12 and CDtv 12 cannot be measured, and N/A indicating the defect data is given. The defect data N/A is replaced with defect substitute data corresponding to each output parameter.

In the case of performing the measurement 2 after the measurement 1, N/A indicating the defect data is given to an item that is not measurable in the measurement 2 as well as the measurement 1, and the defect data N/A is replaced with the defect substitute data corresponding to each output parameter.

Also, if the defect data is included in the output data of the measurement 1, the defect data may be included in the measurement 2. Specifically, when deformation, collapse, or elimination of a part or the whole of the pattern occurs, those situations can be grasped by generation of the defect data in the measurement of the upper surface of the measurement 1. In that case, since the measurement of the cross section of the measurement 2 becomes the defect data, actual measurement is unnecessary. In this manner, the measurement 2 is skipped according to the occurrence of the defect data of the output data in the measurement 1 or the number of items of the defect data, thereby being capable of reducing the search time. In other words, in the case of performing a plurality of measurements for obtaining the output data, the measurement per se performed subsequently is skipped depending on the occurrence of the defect data in the measurement result previously performed or the number of items of the defect data, thereby being capable of reducing the search time.

When the measurement 2 is skipped, all of the output parameters are defect data as in the measurement 2 shown in FIG. 28. A numerical value or symbol different from the defect data (N/A) given when the measurement has been attempted but the measurement could not be performed is allocated to the output parameter whose measurement has been skipped, thereby being capable of distinguishing therebetween. For example, instead of N/A in the measurement 2, a symbol such as skip may be given. In that case, the symbol or numerical value indicating skipping is replaced with defect substitute data corresponding to each output parameter.

Figure 29:
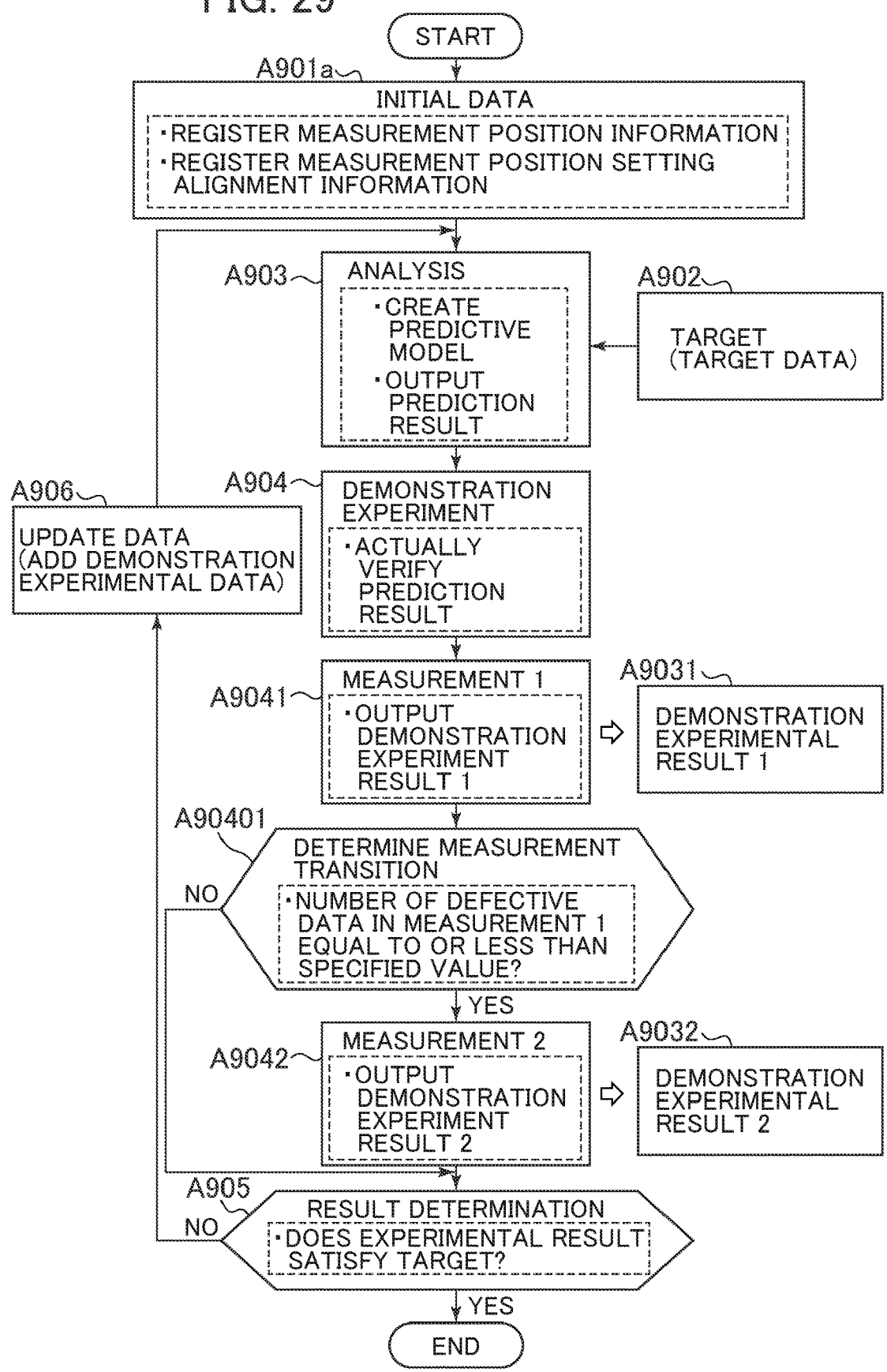
FIG. 29 is a flowchart showing a method for optimizing the processed shape according to the second embodiment of the present invention.

FIG. 29 is a flowchart showing the outline of the optimization method of the processed shape. FIG. 29 is a flow chart similar to FIG. 14, and in the step having the same step numbers in FIGS. 14 and 29, the same flow as that in FIG. 14 is performed.

When a value of the defect substitute data used when each output parameter cannot be measured or the measurement is skipped, and a value of the measurement available data or the symbol are set, those values or the symbol is given as initial data (Step A901a). In addition, in Step A901a, the position information data and the image information data for determining the measurement position or inducing the measurement position to a desired measurement position, which are used when measuring the processed shape by the monitor system, are also given as the initial data. Step A901a is a process corresponding to the search setting input and the input of the initial data in S501 in FIG. 5, A501 in FIG. 12, and A901 in FIG. 14.

Identification of the defect data and replacement of the defect data with the defect substitute data are performed by outputting the measurement results or storing the results of demonstration experiments (A9031, A9032). Alternatively, the identification and the replacement may be performed at the time of outputting the measurement result (A9041, A9042). This corresponds to the storage of the search result and the demonstration experiment result corresponding to S507 in FIG. 5, S6070A in FIGS. 6, 7, and 8, A508 in FIG.

12, and A9030 in FIG. 14. Alternatively, the identification and the replacement can be performed after the storage of the search result and the demonstration experiment result.

In this example, the output data of the upper surface, which is the output data of the measurement 1, is stored in the storage of the demonstration experiment result in Step A9041. The N/A indicating the defect data is given to the items that could not be measured among the output data. The defect data N/A is replaced with defect substitute data corresponding to each output parameter. If there is no other measurement after measurement 1, the result determination of Step A905 and the update of data in Step S906 are performed, the generation and the prediction result of the predictive model using the input and output data are output in Step A903, and the search of the solution in Step A904 is performed.

When the measurement 2 (Step A9042) is performed after the measurement 1 (Step A9041), the N/A indicating the defect data is given to the items which could not be measured in the measurement 2 as in the measurement 1, and the defect data N/A is replaced with the defect substitute data corresponding to each output parameter. Thereafter, the generation and prediction result of the predictive model using input and output data including the defect substitute data is output and the solution search is performed.

Also, when the defect data (or defect substitute data) is included in the output data of the measurement 1 in Step A9041, the defect data may also occur in the measurement 2 in Step A9042. For example, in the case where deformation, collapse, or elimination of a part or the whole of a pattern occurs, those situations can be grasped by generation of the defect data in the measurement of the upper surface of the measurement 1. In such a case, even if the cross section of the measurement 2 is measured, only the defect data can be obtained, so that actual measurement is unnecessary. For that reason, the measurement 2 (Step A9042) is skipped according to the occurrence of the defect data in the output data of the measurement 1 (Step A9041) or the number of items of defect data, thereby being capable of shortening the search time.

In the case of performing a plurality of measurements in this way, the subsequent measurement is skipped according to the occurrence of defect data in the measurement result previously performed or the number of items of defect data, thereby being capable of shortening the search time. In the case of performing a plurality of measurements, when a long time is taken for the measurement to be carried out in the latter stage, the search time can be greatly shortened and the effectiveness is high.

A numerical value or symbol different from the N/A is allocated to the output parameter whose measurement is skipped, thereby being capable of discriminating between the case where measurement is impossible and the case where measurement is skipped. Also in that case, the symbols or numerical values indicating skipping are replaced with the defect substitute data corresponding to each output parameter, thereby being capable of generating the predictive model and searching for the solution.

The operation of replacing the defect data (including both the case where the measurement is impossible and the case where the measurement is skipped) with the defect substitute data can be performed automatically, but the engineer may determine whether replacement is possible or not. At that time, the defect substitute data used by the engineer for rewriting may be determined. In this situation, there are provided options to use the value of the defect substitution data designated in advance, to use the reference value of the defect substitute data, or to use a value whose difference from the target value is outside the allowable range, which has the farthest distance from the target value in each parameter so that the engineer may switch the option.

Figure 30:
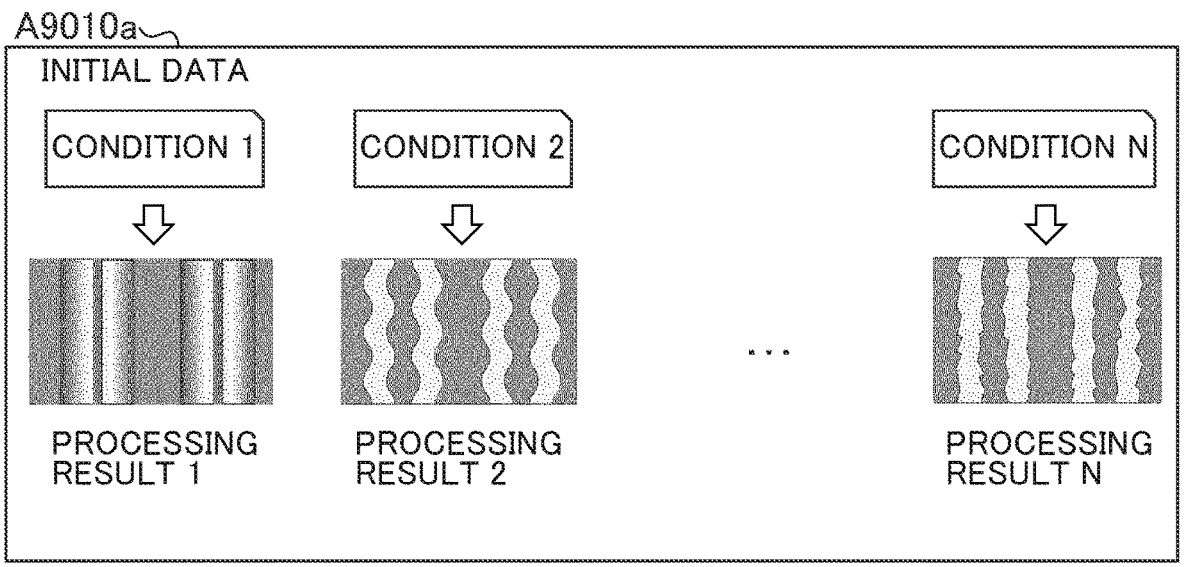
FIG. 30 is an illustrative diagram showing an example of initial data according to the second embodiment of the present invention.

The initial data used in Step A901a can include not only the pattern as shown in FIG. 15 but also a plurality of recipes as shown in FIG. 30 and processed shape data of the upper surface of the pattern when etching with the use of each recipe. With the use of the initial data including various etching shapes, when predicting the solution using the predictive model, it is efficiently predicted in which area in the recipe parameter space the recipe parameter for realizing the target shape is present.

In the initial data A9010a, pattern distortion (condition 1), wiggling (condition 2), pattern edge roughness (condition N) are shown as shown in FIG. 30, and as other shapes, there are an etch stop shape in which no etching is advanced at all, elimination of a part or the whole of the pattern, collapse of a part or the whole of the pattern, and the like. For example, if there is only one type of shape in the initial data, it is difficult to predict a solution that satisfies other shapes with the prediction model obtained from that data. For that reason, it is desirable that at least two or more, preferably three or more of those shapes are included in the initial data.

Note that FIG. 30 is a diagram showing an example of the initial data A9010a. The initial data A9010a is configured by pairs of processing results 1 to N corresponding to the conditions 1 to N, and the processing results 1 to N show examples of the pattern upper surface shape of the processing target.

Figure 31:
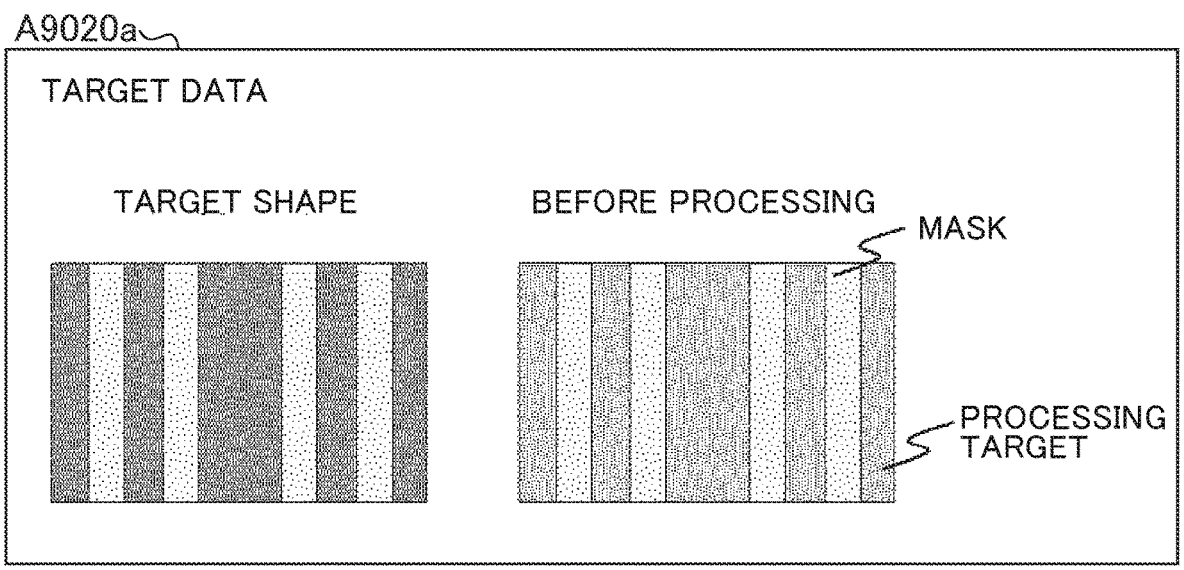
FIG. 31 is an illustrative diagram showing an example of target data according to the second embodiment of the present invention.

As the target data used in Step A902, for example, a vertical processed shape such as a target data A9020a shown in FIG. 31 is given. FIG. 31 is a diagram showing an example of the target data A9020a. The target data A9020a shows an example including the pattern upper surface shape of the object to be processed before processing and the pattern upper surface shape of the target.

Figure 32:
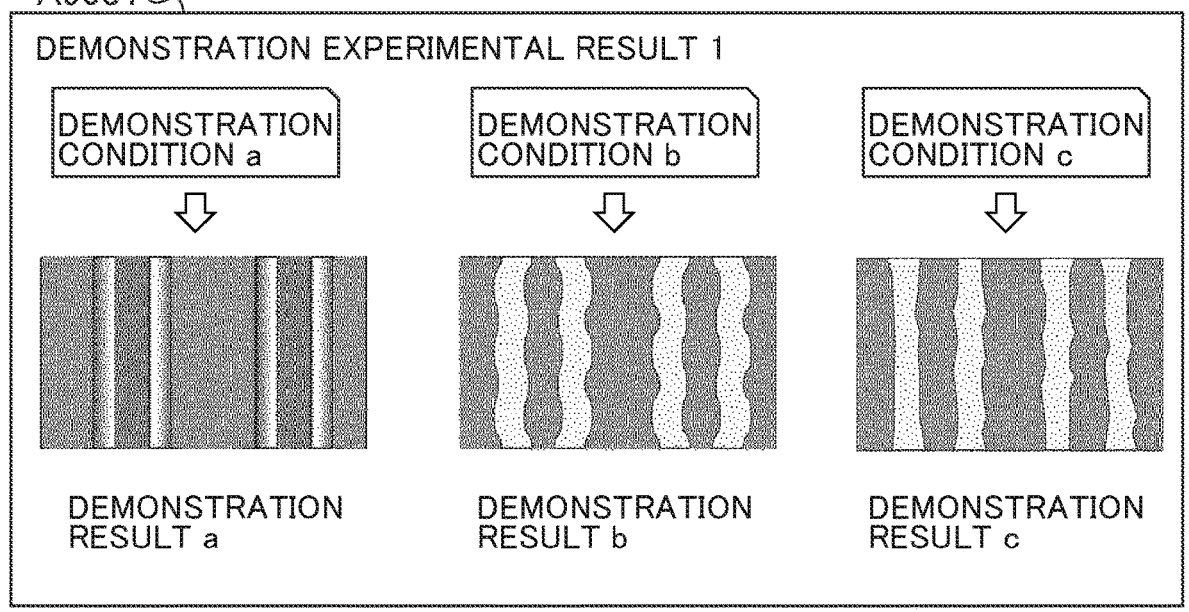
FIG. 32 is an illustrative diagram showing an example of a demonstration experiment result according to the second embodiment of the present invention.

An example of the result of the demonstration experiment in Step A904 is shown in the demonstration experiment result A9031 shown in FIG. 32, and in that case, the output (processed shape) closer to the target shape than the shape included in the initial data is obtained, which corresponds to Yes in Step A510. Note that FIG. 32 is a diagram showing an example of the demonstration experiment result A9031. The demonstration experiment result A9031 is configured by a pair of demonstration results a to c corresponding to the demonstration conditions a to c, and the demonstration results a to c show examples of the pattern upper surface shape to be processed.

As described above, with the execution of the search method by the search device 300 in the semiconductor processing apparatus 201, the value of the output parameter of the semiconductor processing apparatus 201 can be brought closer to the value of the target output parameter (device output optimization function).

As a modification, the functions of the search device described above can be installed in the device control system (refer to FIG. 2) of the semiconductor processing apparatus. FIG. 33 shows a schematic diagram of a plasma processing apparatus having an optimum processing condition searching function as an example of a semiconductor processing apparatus. The apparatus includes an antenna 56 for plasma generation, a radio frequency power supply 51 for applying a radio frequency voltage to the antenna 56, and a first radio frequency matching box 52. In order to introduce a plurality of gas species into the processing chamber 60, a first flow path 61 and a second flow path 62 are provided. Although only two systems are shown in this example, the number of flow paths is not particularly limited. The radio frequency alternating electromagnetic field generated in the antenna 56 is caused to act on an introduced mixed gas to generate a plasma 63 inductively coupled from reactive particles. The apparatus also includes a substrate voltage generator 54 and a second radio frequency matching box 53 for processing by the generated plasma 63. Further, the apparatus includes an end point determination device 55 capable of monitoring a variation of plasma generated during processing of a substrate (sample) 59 to be processed, which has a mechanism of feeding a signal obtained from the end point determination device 55 back to the first mass flow controller 57 and the second mass flow controller 58. The first mass flow controller 57 can adjust a gas flow rate of the first flow passage 61 and the second mass flow controller 58 can adjust a gas flow rate of the second flow passage 62 according to a signal of the end point determination device 55.

The device control system 70 of the plasma processing apparatus controls the plasma generation device such as the radio frequency power supply 51 of the device, the substrate voltage generator 54, the end point determination device 55, and so on, and performs plasma processing such as etching processing on the substrate 59 (corresponding to the recipe setting controller 221 and the device basic setting controller 222). In addition, the device control system 70 implements a processing program corresponding to a program for execution of the search process, which is stored in the storage device 302 (refer to FIG. 3) in the search device, thereby being capable of implementing the search process described above. In this way, the device control system 70 can perform the plasma processing by controlling the plasma generation device according the searched input parameter value by mounting the search process function as one function of the semiconductor processing apparatus.

It should be noted that the present invention is not limited to the above-described embodiments, but includes various modifications and equivalent structures within the scope of the appended claims. For example, the above-described embodiments have been described in detail in order to described the present invention in an easy-to-understand manner, and the present invention is not limited to those having all the configurations described. In addition, apart of the configuration of one embodiment may be replaced by the configuration of another embodiment. Further, the configuration of another embodiment may be added to the configuration of one embodiment. In addition, other configurations may be added, deleted, or replaced with respect to part of the configuration of each embodiment.

Further, the above-described configurations, functions, processing units, processing means, and the like may be realized by hardware, for example, by designing some or all of those components with an integrated circuit or the like, and may be realized by software by causing the processor to interpret and execute the program for realizing the respective functions.

The information on the program, t and file for realizing the respective functions can be stored in a storage device such as a memory, a hard disc, or an SSD (solid state drive), or a storage medium such as an IC card, an SD card, or a DVD (digital versatile disc).

Also, the control lines and the information lines necessary for description are illustrated, and all of the control lines and the information lines necessary for products are not illustrated. In fact, it may be conceivable that most of the configurations are connected to each other.

What is claimed is:

1. A search device that searches an input parameter value for getting a target processed profile by a semiconductor processing apparatus, the search device comprising:
a processor;
a storage device; and
a program that is stored in the storage device and which, when executed by the processor, causes the processor to search an input parameter value for getting a target processed profile,
wherein the program causes the processor to execute a generation step to generate a predictive model indicating a relationship between the input parameter value and an output parameter which is a measured value of a processing result processed by the semiconductor processing apparatus based on the input parameter value and the output parameter value,
wherein the predictive model is generated based on the input parameter value causing defective data and defective substitute data obtained by substituting the measured value which is the defective data when the measured value of the processing result processed by the semiconductor processing apparatus is the defective data in the generation step, and
wherein the defective data is the output parameter which cannot be measured or whose measurement is skipped based on occurrence of the output parameter which cannot be measured.

2. The search device according to claim 1,
wherein when the measured value of the processing result processed by the semiconductor processing apparatus using the input parameter value predicted by the predictive model corresponding to the target output parameter value does not satisfy a target value corresponding to the target processed profile, the predictive model is updated with the input parameter value predicted by the predictive model and the acquired measured value.

3. The search device according to claim 1,
wherein the program further causes the processor to receive position information as initial data, and
wherein the program further causes the processor to execute a step to measure the processing result by using the position information.

4. The search device according to claim 1, wherein the defective substitute data is determined as a value whose difference from a target value of the output parameter value is outside an allowable range.

5. The search device according to claim 4, wherein a value having the largest distance from the target value of the output parameter value among the measured values of the processing result is used as a reference value of the defective substitute data.

6. The search device according to claim 1, wherein the output parameter representing the processed profile includes a measured value of a top profile of the processing result and a measured value of a sectional profile of the processing result.

7. A search method for searching an input parameter value for getting a target processed profile by a semiconductor processing apparatus, the search method comprising:
a generation step to generate a predictive model indicating a relationship between the input parameter value and an output parameter which is a measured value of a processing result processed by the semiconductor processing apparatus based on the input parameter value and the output parameter value,
wherein the predictive model is generated based on the input parameter value causing defective data and defective substitute data obtained by substituting the measured value which is the defective data when the measured value of the processing result processed by the semiconductor processing apparatus is the defective data in the generation step, and wherein the defective data is the output parameter which cannot be measured or whose measurement is skipped based on occurrence of the output parameter which cannot be measured.

8. The search method according to claim 7, wherein the defective substitute data is determined as a value whose difference from a target value of the output parameter value is outside an allowable range.

9. The search method according to claim 7, wherein the output parameter value includes a first output parameter value acquired by a first measurement and a second output parameter value acquired by the second measurement, and whether or not to perform the second measurement is determined based on the first output parameter value.

10. A plasma processing apparatus including a processing chamber which plasma processing for a sample is performed therein, a radio frequency power supply to supply a radio frequency power for plasma generation, comprising:

a control system to generate a predictive model indicating a relationship between the input parameter value and an output parameter which is a measured value of a processing result processed by the plasma processing apparatus based on the input parameter value and the output parameter value, wherein the predictive model is generated based on the input parameter value causing defective data and defective substitute data obtained by substituting the measured value which is the defective data when the measured value of the processing result processed by the plasma processing apparatus is the defective data, and wherein the defective data is the output parameter which cannot be measured or whose measurement is skipped based on occurrence of the output parameter which cannot be measured.

11. The plasma processing apparatus according to claim 10, wherein the defective substitute data is determined as a value whose difference from a target value of the output parameter value is outside an allowable range.

12. The plasma processing apparatus according to claim 10, wherein the output parameter representing the processed profile of the sample includes a measured value of a top profile of the processing result and a measured value of a sectional profile of the processing result.

13. A search device that searches an input parameter value for getting a target processed profile by a semiconductor processing apparatus, the search device comprising:

a processor;

a storage device; and a program that is stored in the storage device and which, when executed by the processor, causes the processor to search an input parameter value for getting a target processed profile, wherein the program includes a generation steps that causes the processor to generate a predictive model indicating a relationship between the input parameter value and an output parameter which is a measured value of a processing result processed by the semiconductor processing apparatus based on the input parameter value and the output parameter value, wherein when the measured value of the processing result processed by the semiconductor processing apparatus using the input parameter value predicted by the predictive model corresponding to the target output parameter value does not satisfy a target value corresponding to the target processed profile, the prediction model is updated with the input parameter value predicted by the predictive model and the acquired measured value, wherein the output parameter representing the processed profile includes a measured value of a top profile of the processing result and a measured value of a sectional profile of the processing result, wherein the predictive model is generated based on the input parameter value causing defective data and defective substitute data obtained by substituting the measured value which is the defective data when the measured value of the processing result processed by the semiconductor processing apparatus is the defective data in the generation step, and wherein the defective data is the output parameter which cannot be measured or whose measurement is skipped based on occurrence of the output parameter which cannot be measured.

14. The search device according to claim 13, wherein the defective substitute data is determined as a value whose difference from a target value of the output parameter value is outside an allowable range.

* * * * *